(12) United States Patent
Ono et al.

(10) Patent No.: US 7,868,331 B2
(45) Date of Patent: Jan. 11, 2011

(54) LIGHT-EMITTING DEVICE HAVING A METAL OXIDE SEMICONDUCTOR POROUS BODY WITH AN ORGANIC LIGHT-EMITTING MATERIAL

(75) Inventors: Masayuki Ono, Osaka (JP); Kenya Hori, Okayama (JP); Toshiyuki Aoyama, Osaka (JP); Masaru Odagiri, Hyogo (JP); Kumio Nago, Nara (JP); Kenji Hasegawa, Osaka (JP)

(73) Assignee: Panasonic Corporation, Osaka (JP)

( * ) Notice: Subject to any disclaimer, the term of this patent is extended or adjusted under 35 U.S.C. 154(b) by 935 days.

(21) Appl. No.: 10/560,589

(22) PCT Filed: Jun. 10, 2004

(86) PCT No.: PCT/JP2004/008475

§ 371 (c)(1),
(2), (4) Date: Sep. 7, 2006

(87) PCT Pub. No.: WO2004/112440

PCT Pub. Date: Dec. 23, 2004

(65) Prior Publication Data

US 2007/0007538 A1    Jan. 11, 2007

(30) Foreign Application Priority Data

Jun. 13, 2003  (JP) ............................. 2003-170086
Aug. 8, 2003  (JP) ............................. 2003-290413
Aug. 25, 2003  (JP) ............................. 2003-300003

(51) Int. Cl.
*H01L 27/32* (2006.01)

(52) U.S. Cl. .................. 257/79; 257/40; 257/E51.018; 257/E51.022

(58) Field of Classification Search .................. 257/40; 247/40, 79
See application file for complete search history.

(56) References Cited

U.S. PATENT DOCUMENTS 5,681,442 A * 10/1997 Ogawa et al. ............... 205/122

(Continued)

FOREIGN PATENT DOCUMENTS

JP    07-057871    3/1995

(Continued)

OTHER PUBLICATIONS

Chinese Office Action, with English Translation, issued in Chinese Patent Application No. CN 200480016589.9, dated Apr. 11, 2008.

(Continued)

*Primary Examiner*—Wael M Fahmy
*Assistant Examiner*—Abul Kalam
(74) *Attorney, Agent, or Firm*—McDermott Will & Emery LLP

(57) ABSTRACT

Disclosed herein is a light-emitting device comprising a transparent or semi-transparent first substrate, a second substrate provided opposite to the first substrate, a transparent or semi-transparent first electrode provided on the first substrate, a second electrode provided on the second substrate so as to be opposite to the first electrode, and a light-emitting layer which contains a metal oxide semiconductor porous body, by the surface of which an organic light-emitting material is supported, and is provided between the first electrode and the second electrode.

15 Claims, 40 Drawing Sheets

U.S. PATENT DOCUMENTS

| | | |
|---|---|---|
| 5,958,573 A | 9/1999 | Spitler et al. |
| 6,185,032 B1 | 2/2001 | Lee et al. |
| 6,762,553 B1 | 7/2004 | Yokogawa et al. |
| 2002/0053871 A1* | 5/2002 | Seo ............................ 313/504 |
| 2003/0057828 A1* | 3/2003 | Roitman et al. ............. 313/506 |
| 2004/0246408 A1 | 12/2004 | Ando et al. |
| 2007/0085076 A1* | 4/2007 | Yamamoto et al. ............ 257/40 |

FOREIGN PATENT DOCUMENTS

| | | |
|---|---|---|
| JP | 09-007763 | 1/1997 |
| JP | 9-328680 A | 12/1997 |
| JP | 11-162640 | 6/1999 |
| JP | 11-162641 | 6/1999 |
| JP | 11-288785 | 10/1999 |
| JP | 11-329752 | 11/1999 |
| JP | 2001-052857 A | 2/2001 |
| JP | 2001-126872 | 5/2001 |
| JP | 2001-202827 | 7/2001 |
| JP | 2002-203687 | 7/2002 |
| JP | 2002-237382 A | 8/2002 |
| JP | 2003-115385 | 4/2003 |

OTHER PUBLICATIONS

Japanese Office Action issued in Japanese Patent Application No. 2005-506990, mailed Aug. 11, 2009.

* cited by examiner

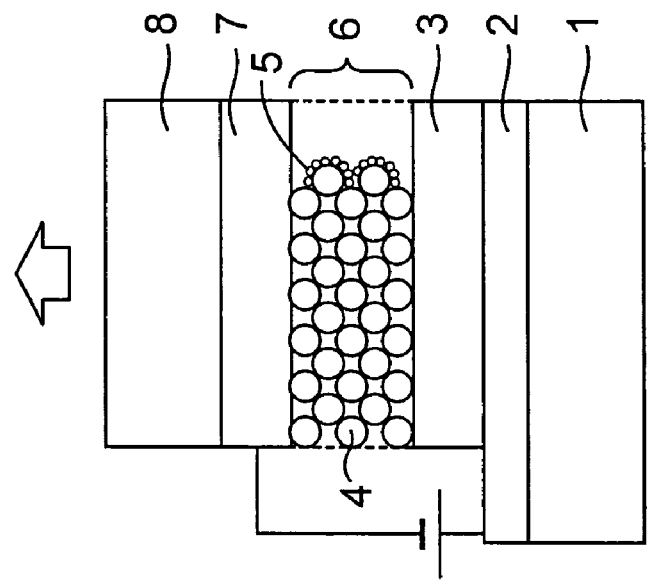
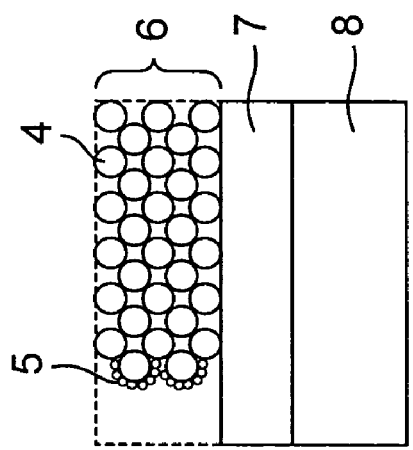
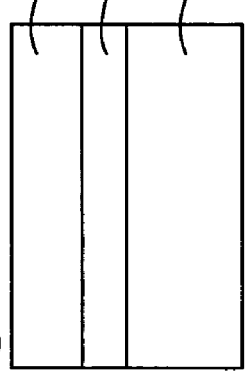
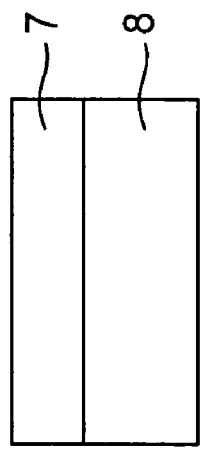
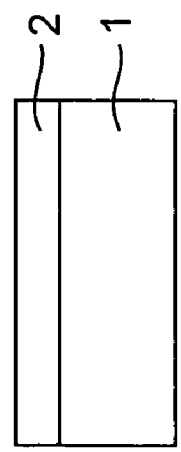

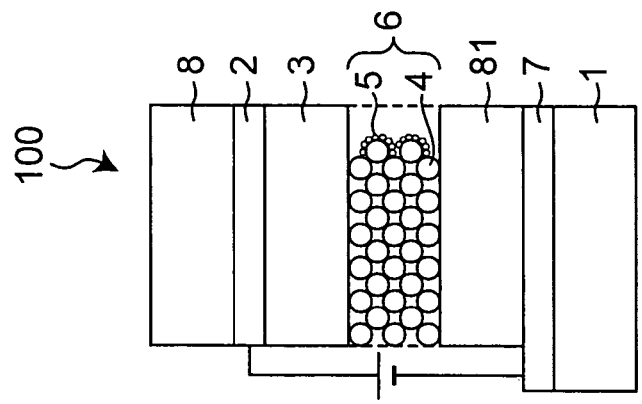
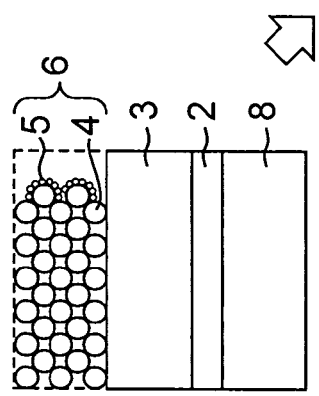
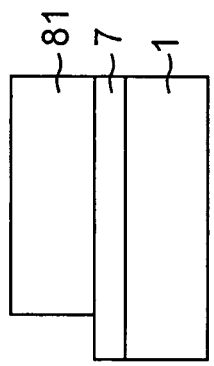
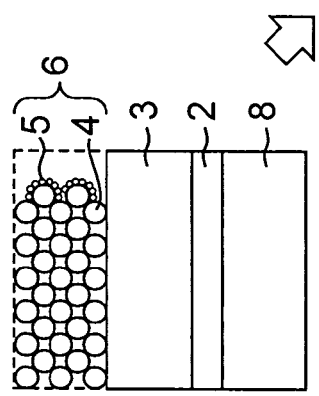
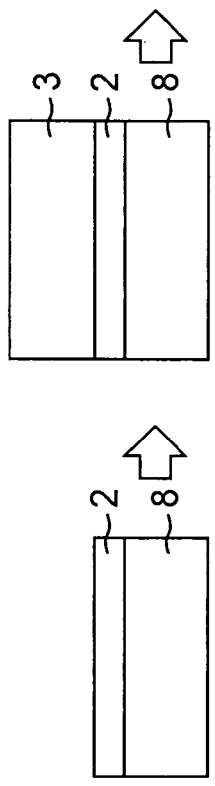
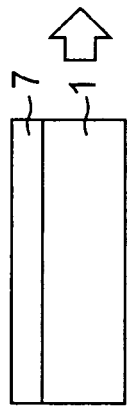

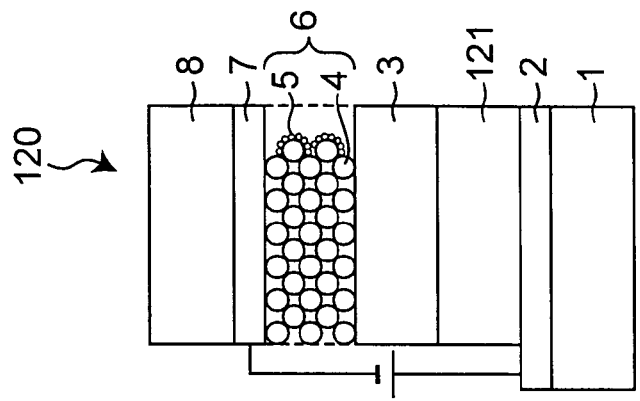
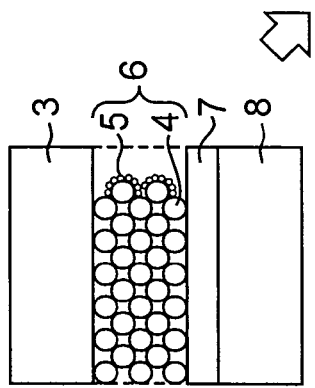
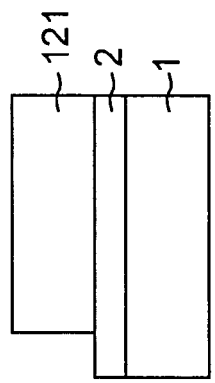
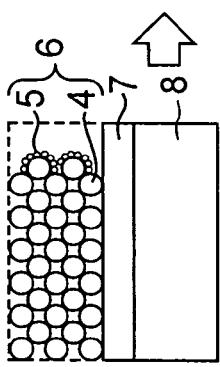
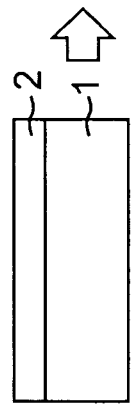
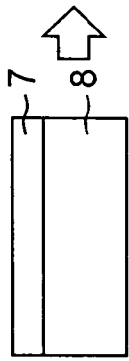

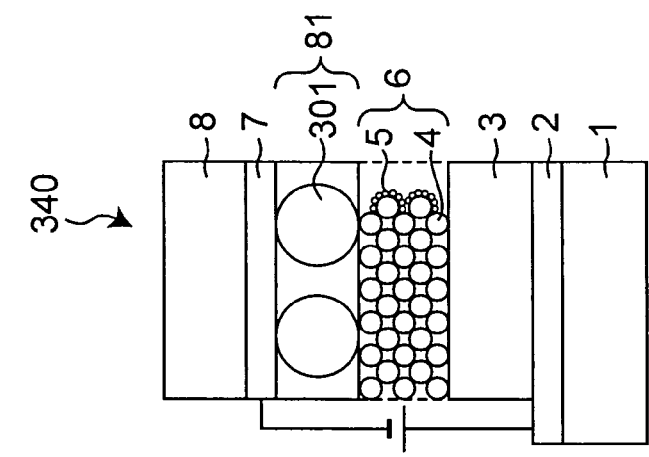
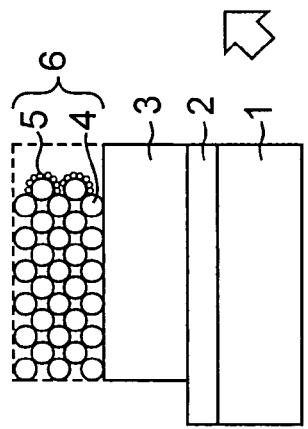
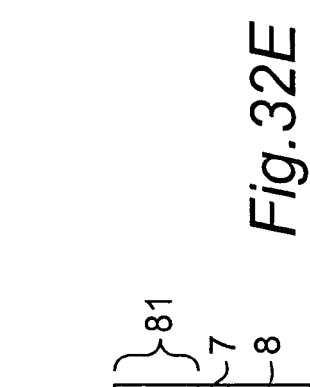
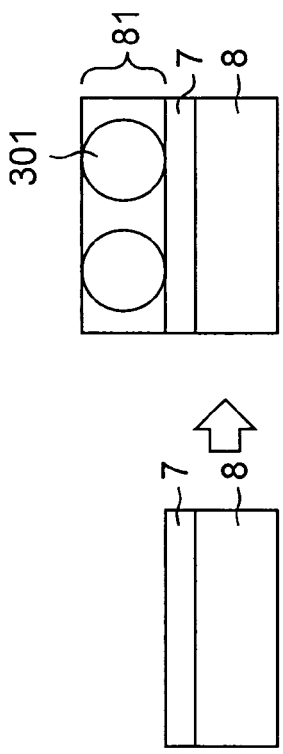
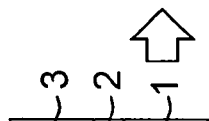

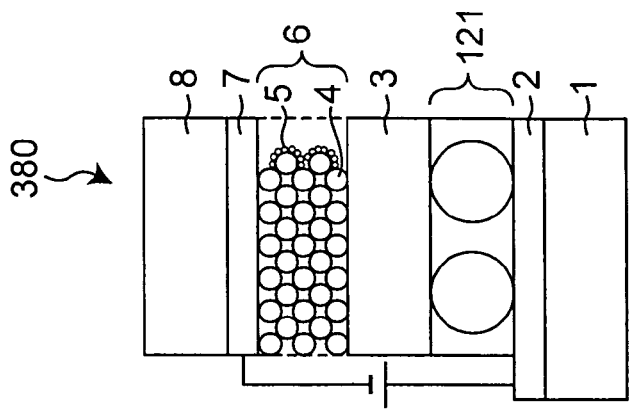
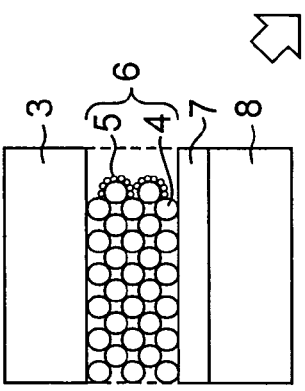
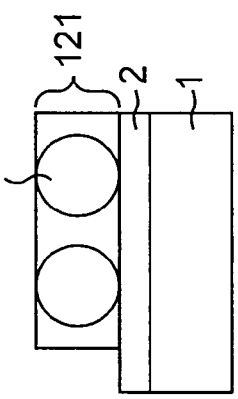
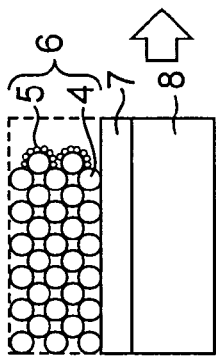
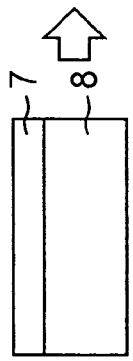

LIGHT-EMITTING DEVICE HAVING A METAL OXIDE SEMICONDUCTOR POROUS BODY WITH AN ORGANIC LIGHT-EMITTING MATERIAL

RELATED APPLICATION

This application is a national phase of PCT/JP2004/008475 filed on Jun. 10, 2004, which claims priority from Japanese Application No. 2003-170086 filed on Jun. 13, 2003, Japanese Application No. 2003-290413 filed on Aug. 8, 2003, and Japanese Application No. 2003-300003 filed on Aug. 25, 2003 the disclosures of which Applications are incorporated by reference herein. The benefit of the filing and priority dates of the International and Japanese Applications is respectfully requested.

FIELD OF THE INVENTION

The present invention relates to a light-emitting device which can be used as a light source for various applications such as light-emitting displays, communications, and lighting, and a display using the light-emitting device.

BACKGROUND ART

In recent years, attention is being given to flat displays, especially to electroluminescence (hereinafter, simply referred to as "EL") devices. The EL devices are self-emission type devices, and thus have advantages such as high visibility, wide viewing angles, and high responsivity.

The EL devices now practically used include inorganic EL devices using inorganic light-emitting materials and organic EL devices using organic light-emitting materials. Inorganic EL devices using inorganic materials such as zinc sulfide require a relatively high alternating voltage to operate, and therefore driving circuits thereof are likely to be complicated. In addition, such inorganic EL devices have a problem that brightness is low. For these reasons, inorganic EL devices have not been so actively developed for practical use.

As for organic EL devices, in 1987, Tang et al. proposed an organic EL device using an organic light-emitting material and having a two-layer structure in which a hole transport layer and an organic light-emitting layer are stacked (see, for example, Applied Physics Letters, 51, 1987, P. 913). It has been reported that this organic EL device achieved light emission having a luminance of 1,000 cd/m$^2$ or more at a driving voltage of 10 V or less. This proposal by Tang et al. has stimulated the development of organic EL devices using organic light-emitting materials, and thereafter organic EL devices have been actively developed until now.

Hereinbelow, an organic EL device now generally studied will be described with reference to FIG. 23. An organic EL device 200 shown in FIG. 23 is formed by stacking a transparent or semi-transparent hole injection electrode 2, a hole transport layer 3, a light-emitting layer 6, and an electron injection electrode 7 on a transparent substrate 1 in order of mention. It is to be noted that the organic EL device 200 may further include a hole injection layer provided between the hole injection electrode 2 and the hole transport layer 3, and/or an electron transport layer provided between the light-emitting layer 6 and the electron injection electrode 7, and/or an electron injection layer provided between the electron injection electrode 7 and the electron transport layer.

As the hole injection electrode, a transparent conductive ITO (Indium Tin Oxide) film can be used. Such an ITO film is formed by, for example, a sputtering method, an electron beam evaporation method, or an ion plating method so that the transparency thereof can be increased or the resistivity thereof can be lowered.

Examples of a material for forming the hole transport layer include diamine derivatives used by Tang et al., such as N,N'-bis(3-methylphenyl)-N,N'-diphenylbenzidine (TPD). In general, diamine derivatives are excellent in transparency, and therefore a hole transport layer formed using a diamine derivative is substantially transparent even when it has a thickness of about 80 nm.

The light-emitting layer is generally formed by vacuum-evaporating an electron transportable light-emitting material such as tris(8-quinolinolato)aluminum (Alq3) so as to have a thickness of several tens of nanometer, as has been reported by Tang et al. The organic EL device, however, may have a so-called double hetero structure composed of a relatively thin light-emitting layer and an electron transport layer having a thickness of about 20 nm stacked on the light-emitting layer, for the purpose of achieving various luminescent colors.

As the electron injection electrode, an electrode formed using an alloy composed of a metal having a low work function and a low electron injection barrier and a stable metal having a relatively high work function, such as an MgAg alloy proposed by Tang et al. or an AlLi alloy, or a laminated electrode obtained by, for example, stacking an electron injection layer formed from LiF and an aluminum layer is often used.

Further, there is known an organic EL display using low-temperature polysilicon thin film transistors (TFT) which drive individual pixels, as shown in Journal of the Society for Information Display, vol. 8, No. 2, pp. 93-97.

In the meantime, a display generally includes a circular polarizing plate. By providing a circular polarizing plate, it is possible to prevent external light which has entered the display from being reflected by the surface of a metal electrode such as an electron injection electrode formed using an MgAg alloy or the like, thereby preventing deterioration of contrast.

A display using a conventional organic EL device can be manufactured by forming a transparent hole injection electrode, an organic layer, and an electron injection electrode on a transparent substrate in order of mention. In this case, light is extracted from the hole injection electrode side. In the case of an active matrix display having thin film transistors which drive individual pixels, the thin film transistors are arranged on the transparent substrate, and therefore it is difficult for such a conventional active matrix display to have a high aperture ratio.

In order to improve the aperture ratio of such an active matrix display to achieve high brightness, a structure in which a substrate having thin film transistors thereon is provided so as to be opposed to a top surface through which light is extracted has been proposed ("Top emission structure advantageous for high brightness and high definition", TRIGGER, vol. 10, pp. 12-13, 2001).

A top emission-type organic EL device will be described with reference to FIG. 24. An organic EL device 210 shown in FIG. 24 is formed by stacking a hole injection electrode 2, a hole transport layer 3, a light-emitting layer 6, a transparent electron injection electrode 7, and a protection layer 211 on a substrate 1 in order of mention. This organic EL device 210 is different from the organic EL device 200 shown in FIG. 23 in that the electron injection electrode needs to have transparency. In the above-described proposal of the top emission structure, a thin film of an MgAg alloy proposed by Tang et al. with a thickness of about 10 nm is used as a transparent electron injection electrode, and a transparent resin film or the like is used as a protection layer.

As described above, in a top emission-type light-emitting device, an electrode arranged on the top side needs to have transparency. Such a top emission-type light-emitting device can be manufactured by forming a thin film transistor on a back substrate which is to be arranged on the bottom side, stacking organic layers containing organic materials, such as a light-emitting layer, one after another, and then forming a transparent electrode on the top of the organic layers. However, in this case, formation of an ITO film usually used as a transparent electrode involves a problem that the organic layers provided below the ITO film are deteriorated under the influence of heat applied thereto during forming the ITO film so that carrier injection does not sufficiently occur. In the case of the top emission-type organic EL device 210 shown in FIG. 24, the electron injection electrode 7 is made transparent, and therefore a thin metal film or resin film is used for a light extraction surface. In general, an organic EL device is deteriorated under the influence of moisture or oxygen, thereby lowering brightness or increasing dark spots. In a case where a thin metal film or resin film is used for a light extraction surface, the lifespan of the device is shortened because such a film is inferior in moisture and oxygen barrier properties to a glass substrate or the like. As described above, a top emission-type light-emitting device can have a high aperture ratio, but it is difficult to achieve high brightness, high reliability, and long lifespan at the same time.

Further, it is desired that displays have high brightness and long lifespan. The brightness of a display using an organic EL device can be improved by increasing the current density flowing through an organic light-emitting material of the organic EL device, but the organic light-emitting material is likely to deteriorate due to an increased current density, thereby shortening the lifespan of the display.

On the other hand, the brightness of the display can also be improved by increasing the luminous flux from the light-emitting layer of the organic EL device. The luminous flux from the light-emitting layer can be increased by increasing the contact area between the electrode and the light-emitting layer. The contact area between the electrode and the light-emitting layer can be increased by, for example, allowing the transparent substrate of the light-emitting device to have surface irregularities or patterning the hole injection electrode with irregularities. Such a method for increasing the contact area between the electrode and the light-emitting layer can increase the surface area of the organic EL device by a factor of about 2 to 3 as compared to that of a conventional organic EL device, but cannot significantly increase the surface area of the organic EL device.

Further, each of the organic layers of the conventional organic EL device is formed as a thin film, and therefore it is necessary to control the film thickness thereof with high accuracy. If the thickness of the organic layer is not uniform, there is a case where the in-plane uniformity of luminous brightness becomes poor.

Furthermore, some conventional organic EL displays take measures against external light reflection by the use of a circular polarizing plate. However, the use of a circular polarizing plate involves a problem that the circular polarizing plate attenuates not only external light but also light emitted from the organic EL device. This also makes it difficult to achieve high brightness.

SUMMARY OF THE INVENTION

It is therefore an object of the present invention to provide a top emission-type light-emitting device having high brightness, excellent in-plane uniformity of luminous brightness, long lifespan, and stable light emission quality, a manufacturing method of such a light-emitting device, and a display using the light-emitting device.

In order to achieve the above object, the present invention is directed to a light-emitting device comprising:

a transparent or semi-transparent first substrate;

a second substrate provided opposite to the first substrate;

a transparent or semi-transparent first electrode provided on the first substrate;

a second electrode provided on the second substrate so as to be opposite to the first electrode; and a light-emitting layer which contains a metal oxide semiconductor porous body, by the surface of which an organic light-emitting material is supported, and is provided between the first electrode and the second electrode.

In this case, the metal oxide semiconductor porous body may be composed of a metal oxide semiconductor particulate powder. Further, the metal oxide semiconductor particulate powder may be composed of an n-type semiconductor material. Furthermore, the organic light-emitting material is preferably chemisorbed to the surface of the metal oxide semiconductor porous body.

In the present invention, the light-emitting device may further comprise at least one organic layer provided between the first electrode and the second electrode in addition to the light-emitting layer, the organic layer containing an organic adhesive material so as to function as an adhesive layer through which adjacent upper and lower layers thereof are bonded together. In this case, the organic adhesive material may contain at least a polymer-based material.

The transparent or semi-transparent substrate may be a glass substrate.

The light-emitting device may further comprise a low-refractive-index layer provided between the transparent or semi-transparent substrate and the electron injection layer.

The light-emitting device may further comprise a spacer dispersed in the organic layer, by which the thickness of the organic layer is defined. The spacer may be composed of transparent or semi-transparent particles. Further, the spacer may be made of an insulating material. The particle diameter of the spacer is in the range of 0.01 to 10 μm.

The light-emitting device may comprise as the first electrode, the second electrode, and the organic layer, an electron injection electrode, a hole injection electrode, and a hole transport layer, respectively, and wherein the hole transport layer functions as an adhesive layer through which adjacent upper and lower layers thereof are bonded together. In this case, the light-emitting device may further comprise an electron transport layer provided between the electron injection electrode and the light-emitting layer and/or a hole injection layer provided between the hole injection electrode and the hole transport layer.

The light-emitting device may comprise as the first electrode, the second electrode, and the organic layer, a hole injection electrode, an electron injection electrode, and a hole transport layer, respectively, and wherein the hole transport layer functions as an adhesive layer through which adjacent upper and lower layers thereof are bonded together. In this case, the light-emitting device may further comprise an electron transport layer provided between the electron injection electrode and the light-emitting layer and/or a hole injection layer provided between the hole injection electrode and the hole transport layer.

The light-emitting device may comprise as the first electrode, the second electrode, and the organic layer, an electron injection electrode, a hole injection electrode, and an electron transport layer, respectively, and may further comprise a hole transport layer provided between the light-emitting layer and the hole injection electrode, and wherein the electron transport layer functions as an adhesive layer through which adjacent upper and lower layers thereof are bonded together. In this case, the light-emitting device may further comprise a hole injection layer provided between the hole injection electrode and the hole transport layer.

The light-emitting device may comprise as the first electrode, the second electrode, and the organic layer, a hole injection electrode, an electron injection electrode, and an electron transport layer, respectively, and may further comprise a hole transport layer provided between the light-emitting layer and the hole injection electrode, and wherein the electron transport layer functions as an adhesive layer through which adjacent upper and lower layers thereof are bonded together. In this case, the light-emitting device may further comprise a hole injection layer provided between the hole injection electrode and the hole transport layer.

The light-emitting device may comprise as the first electrode, the second electrode, and the organic layer, an electron injection electrode, a hole injection electrode, and a hole injection layer, respectively, and may further comprise a hole transport layer provided between the light-emitting layer and the organic layer, and wherein the hole injection layer functions as an adhesive layer through which adjacent upper and lower layers thereof are bonded together. In this case, the light-emitting device may further comprise an electron transport layer provided between the electron injection electrode and the light-emitting layer.

The light-emitting device may comprise as the first electrode, the second electrode, and the organic layer, a hole injection electrode, an electron injection electrode, and an hole injection layer, respectively, and may further comprise a hole transport layer provided between the light-emitting layer and the organic layer, and wherein the hole injection layer functions as an adhesive layer through which adjacent upper and lower layers thereof are bonded together. In this case, the light-emitting device may further comprise an electron transport layer provided between the electron injection electrode and the light-emitting layer.

In a case where the second electrode is a hole injection electrode, the hole injection electrode has a black color. Further, the black hole injection electrode is composed of a p-type semiconductor. By providing such a hole injection electrode, it is possible to prevent the reflection of external light which has entered the light-emitting device.

In a case where the light-emitting layer containing the metal oxide semiconductor porous body is provided on the electron injection electrode, the light-emitting device may further comprise a metal oxide semiconductor layer provided between the electron injection electrode and the light-emitting layer containing the metal oxide semiconductor porous body. Further, the metal oxide semiconductor layer is composed of an n-type semiconductor.

The light-emitting device may further comprise a thin film transistor connected to the second electrode. The thin film transistor may be an organic thin film transistor composed of a thin film containing an organic material.

Another aspect of the present invention is directed to a display comprising:

a light-emitting device array in which the plurality of light-emitting devices described above are two-dimensionally arrayed;

a plurality of x electrodes extending in parallel with each other in a first direction parallel to the surface of the light-emitting device array; and a plurality of y electrodes extending in parallel with each other in a second direction parallel to the surface of the light-emitting device array and perpendicular to the first direction, wherein each of the thin film transistors of the light-emitting device array is connected to the x electrode and the y electrode.

The display may further comprise a region composed of a metal oxide semiconductor porous body by the surface of which a black dye is supported, by which the adjacent light-emitting devices two-dimensionally arrayed are separated from each other.

The light-emitting device may further comprise a thin film transistor connected to the second electrode and an adhesive layer provided between the second substrate including the thin film transistor and the second electrode, through which the adjacent upper and lower layers thereof are bonded together.

In this case, the light-emitting device may further comprise a spacer dispersed in the adhesive layer, by which the thickness of the adhesive layer is defined. The spacer may be made of an insulating material.

Still another aspect of the present invention is directed to a method for manufacturing a light-emitting device comprising the steps of:

preparing a transparent or semi-transparent first substrate;

forming a transparent or semi-transparent electron injection electrode on the first substrate;

forming a porous body composed of a metal oxide semiconductor particulate powder on the electron injection electrode;

allowing an organic light-emitting material to be supported by the surface of the porous body;

preparing a second substrate;

forming a thin film transistor on the second substrate;

forming a hole injection electrode on the thin film transistor;

forming a hole transport layer on the hole injection electrode;

allowing the porous body provided on the first substrate and the hole transport layer provided on the second substrate to be opposed to each other to carry out alignment in accordance with a pixel pitch; and bonding the porous body provided on the first substrate and the hole transport layer provided on the second substrate together.

In this case, the method for manufacturing a light-emitting device may further comprise the step of dispersing a spacer in the hole transport layer through which the porous body provided on the first substrate and the hole transport layer provided on the second substrate are to be bonded together.

According to another embodiment of the present invention, there is provided a method for manufacturing a light-emitting device comprising the steps of:

preparing a transparent or semi-transparent first substrate;

forming a transparent or semi-transparent hole injection electrode on the first substrate;

forming a hole transport layer on the hole injection electrode;

preparing a second substrate;

forming a thin film transistor on the second substrate;
forming an electron injection electrode on the thin film transistor;
forming a porous body composed of a metal oxide semiconductor particulate powder on the electron injection electrode;
allowing an organic light-emitting material to be supported by the surface of the porous body;
allowing the hole transport layer provided on the first substrate and the porous body provided on the second substrate to be opposed to each other to carry out alignment in accordance with a pixel pitch; and
bonding the hole transport layer provided on the first substrate and the porous body provided on the second substrate together.

In this case, the method for manufacturing a light-emitting device may further comprise the step of dispersing a spacer in the hole transport layer through which the hole transport layer provided on the first substrate and the porous body provided on the second substrate are to be bonded together.

According to still another embodiment of the present invention, there is provided a method for manufacturing a light-emitting device, comprising the steps of:
preparing a transparent or semi-transparent first substrate;
forming a transparent or semi-transparent electron injection electrode on the first substrate;
forming an electron transport layer on the electron injection electrode;
preparing a second substrate;
forming a thin film transistor on the second substrate;
forming a hole injection electrode on the thin film transistor;
forming a hole transport layer on the hole injection electrode;
forming a porous body composed of a metal oxide semiconductor particulate powder on the hole transport layer;
allowing an organic light-emitting material to be supported by the surface of the porous body;
allowing the electron transport layer provided on the first substrate and the porous body provided on the second substrate to be opposed to each other to carry out alignment in accordance with a pixel pitch; and
bonding the electron transport layer provided on the first substrate and the porous body provided on the second substrate together.

In this case, the method for manufacturing a light-emitting device may further comprise the step of dispersing a spacer in the electron transport layer through which the electron transport layer provided on the first substrate and the porous body provided on the second substrate are to be bonded together.

According to yet another embodiment of the present invention, there is provided a method for manufacturing a light-emitting device, comprising the steps of:
preparing a transparent or semi-transparent first substrate;
forming a transparent or semi-transparent hole injection electrode on the first substrate;
forming a hole transport layer on the hole injection electrode;
forming a porous body composed of a metal oxide semiconductor particulate powder on the hole transport layer;
allowing an organic light-emitting material to be supported by the surface of the porous body;
preparing a second substrate;
forming a thin film transistor on the second substrate;
forming an electron injection electrode on the thin film transistor;
forming an electron transport layer on the electron injection electrode;
allowing the porous body provided on the first substrate and the electron transport layer provided on the second substrate to be opposed to each other to carry out alignment in accordance with a pixel pitch; and
bonding the porous body provided on the first substrate and the electron transport layer provided on the second substrate together.

In this case, the method for manufacturing a light-emitting device may further comprise the step of dispersing a spacer in the electron transport layer through which the porous body provided on the first substrate and the electron transport layer provided on the second substrate are to be bonded together.

According to yet another embodiment of the present invention, there is provided a method for manufacturing a light-emitting device, comprising the steps of:
preparing a transparent or semi-transparent first substrate;
forming a transparent or semi-transparent electron injection electrode on the first substrate;
forming a porous body composed of metal oxide semiconductor particulate powder on the electron injection electrode;
allowing an organic light-emitting material to be supported by the surface of the porous body to provide a light-emitting layer;
forming a hole transport layer on the light-emitting layer containing the porous body;
preparing a second substrate;
forming a thin film transistor on the second substrate;
forming a hole injection electrode on the thin film transistor;
forming a hole injection layer on the hole injection electrode;
allowing the hole transport layer provided on the first substrate and the hole injection layer provided on the second substrate to be opposed to each other to carry out alignment in accordance with a pixel pitch; and
bonding the hole transport layer provided on the first substrate and the hole injection layer provided on the second substrate together.

In this case, the method for manufacturing a light-emitting device may further comprise the step of dispersing a spacer in the hole injection layer through which the hole transport layer provided on the first substrate and the hole injection layer provided on the second substrate are to be bonded together.

According to yet another embodiment of the present invention, there is provided a method for manufacturing a light-emitting device, comprising the steps of:
preparing a transparent or semi-transparent first substrate;
forming a transparent or semi-transparent hole injection electrode on the first substrate;
forming a hole injection layer on the hole injection electrode;
preparing a second substrate;
forming a thin film transistor on the second substrate;
forming an electron injection electrode on the thin film transistor;
forming a porous body composed of a metal oxide semiconductor particulate powder on the electron injection electrode;
allowing an organic light-emitting material to be supported by the surface of the porous body to provide a light-emitting layer;
forming a hole transport layer on the light-emitting layer containing the porous body;
allowing the hole injection layer provided on the first substrate and the hole transport layer provided on the second substrate to be opposed to each other to carry out alignment in accordance with a pixel pitch; and bonding the hole injection layer provided on the first substrate and the hole transport layer provided on the second substrate together.

In this case, the method for manufacturing a light-emitting device may further comprise the step of dispersing a spacer in the hole injection layer through which the hole injection layer provided on the first substrate and the hole transport layer provided on the second substrate are to be bonded together.

According to yet another embodiment of the present invention, there is provided a method for manufacturing a light-emitting device, comprising the steps of:

preparing a transparent or semi-transparent first substrate;

forming a transparent or semi-transparent electron injection electrode on the first substrate;

forming a porous body composed of a metal oxide semiconductor particulate powder on the electron injection electrode;

allowing an organic light-emitting material to be supported by the surface of the porous body to provide a light-emitting layer;

forming a hole transport layer on the light-emitting layer containing the porous body;

forming a hole injection electrode on the hole transport layer;

preparing a second substrate;

forming a thin film transistor on the second substrate;

forming an adhesive layer on the thin film transistor;

allowing the hole injection electrode provided on the first substrate and the adhesive layer provided on the second substrate to be opposed to each other to carry out alignment in accordance with a pixel pitch; and bonding the hole injection electrode provided on the first substrate and the adhesive layer provided on the second substrate together.

In this case, the method for manufacturing a light-emitting device may further comprise the step of dispersing a spacer in the adhesive layer through which the hole injection electrode provided on the first substrate and the adhesive layer provided on the second substrate are to be bonded together.

BRIEF DESCRIPTION OF THE DRAWINGS

The present invention will become readily understood from the following description of preferred embodiments thereof made with reference to the accompanying drawings, in which like parts are designated by like reference numeral and in which:

FIGS. 2A to 2E are cross-sectional views which show the steps of manufacturing the light-emitting device according to the embodiment 1 of the present invention;

FIGS. 14A to 14F are cross-sectional views which show the steps of manufacturing the light-emitting device according to the embodiment 10 of the present invention;

FIGS. 17A to 17F are cross-sectional views which show the steps of manufacturing the light-emitting device according to the embodiment 13 of the present invention;

FIGS. 32A to 32F are cross-sectional views which show the steps of manufacturing the light-emitting device according to the embodiment 26 of the present invention;

FIGS. 38A to 38F are cross-sectional views which show the steps of manufacturing the light-emitting device according to the embodiment 32 of the present invention;

DESCRIPTION OF PREFERRED EMBODIMENTS

Figure 1:
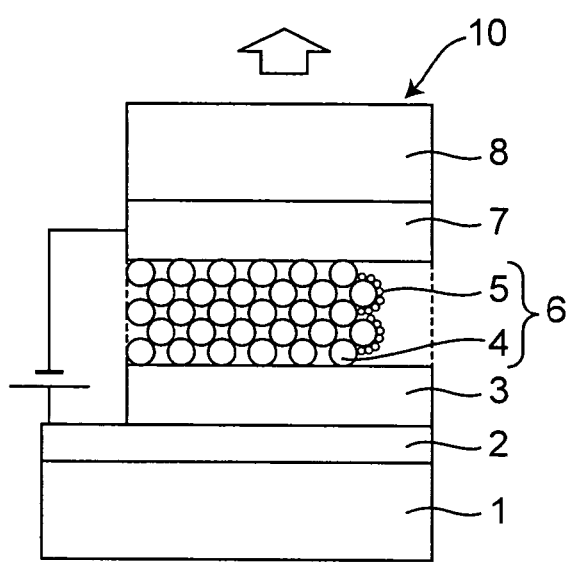
FIG. 1 is a cross-sectional view of a light-emitting device according to an embodiment 1 of the present invention taken along a plane perpendicular to a light-emitting surface thereof.

Hereinbelow, light-emitting devices according to some embodiments of the present invention, manufacturing methods thereof, displays using the light-emitting devices, and manufacturing methods thereof will be described with reference to the accompanying drawings. It is to be noted that in the drawings, like numerals describe substantially similar structural components.

Embodiment 1

A light-emitting device according to an embodiment 1 of the present invention will be described with reference to FIG. 1. FIG. 1 is a cross-sectional view of a light-emitting device 10 taken along a plane perpendicular to a light-emitting surface thereof. The light-emitting device 10 uses an organic light-emitting material 5 as a light-emitting material. The light-emitting device 10 includes a transparent substrate 8, a substrate 1 provided so as to be opposed to the transparent substrate 8, and a light-emitting layer 6 which is provided between the transparent substrate 8 and the substrate 1 and contains a porous body composed of metal oxide semiconductor fine particles 4 by the surface of which the organic light-emitting material 5 is supported. More specifically, the light-emitting device 10 further includes a transparent electron injection electrode 7 provided on the transparent substrate 8, a hole injection electrode 2 provided on the substrate 1, and a hole transport layer 3. Between the electron injection electrode 7 and the hole injection electrode 2, the light-emitting layer 6 and the hole transport layer 3 are stacked in order of mention. As shown by the arrow in FIG. 1, light is extracted from the transparent substrate 8 side. In addition to the structural components described above, the light-emitting device 10 may further include a hole injection layer or a conductive layer provided between the hole injection electrode 2 and the hole transport layer 3. Further, the light-emitting device 10 may include an electron transport layer or a conductive layer provided between the light-emitting layer 6 and the electron injection electrode 7. The hole injection electrode 2 may have a black color. By providing a black hole injection electrode 2, it is possible to prevent external light which has entered the light-emitting device from being reflected by the surface of the hole injection electrode 2, thereby improving the external light contrast. The light-emitting device 10 may further include a low-refractive-index layer provided between the electron injection electrode 7 and the transparent substrate 8. By providing a low-refractive-index layer, it is possible to enhance the efficiency of taking light out of the light-emitting device. Further, the light-emitting device 10 may include an n-type semiconductor thin layer provided between the electron injection electrode 7 and the light-emitting layer 6 containing a porous body composed of the metal oxide semiconductor fine particles 4. Such a thin layer functions as a hole blocking layer which prevents holes from reaching the transparent electron injection electrode 7 through the interstices of a porous body composed of the metal oxide semiconductor fine particles 4 without recombining with electrons, thereby enhancing the efficiency of recombination of holes with electrons. As described above, the light-emitting device 10 includes the light-emitting layer 6 containing a porous body composed of the metal oxide semiconductor fine particles 4 by the surface of which the organic light-emitting material 5 is supported, and therefore the contact area between a porous body composed of the metal oxide semiconductor fine particles 4 and the organic light-emitting material 5 is increased. Since electric current flows through a porous body composed of the metal oxide semiconductor fine particles 4 into the organic light-emitting material, an increase in the contact area between a porous body composed of the metal oxide semiconductor fine particles 4 and the organic light-emitting material 5 increases an area which contributes to light emission, thereby improving the brightness of the light-emitting device 10. That is, it is possible to decrease the current density flowing through the organic light-emitting material 5 constituting the light-emitting layer 6 to achieve brightness of the light-emitting device 10 comparable to that of a conventional light-emitting device, thereby suppressing the deterioration of the organic light-emitting material 5.

Next, each of the structural components of the light-emitting device 10 will be described in detail.

First, the transparent substrate 8 will be described. The transparent substrate 8 is not particularly limited as long as it can support the light-emitting layer 6 containing a porous body composed of the metal oxide semiconductor fine particles 4 by the surface of which the organic light-emitting material 5 is supported, and is transparent or semi-transparent so that light produced in the light-emitting layer 6 can be taken out of the device 10. Examples of such a transparent substrate 8 include glass substrates usually used, such as Corning 1737, and polyester or other resin films. Particularly preferred examples of the transparent substrate 8 include, but are not limited to, non-alkali glass not containing alkali ions contained in glass usually used which may affect the light-emitting device, silica glass, ceramic substrates, and silicon substrates. The surface of such glass may be coated with, for example, alumina to provide an ion barrier layer. On the other hand, a material for forming a resin film is not particularly limited as long as it has durability, flexibility, transparency, electrical insulating properties, and resistance to moisture. Examples of such a material include polyethylene terephthalate-based materials, combinations of polychlorotrifluoroethylene-based materials and nylon 6, and fluorocarbon resin-based materials. It is to be noted that by allowing the light-emitting device 10 to have the transparent or semi-transparent substrate 1 and the hole injection electrode 2, it is possible to take emitted light out of the light-emitting device 10 from either side thereof.

Figure 23:
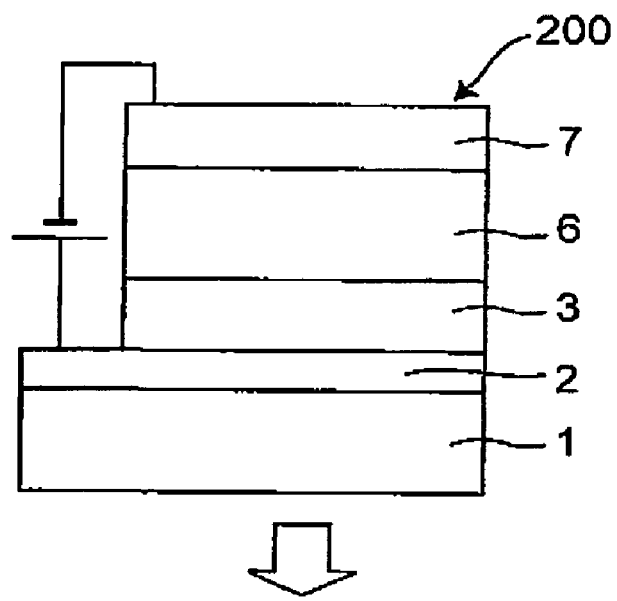
FIG. 23 is a cross-sectional view of a conventional organic EL device taken along a plane perpendicular to a light-emitting surface thereof.
Figure 24:
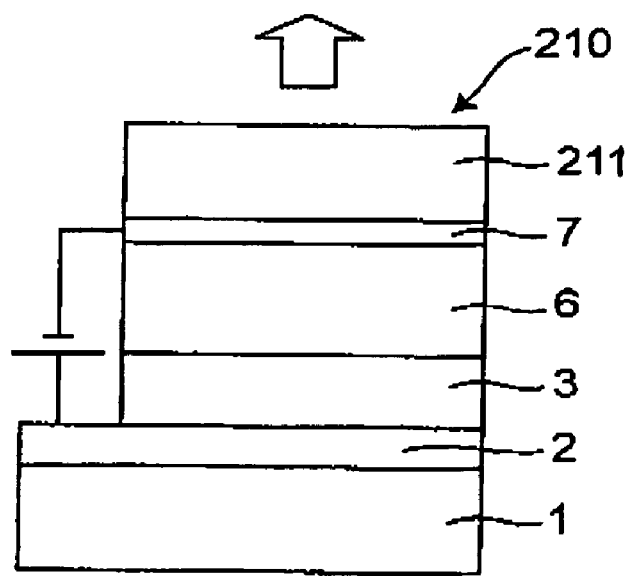
FIG. 24 is a cross-sectional view of a conventional top emission-type organic EL device taken along a plane perpendicular to a light-emitting surface thereof.

Next, the electron injection electrode 7 will be described. Examples of a material for forming the electron injection electrode 7 include ITO, InZnO (indium zinc oxide), $SnO_2$ (tin oxide), ZnO (zinc oxide), and polyaniline. Particularly preferred examples of a material for forming the electron injection electrode 7 include, but are not limited to, inorganic compounds such as ITO, InZnO, $SnO_2$, and ZnO. In the meantime, a conventional organic EL device 200 shown in FIG. 23 and a conventional organic EL device 210 shown in FIG. 24 use an electron injection electrode formed using an alloy composed of an alkali metal or an alkaline earth metal having a low work function and a low barrier to electron injection into an organic material layer such as a light-emitting layer and a stable metal such as Al or Ag having a relatively high work function. ITO generally used for a transparent conductive film has a high work function of 4.3 to 4.7 eV, and therefore a barrier to electron injection into an organic material layer such as a light-emitting layer is high. That is, electron injection does not efficiently occur when ITO is used for an electron injection electrode. However, the structure of the light-emitting layer 6 (which will be described later in detail) according to the present invention have allowed efficient electron injection into an organic material layer such as a light-emitting layer, even when high work function ITO or the like is used for an electron injection electrode.

The ITO film is formed by a film forming method such as a sputtering method, an electron beam evaporation method, or an ion plating method so that the transparency thereof can be increased or the resistivity thereof can be decreased. The thus formed ITO film may be further subjected to surface treatment such as plasma treatment for the purpose of controlling properties thereof such as resistivity and work function. The thickness of the electron injection electrode 7 is determined according to a required sheet resistivity and visible light transmittance. It is to be noted that the driving current density of the organic EL device is relatively high so that the wiring resistance thereof becomes a problem. Therefore, the ITO film is often made to have a thickness of 100 nm or more to decrease sheet resistivity.

As described above, according to the present invention, it is possible to use ITO or the like for the electron injection electrode 7, and to use a glass substrate or the like as the transparent substrate 8. On the other hand, in the conventional organic EL device 210 shown in FIG. 24, the electrode formed using an alloy composed of an alkali metal or an alkaline earth metal and a metal such as Al or Ag is provided in the form of a thin layer with a thickness of about 10 nm so that the electrode can have transparency. Therefore, it becomes necessary to provide a protection layer such as a transparent resin film, for the purpose of protecting the electrode. However, a structure composed of such a thin metal film and a resin film is poor in moisture and oxygen barrier properties so that moisture and oxygen penetrate into the light-emitting device. It has been known that the molecular binding of an organic light-emitting material will be cleaved with the application of an electric field or the application of light in the presence of moisture or oxygen, thereby deteriorating the light-emitting property of the organic light-emitting material. However, according to the present invention, it is possible to use ITO or the like for the electron injection electrode 7, and to use a glass substrate or the like as the transparent substrate 8, thereby improving moisture and oxygen barrier properties and enabling a high-reliability and long-life light-emitting device to be obtained.

It is preferred that the light-emitting device 10 includes a low-refractive-index layer provided between the transparent substrate 8 and the electron injection electrode 7. By providing a low-refractive-index layer, it is possible to enhance the efficiency of taking light out of the device. As a material for forming such a low-refractive-index layer, for example, silica aerogel can be used. The relation between light extraction efficiency $\eta_e$ and refractive index n is generally represented by the following formula (1):

$$\eta_e = \tfrac{1}{2}n^2 \qquad (1)$$

While a general glass substrate has a refractive index of about 1.6, silica aerogel has a refractive index of 1.03. Therefore, by providing a low-refractive-index layer composed of silica aerogel, it is possible to enhance light extraction efficiency by a factor of two or more.

Next, the light-emitting layer 6 will be described. As described above, the light-emitting layer 6 contains a metal oxide semiconductor porous body by the surface of which the organic light-emitting material 5 is supported. The metal oxide semiconductor porous bodies may be scattered in a matrix composed of an organic material.

As a material of such a metal oxide semiconductor porous body, an n-type semiconductor material having a good electron injection property and having no absorption in a visible light region is used. Examples of such a material to be mainly used for the metal oxide semiconductor porous body include oxides of Mg, Sr, Ba, Y, Ti, Zr, Hf, V, Nb, Ta, Mo, W, Mn, Ru, Zn, In, La, and Ce. Particularly preferred examples of the metal oxide semiconductor porous body include single crystals and polycrystals of oxides such as $TiO_2$ (titanium oxide), ZnO (zinc oxide), $Nb_2O_5$ (niobium oxide), $SnO_2$ (tin oxide), $In_2O_3$ (indium oxide), $WO_3$ (tungsten oxide), $ZrO_2$ (zirconium oxide), $Ta_2O_5$ (tantalum oxide), and $La_2O_3$ (lanthanum oxide) and oxides having a perovskite structure such as $SrTiO_3$, $BaTiO_3$, $CaTiO_3$, $MgTiO_3$, $KNbO_3$, $SrPbO_3$, $(Ba,Sr)PbO_3$, $(Sr, La)PbO_3$, and $Sr(Ti,Nb)O_3$, and porous bodies composed of particulate powders obtained from the single crystals and the polycrystals. Further, composite oxides mainly composed of any one of the above-mentioned metal oxides may also be used. Examples of such a composite oxide include $MgIn_2O_4$, $CdSnO_3$, $CdIn_2O_4$, $ZnIn_2O_4$, $InGaZnO_4$, and $In_4Sn_3O_{12}$. Furthermore, complexes obtained by mixing the above-mentioned two or more metal oxides at any ratio may also be used. Examples of such a complex include combinations such as $Nb_2O_5/SrTiO_3$, $Nb_2O_5/Ta_2O_5$, $Nb_2O_5/ZrO_2$, $Nb_2O_5/TiO_2$, $CeO_2/SnO_2$, and $ZnO/SnO_2$. Moreover, the above-mentioned metal oxides may contain a donor such as a different kind of metal oxide, fluorine, or hydrogen for the purpose of improving conductivity. Examples of such a metal oxide containing a donor include, but are not limited to, ZnO doped with Al, In, Ga, or Si, $TiO_2$ doped with Ta, $BaTiO_3$ doped with La or Ta, $In_2O_3$ doped with Sn or Ti, $SnO_2$ doped with Sb, P, or F, $SrTiO_3$ doped with Nb, Ta, or La, and $MgIn_2O_4$ doped with H.

The surface of the metal oxide semiconductor porous body has a porous body structure formed by stacking the metal oxide semiconductor fine particles 4 each having a diameter of about 5 nm to 200 nm so that the amount of the organic light-emitting material 5 to be supported by the surface of the metal oxide semiconductor porous body is increased. Such a porous body structure increases the surface area of the metal oxide semiconductor per unit area of the electrode so that the amount of the organic light-emitting material 5 to be supported by the surface of the metal oxide semiconductor porous body is increased.

A method for manufacturing such a metal oxide semiconductor porous body layer will be described.

(1) A powder composed of the metal oxide semiconductor fine particles 4 is obtained by a sol-gel method using a metal halide, a metal alkoxide, or a metal oxide sol obtained by hydrolysis of a metal halide or a metal alkoxide.

(2) The powder composed of the metal oxide semiconductor fine particles 4 is dispersed in a solvent by the use of a paint conditioner, a homogenizer, an ultrasonic agitator, or a mortar. In this case, for example, polyethylene glycol or the like is added thereto to prepare a homogenous paste. The amount of the powder composed of the metal oxide semiconductor fine particles 4 to be used is preferably in the range of 5 to 60% by mass.

(3) The paste of the metal oxide semiconductor fine particles 4 is applied onto the electron injection electrode 7 provided on the transparent substrate 8, and is then dried. The application of paste of the metal oxide semiconductor fine particles 4 can be carried out by a well-known application method such as an ink-jet method, a dipping method, a spin coating method, a bar coating method, a blade coating method, a knife coating method, a reverse roll coating method, a gravure roll coating method, a squeeze coating method, a curtain coating method, a spray coating method, or a die coating method.

In the above steps (1) to (3), a metal oxide semiconductor porous body layer having mechanical strength and temporal stability can be formed, but a method for forming a metal oxide semiconductor porous body layer is not limited to the method described above. It is to be noted that the metal oxide semiconductor fine particles 4 and the paste containing metal oxide semiconductor fine particles may be commercially-available products. Further, it is preferred that the paste of the metal oxide semiconductor fine particles 4 applied onto the electron injection electrode 7 be sintered for 5 to 60 minutes at a temperature in the range of 400 to 500° C. depending on the material of the substrate used. By doing so, it is possible to further enhance the mechanical strength of the metal oxide semiconductor porous body layer. Furthermore, after sintering, the metal oxide semiconductor porous body may be subjected to plasma treatment, corona treatment, UV treatment, acid or base treatment, or other after treatment.

The organic light-emitting material 5 to be supported by the surface of the metal oxide semiconductor porous body is broadly divided into two types, a low-molecular light-emitting material and a high-molecular light-emitting material. Examples of a low-molecular light-emitting material to be used include condensed rings such as naphthalene, anthracene, pyrene, and naphthacene, derivatives thereof, and derivatives of heteroaromatic compounds such as coumarin, 4H-pyranylidene propane dinitrile, and phenoxazone. Examples of other low-molecular light-emitting materials to be used include, but are not limited to, polymethine-based compounds, stilbene-based compounds, chelate metal complexes, chelate lanthanoide complexes, xanthene-based compounds, and derivatives thereof. On the other hand, as high-molecular light-emitting materials, π-conjugated polymers, σ-conjugated polymers, polymerized pigments, and polymer metal complexes, and the like can be used. Specific examples of such a high-molecular light-emitting material include, but are not limited to, poly-p-phenylenevinylene derivatives (PPV derivatives), polythiophene derivatives (PAT derivatives), polyparaphenylene derivatives (PPP derivatives), polyalkylphenylene (PDAF), polyacethylene derivatives (PA derivatives), polysilane derivatives (PS derivatives), and poly-N-vinylcarbazole (PVK). Further, the high-molecular light-emitting material may be an oligomer having a medium molecular weight or a dendrimer having a dendritic structure. Furthermore, the high-molecular light-emitting material may be a mixture of the above-mentioned two or more organic light-emitting materials. To the above-mentioned high-molecular materials, a carrier-transportable low-molecular material or a dopant pigment for changing a luminescent color may be added.

Here, a method for forming a light-emitting layer 6 containing the metal oxide semiconductor porous body by the surface of which the organic light-emitting material 5 is supported will be described. The method described below is just one example, and a method for forming such a light-emitting layer 6 is not limited thereto. As a method for allowing the organic light-emitting material 5 to be supported by the surface of the porous body, a chemical adsorption method is employed. For example, carboxyl groups (—COOH) are introduced into the organic light-emitting material 5, and are then esterified with hydroxyl groups (—OH) existing on the surface of the metal oxide semiconductor porous body to immobilize the organic light-emitting material 5. Esterification can be carried out by dissolving or dispersing the organic light-emitting material 5 in a solvent to prepare a solution or a dispersion liquid and then immersing the metal oxide semiconductor porous body in the solution or the dispersion liquid. It is to be noted that the light-emitting layer 6 can also be formed by an ink-jet method, a dipping method, a spin coating method, or other well-known application methods. By carrying out such treatment described above, it is possible to form the light-emitting layer 6 containing a metal oxide semiconductor porous body by the surface of which the organic light-emitting material 5 is supported. It is to be noted that a functional group to be introduced into the organic light-emitting material 5 may be, instead of a carboxyl group, a thiocarboxyl group (—CSOH), a dithiocarboxyl group (—CSSH), a sulfo group (—SO$_3$H), a sulfino group (—SO$_2$H), a sulfeno group (—SOH), a phosphono group (—PO(OH)$_2$), a phosphine group (—PH$_2$O$_2$), a mercapto group (—SH), a trimethoxysilyl group (—Si(OCH$_3$)), a trichlorosilyl group (—SiCl$_3$), an amide group (—CONH$_2$), or an amino group (—NH$_2$). Alternatively, such functional groups introduced into the organic light-emitting material 5 may be coordinated with metal elements of the metal oxide semiconductor porous body. The metal oxide semiconductor porous body to the surface of which the organic light-emitting material 5 has been adsorbed may further be subjected to after treatment such as acid or base treatment.

The electron injection electrode 7 and the light-emitting layer 6 containing a metal oxide semiconductor porous body by the surface of which the organic light-emitting material 5 is supported have been described above in detail. Here, the reason why electron injection into an organic material layer such as a light-emitting layer efficiently occurs even when high work function ITO or the like is used for the electron injection electrode 7 will be described. The organic light-emitting material 5 per se has an electron transport property, and has a molecular structure in which a π electron cloud contributing to electron transport widely spreads. As described above, the organic light-emitting material 5 is chemisorbed to the surface of the metal oxide semiconductor porous body, and therefore the spread of π electron cloud of the organic light-emitting material 5 acts on even the surface of the metal oxide semiconductor porous body. As a result, electron injection occurs without being inhibited by the electron injection barrier. Further, the metal oxide semiconductor used is an n-type semiconductor, which also allows efficient electron injection from the electron injection electrode 7.

Further, chemisorption of the organic light-emitting material 5 to the surface of the metal oxide semiconductor porous body is effective at preventing the light-emitting device from being deteriorated due to the separation of the organic material from the surface of the metal oxide semiconductor porous body at the interface between the porous body and the electrode.

The light-emitting device 10 may further include an n-type semiconductor thin layer provided between the electron injection electrode 7 and the light-emitting layer 6 containing a porous body composed of the metal oxide semiconductor fine particles 4. Such a thin layer functions as a hole blocking layer which prevents holes from reaching the electron injection electrode 7 through the interstices of the metal oxide semiconductor porous body without recombining with electrons, thereby enhancing the efficiency of recombination of holes with electrons. Examples of a metal oxide semiconductor to be used for the n-type semiconductor thin layer include the same composite oxides and mixtures of two or more oxides as described with reference to the metal oxide semiconductor fine particles 4.

Next, the hole transport layer 3 will be described. The hole transport layer 3 preferably contains a polymer-based material so as to function as an adhesive layer through which the light-emitting layer 6 and the substrate 1 including the hole injection electrode 2 are bonded together. The hole transport layer 3 is preferably composed of a conductive polymer, and is more preferably composed of a hole-transportable polymeric material with high hole mobility. As such hole-transportable polymeric materials, π-conjugated polymers, σ-conjugated polymers, and polymers each having a low-molecular and hole-transportable molecular structure in the molecular chain (e.g., a polymer into which an arylamine-based compound has been incorporated) can be mentioned. Specific examples of such a polymer include, but are not limited to, polymethacrylamides each having aromatic amine in the side chain thereof (PTPAMMA, PTPDMA) and polyethers each having aromatic amine in the main chain thereof (TPDPES, TPDPEK). Among them, poly-N-vinylcarbazole (PVK) is particularly preferable because it has a very high hole mobility of $10^{-6}$ cm$^2$/Vs. Further, polyethylenedioxythiophene (PEDOT), polystyrenesulfonic acid (PSS), or polymethylphenylsilane (PMPS) can also be preferably used.

Further, a polymer obtained by molecularly dispersing a low-molecular hole-transportable material in a conductive or non-conductive polymer can also be used for the hole transport layer 3. Examples of such a low-molecular hole-transportable material include, but are not limited to, diamine derivatives used by Tang et al., such as TPD and N,N'-bis(α-naphthyl)-N,N'-diphenylbenzidine (NPD), especially a diamine derivative having a structure represented by Q1-G-Q2 which is disclosed in Japanese Patent No. 2037475. It is to be noted that Q1 and Q2 each independently represent a group having a nitrogen atom and at least three carbon chains (at least one of which is an aromatic carbon chain) and G is a cycloalkylene group, an arylene group, an alkylene group, or a linking group composed of a carbon-carbon bond. A specific example of a polymer obtained by molecular dispersion includes one obtained by molecularly dispersing TPD in polycarbonate in high concentrations. The thus obtained polymer has a hole mobility of about $10^{-4}$ cm$^2$/Vs to $10^{-5}$ cm$^2$/Vs.

The hole transport layer 3 more preferably contains, in the vicinity of the interface with the adjacent layers thereof, a cross-linkable or polymerizable material which can be cross-linked or polymerized by the application of light or heat. This makes it possible to more firmly bond the hole injection electrode 2 provided on the substrate 1 and the light-emitting layer 6 provided on the transparent substrate 8 together through the hole transport layer 3 by the application of light or heat.

The hole transport layer 3 can be formed by an ink-jet method, a dipping method, a spin coating method, or other well-known application methods.

Next, the hole injection electrode 2 will be described. The hole injection electrode 2 is not particularly limited, but is preferably composed of a stable metal having a relatively high work function and having a substantially constant reflectivity in a visible light region, such as Al, Ag, Cr, Mo, W, Ta, Nb, Ni, or Pt. More preferably, the hole injection electrode 2 has a black color. As a material for forming a black electrode, a p-type semiconductor material having a hole injection property and absorption in a visible light region is preferably used. Such a black electrode has the effect of preventing external light which has entered a display from being reflected by the surface of the hole injection electrode 2, thereby preventing deterioration of the external light contrast of the display. In general, a display has a circular polarizing plate on a light extraction surface of a light-emitting device. By providing a circular polarizing plate, it is possible to eliminate light reflected by the surface of the electrode provided on the substrate 1 through the use of phase difference, thereby preventing deterioration of external light contrast. However, a circular polarizing plate has an intrinsic transmittance, thus resulting in attenuation of light emitted from the light-emitting device. The transmittance of a circular polarizing plate now usually used is about 50%. Therefore, the efficiency of taking light out of the light-emitting device becomes about ½, which interferes with an increase in brightness of the light-emitting device. On the other hand, since the black electrode according to the present invention has a high absorbance, it has the effect of absorbing external light which has entered the display. Such an effect makes it possible to realize a display excellent in external light contrast without using a circular polarizing plate.

A specific example of a material for forming such a black electrode includes a mixture of CuO and Cu$_2$O. Among non-stoichiometric metal oxides, oxygen excess- or metal deficient-type oxides are generally p-type semiconductors. This is because holes proportional to missing metal ions which provide vacancies in the crystal coexist. In the case of the mixture of CuO and $Cu_2O$, $Cu_2O$ is a metal deficient-type nonstoichiometric oxide. $Cu_2O$ has characteristics of a p-type semiconductor in which holes are carriers, because Cu vacancies exist in the crystal. On the other hand, CuO is a black substance. Therefore, an electrode composed of the mixture of $Cu_2O$ and CuO has characteristics of both of a black electrode and a p-type semiconductor. Other examples of a material for forming a black electrode include a mixture of NiO (which is a p-type semiconductor) and $Ni_2O_3$ (which is a black substance) and a mixture of $Fe_2O_3$ (which is a p-type semiconductor) and FeO or $Fe_3O_4$ (which is a black substance). Examples of a method for forming such an electrode include dry methods such as sputtering and wet methods such as plating or coating of paste. Alternatively, the black electrode may be formed using carbon materials such as carbon black.

Next, a method for manufacturing a light-emitting device 10 will be described with reference to FIG. 2. The light-emitting device 10 is manufactured in the following steps.

(a) A transparent substrate 8 is prepared.

(b) Next, a transparent electron injection electrode 7 is formed on the transparent substrate 8 (see FIG. 2A).

(c) Next, a light-emitting layer 6 containing a metal oxide semiconductor porous body 4, by the surface of which an organic light-emitting material 5 is supported, is formed on the electron injection electrode 7 (see FIG. 2B). It is to be noted that the light-emitting layer 6 is formed in the same manner as described above. In this way, a substrate A is prepared.

(d) At the same time, a substrate 1 is prepared.

(e) Next, a hole injection electrode 2 is formed on the substrate 1 (see FIG. 2C).

(f) Next, a hole transport layer 3 is formed on the hole injection electrode 2 (see FIG. 2D). In this way, a substrate B is prepared.

(g) Next, the substrate A and the substrate B are bonded together so that the light-emitting layer 6 and the hole transport layer 3 can be opposed to each other (see FIG. 2E).

In such a manner as described above, the light-emitting device 10 can be manufactured. However, a method for manufacturing a light-emitting device 10 is not limited to the method described above. According to a conventional method for manufacturing a top emission light-emitting device, the layers are stacked one after another on the substrate 1 on which a thin film transistor is provided. In this case, it is necessary to form the electron injection electrode 7 after the hole transport layer 3 and the light-emitting layer 6 are formed. Therefore, it is impossible to form a good-quality electron injection electrode 7 without deteriorating the organic light-emitting material 5. On the other hand, in a case where a light-emitting device is manufactured in such a manner that the layers are stacked one after another on the transparent substrate 8, it is also impossible to form a thin film transistor without deteriorating the hole transport layer 3. However, according to the method for manufacturing a light-emitting device of the present invention, the light-emitting layer 6 is previously formed in the substrate A, and then the substrate A is bonded to the substrate B including the hole injection electrode 2, thereby enabling a light-emitting device 10 to be easily manufactured.

It is to be noted that the above-described steps are preferably carried out under dry atmosphere, more preferably under dry and low-oxygen atmosphere. This makes it possible to improve the characteristics of the light-emitting device. For example, a decrease in operating voltage and increases in efficiency and lifespan can be achieved.

Next, the mechanism of light emission in the light-emitting device 10 manufactured in such a manner as described above will be described. First, electrons injected from the electron injection electrode 7 are moved through the metal oxide semiconductor porous body of the light-emitting layer 6 to the surface of the metal oxide semiconductor porous body. Further, the electrons are moved to the organic light-emitting material 5 chemisorbed via ester bonds to the surface of the metal oxide semiconductor porous body. On the other hand, holes injected from the hole injection electrode 2 are moved through the hole transport layer 3 to the organic light-emitting material 5, and are then recombined with the electrons in the organic light-emitting material 5 so that light emission occurs.

Embodiment 2

Figure 3:
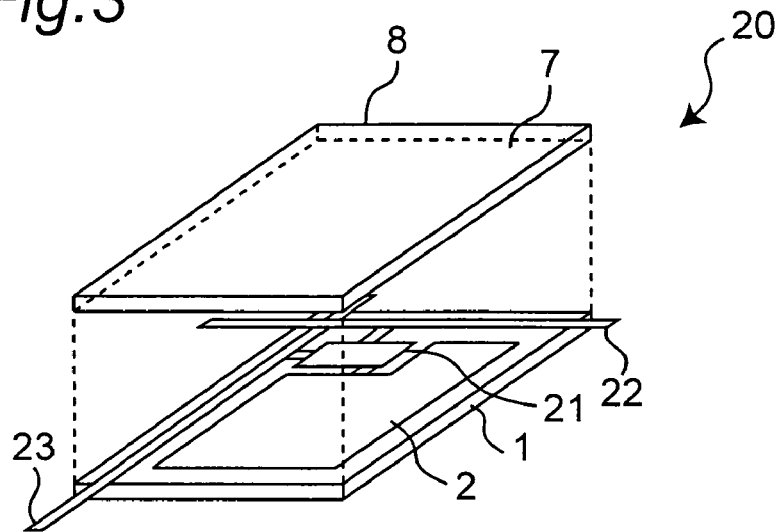
FIG. 3 is a perspective view of a light-emitting device according to an embodiment 2 of the present invention.

A light-emitting device according to an embodiment 2 of the present invention will be described with reference to FIG. 3. FIG. 3 is a perspective view which shows the structure of electrodes of a light-emitting device 20. The light-emitting device 20 further includes a thin film transistor 21 connected to the hole injection electrode 2. To the thin film transistor 21, an x electrode 22 and a y electrode 23 are also connected. The light-emitting device 20 can have a high aperture ratio irrespective of the placement of the thin film transistor 21 on the substrate 1 because light is take out of the light-emitting device from the transparent substrate 8 side. Further, the use of the thin film transistor 21 allows the light-emitting device 20 to have a memory function. As such a thin film transistor 21, a low-temperature polysilicon thin film transistor, or an amorphous silicon thin film transistor, or the like can be used. Alternatively, the thin film transistor 21 may be an organic thin film transistor composed of a thin film containing an organic material.

Embodiment 3

Figure 4:
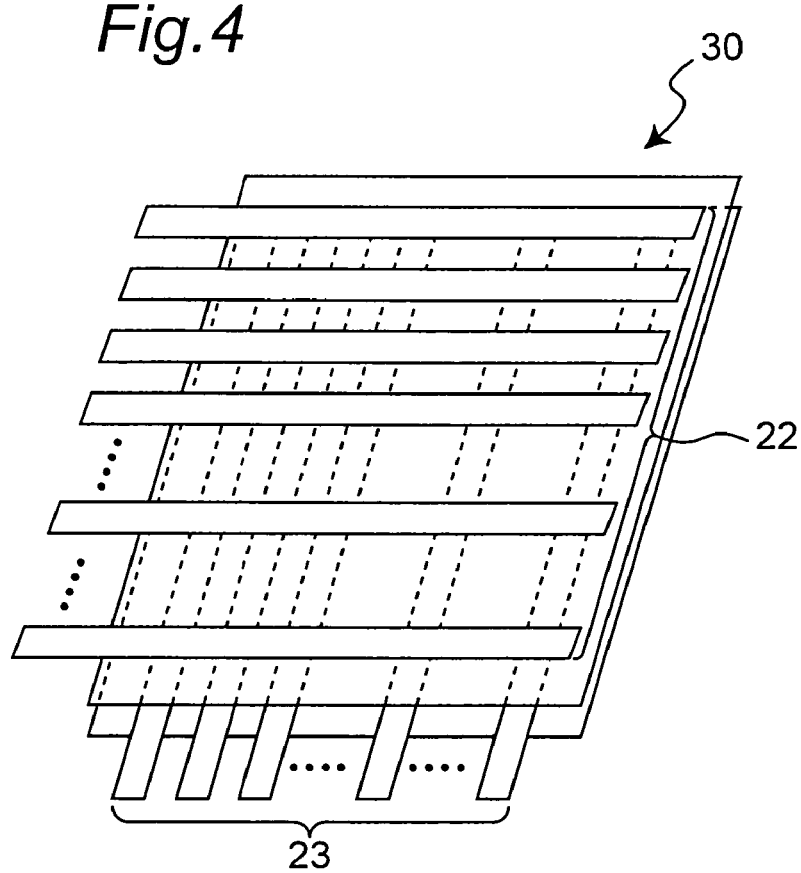
FIG. 4 is a schematic plane view of a display according to an embodiment 3 of the present invention.

A display according to an embodiment 3 of the present invention will be described with reference to FIG. 4. FIG. 4 is a schematic plane view which shows an active matrix of a display 30 composed of a plurality of x electrodes 22 and a plurality of y electrodes 23 intersecting at right angles with the X electrodes 22. The display 30 is an active matrix display having a plurality of thin film transistors. The active matrix display 30 includes a light-emitting device array in which the plurality of light-emitting devices according to the embodiment 2 shown in FIG. 3 are two-dimensionally arrayed, the plurality of x electrodes 22 extending in parallel with each other in a first direction parallel to the surface of the light-emitting device array, and the plurality of y electrodes 23 extending in parallel with each other in a second direction parallel to the surface of the light-emitting device array and orthogonal to the first direction. Each of the thin film transistors 21 of the light-emitting device array is connected to the x electrode 22 and the y electrode 23. The light-emitting device defined by a pair of the x electrode 22 and the y electrode 23 provides one pixel. As described above, in the active matrix display 30, the light-emitting layer 6 constituting the light-emitting device which provides each individual pixel contains a metal oxide semiconductor porous body by the surface of which the organic light-emitting material 5 is supported. Therefore, the surface area of the metal oxide semiconductor porous body by which the organic light-emitting material 5 is supported is increased so that the current density flowing through the organic light-emitting material is decreased, thereby enabling a long-life display to be obtained.

Figure 5:
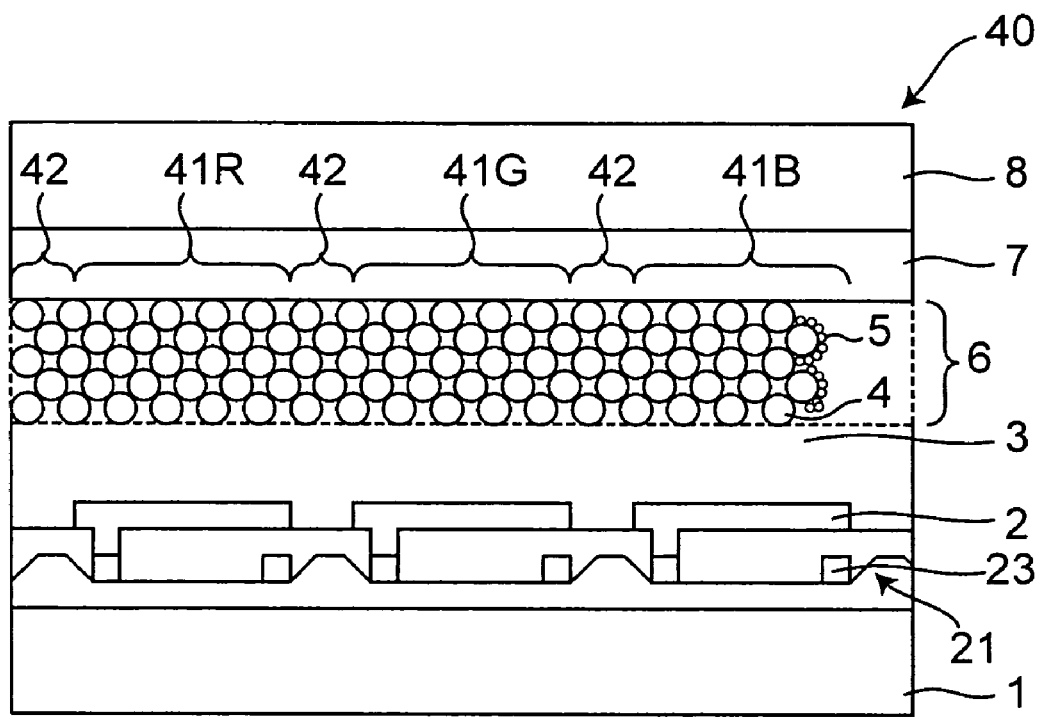
FIG. 5 is a cross-sectional view of the display according to the embodiment 3 of the present invention taken along a plane perpendicular to a light-emitting surface thereof.

Next, a method for manufacturing a display according to the embodiment 3 will be described with reference to FIG. 5. FIG. 5 is a cross-sectional view of a display 40 according to another example of the embodiment 3 having a plurality of pixels 41R, 41G, and 41B different from each other. It is to be noted that the cross-sectional view in FIG. 5 is taken along a plane perpendicular to the y electrode 23 and a light-emitting surface of the display 40. The display 40 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 10 according to the embodiment 1, the plurality of hole injection electrodes 2 are formed, and then the hole transport layer 3 is applied onto the hole injection electrodes 2 by, for example, an ink-jet method. At the same time, in the same manner as described with reference to the light emitting device 10 according to the embodiment 1, the transparent electron injection electrode 7 and the light-emitting layer 6 are formed on the transparent substrate 8 in order of mention, and then the light-emitting layer 6 provided on the transparent substrate 8 and the hole transport layer 3 provided on the substrate 1 are bonded together. In such a manner as described above, the display 40 can be manufactured. However, a method for manufacturing a display 40 is not limited to the method described above. In the case of a color display, the pixels 41R, 41G, and 41B are formed by, for example, an ink-jet method in such a manner that a liquid containing an organic red light-emitting material, a liquid containing an organic green light-emitting material, and a liquid containing an organic blue light-emitting material are applied onto the metal oxide semiconductor porous body respectively in accordance with a pixel pitch, to thereby form the light-emitting layer 6. Prior to this step, a pixel separation region 42 by which adjacent pixels are separated from each other may be formed. The pixel separation region 42 preferably has a black color. Such a pixel separation region 42 can be formed by applying a liquid containing an insulating polymeric material, a black dye, etc. onto the metal oxide semiconductor porous body by, for example, an ink-jet method. By providing such a pixel separation region 42, it is possible to prevent each of the red, green, and blue organic light-emitting materials from entering adjacent pixels when these organic light-emitting materials are applied onto the metal oxide semiconductor porous body. Further, by allowing the pixel separation region 42 to have a black color, it is possible to obtain the same effect as obtained by using the black electrode described above.

Embodiment 4

Figure 6:
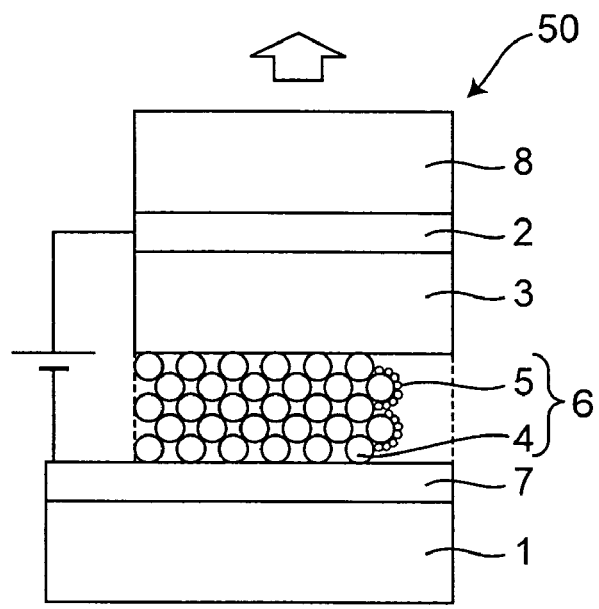
FIG. 6 is a cross-sectional view of a light-emitting device according to an embodiment 4 of the present invention taken along a plane perpendicular to a light-emitting surface thereof.

A light-emitting device according to an embodiment 4 of the present invention will be described with reference to FIG. 6. FIG. 6 is a cross-sectional view of a light-emitting device 50 taken along a plane perpendicular to a light-emitting surface thereof. The light-emitting device 50 is different from the light-emitting device 10 according to the embodiment 1 in that a transparent hole injection electrode 2 is provided on the transparent substrate 8 and the electron injection electrode 7 is provided on the substrate 1 so that the light-emitting device 50 is opposite in polarity relative to the light extraction direction shown by the arrow. Also, the light-emitting device 50 is different from the light-emitting device 10 in that the light-emitting device 50 is manufactured by bonding the light-emitting layer 6 provided on the substrate 1 and the hole injection electrode 2 provided on the transparent substrate 8 together through the hole transport layer 3 having adhesion properties. It is to be noted that other structural components of the light-emitting device 50 are substantially the same as those of the light-emitting device according to the embodiment 1, and therefore the description of these structural components will not be repeated here. In addition to the above-described structural components, the light-emitting device 50 may further include a hole injection layer or a conductive layer provided between the transparent hole injection electrode 2 and the hole transport layer 3. Further, the light-emitting device 50 may include an electron transport layer or a conductive layer provided between the light-emitting layer 6 and the electron injection electrode 7. Furthermore, the light-emitting device 50 may include a low-refractive-index layer provided between the transparent hole injection electrode 2 and the transparent substrate 8. By providing a low-refractive-index layer, it is possible to enhance the efficiency of taking light out of the light-emitting device. The light-emitting device 50 may further include an n-type semiconductor thin layer provided between the light-emitting layer 6 and the electron injection electrode 7. Such a thin layer functions as a hole blocking layer which prevents holes from reaching the electron injection electrode 7 through the interstices of a porous body composed of the metal oxide semiconductor fine particles 4 without recombining with electrons, thereby enhancing the efficiency of recombination of holes with electrons.

Next, each of the structural components of the light-emitting device 50 will be described in detail. It is to be noted that the description of the structural components substantially the same as those of the light-emitting device 10 according to the embodiment 1 will not be repeated here.

First, the hole injection electrode 2 will be described. The hole injection electrode 2 of the light-emitting device 50 is different from that of the light-emitting device 10 according to the embodiment 1 in that the hole injection electrode 2 of the light-emitting device 50 is transparent or semi-transparent. As a material for forming such a hole injection electrode 2, a metal having a high work function is used. Particularly preferred examples of a material for forming the transparent electrode include ITO and $SnO_2$. Other examples of a material for forming the transparent electrode include metals such as Ni, Au, Pt, Pd, Cr, Mo, W, Ta, and Nb and alloys containing two or more of these metals. A conductive resin such as polyaniline can also be used as a material for forming the hole injection electrode 2. However, a material for forming the hole injection electrode 2 is not limited to the materials mentioned above. An ITO film is formed by a film forming method such as a sputtering method, an electron beam evaporation method, or an ion plating method so that the transparency thereof can be increased or the resistivity thereof can be decreased. The thus formed ITO film may be further subjected to surface treatment such as plasma treatment for the purpose of controlling resistivity or work function. The thickness of the hole injection electrode 2 is determined according to a required sheet resistivity and visible light transmittance. However, since the driving current density of the light-emitting device 50 is relatively high, the wiring resistance thereof becomes a problem. Therefore, the ITO film is often made to have a thickness of 100 nm or more to decrease sheet resistivity. It is to be noted that by allowing the light-emitting device 50 to have transparent or semi-transparent substrate 1 and electron injection electrode 7, it is possible to take light out of the light-emitting device 50 from either side thereof.

As described above, according to the embodiment 4 of the present invention, it is possible to use ITO or the like for the transparent hole injection electrode 2, and to use a glass substrate or the like as the transparent substrate 8. As is the case with the light-emitting device 10 according to the embodiment 1, this makes it possible to obtain a high-reliability and long-life light-emitting device.

Next, the electron injection electrode 7 will be described. The electron injection electrode 7 of the light-emitting device 50 is different from that of the light emitting device 10 according to the embodiment 1 in that the electron injection electrode 7 of the light-emitting device 50 is not transparent. As a material for forming such an electron injection electrode 7, an alloy composed of an alkali metal or an alkaline earth metal having a low work function and a low electron injection barrier and a stable metal such as Al or Ag having a relatively high work function can be used. The electron injection electrode 7 formed using such an alloy is stable and facilitates electron injection. Particularly preferred examples of such an alloy include, but are not limited to, MgAg and AlLi. Alternatively, the electron injection electrode 7 may have a laminated structure in which a stable metal film is provided as a protection electrode on a metal thin film which has a low work function and is provided so as to be in contact with an organic layer, or a laminated structure in which a relatively thick Al film is provided on a thin film of LiF or $Al_2O_3$ previously formed. As described above, the electron injection electrode 7 may have various structures depending on a material used.

The electron injection electrode 7 can be formed by a well-known film forming method such as a vacuum evaporation method, a sputtering method, or a screen-printing method.

Next, the light-emitting layer 6 will be described. The light emitting layer 6 of the light-emitting device 50 is different from that of the light-emitting device 10 according to the embodiment 1 in that the light emitting layer 6 of the light-emitting device 50 is provided on the non-transparent electron injection electrode 7. Further, a method for forming a light-emitting layer 6 containing a metal oxide semiconductor porous body according to the embodiment 4 is different from that of the light-emitting device 10 according to the embodiment 1 in that the light-emitting layer 6 of the light-emitting device 50 is applied onto the electron injection electrode 7 provided on the substrate 1. It is to be noted that the constituent materials of the light-emitting layer 6 are substantially the same as those of the light-emitting layer 6 of the light-emitting device 10 according to the embodiment 1, and therefore the description of these constituent materials will not be repeated here.

Next, the hole transport layer 3 will be described. The hole transport layer 3 of the light-emitting device 50 is different from that of the light-emitting device 10 according to the embodiment 1 in that the hole transport layer 3 of the light-emitting device 50 is provided on the transparent hole injection electrode 2. The hole transport layer 3 preferably contains a polymer-based material so as to function as an adhesive layer through which the transparent hole injection electrode 2 and the light-emitting layer 6 are bonded together. It is to be noted that the constituent materials of the hole transport layer 3 are substantially the same as those of the hole transport layer 3 of the light-emitting device 10 according to the embodiment 1, and therefore the description of these constituent materials will not be repeated here.

Next, a method for manufacturing a light-emitting device 50 will be described with reference to FIGS. 7A to 7E. The light-emitting device 50 is manufactured in the following steps.

(a) A transparent substrate 8 is prepared.

Figure 7:
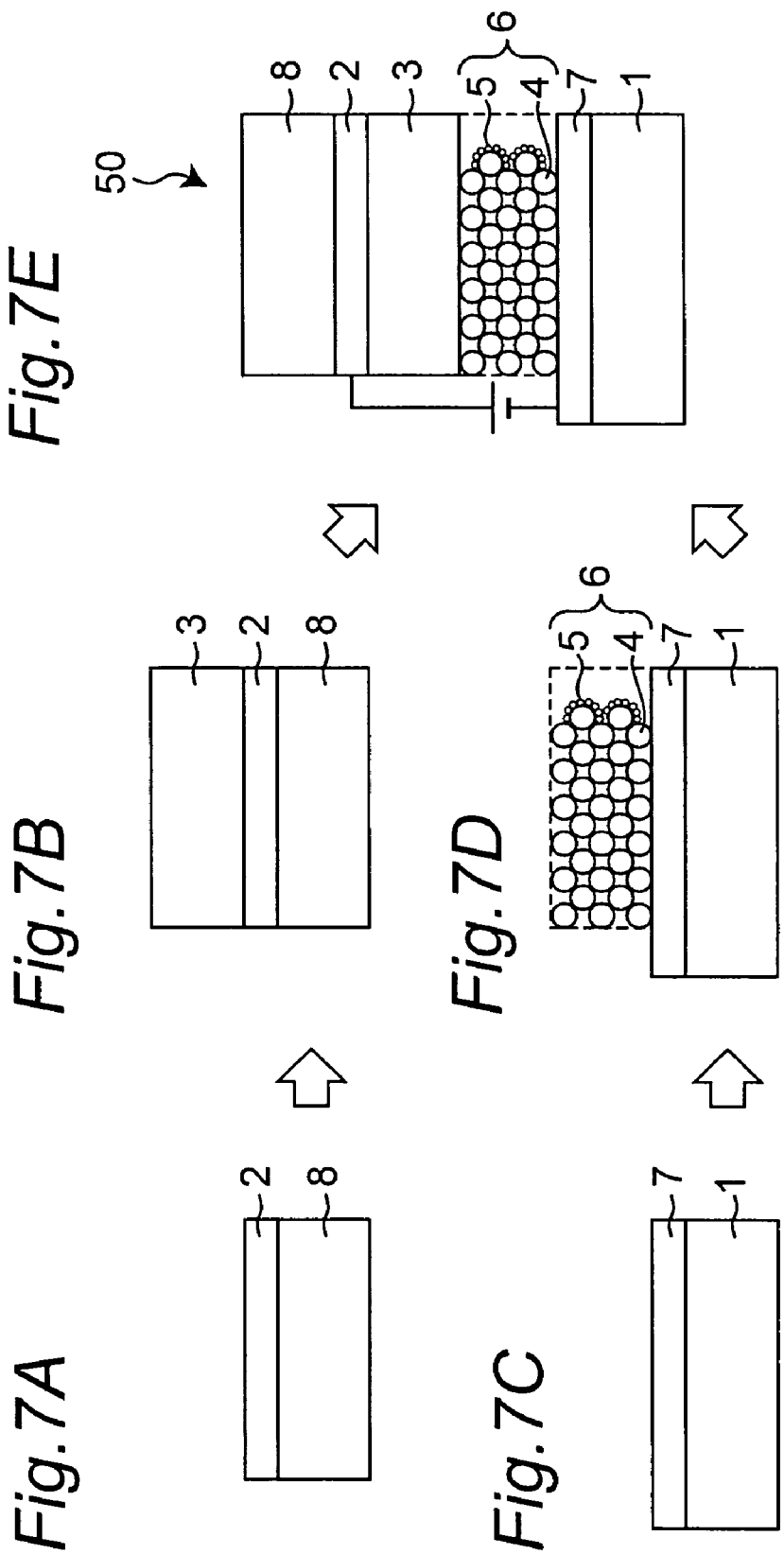
FIGS. 7A to 7E are cross-sectional views which show the steps of manufacturing the light-emitting device according to the embodiment 4 of the present invention.

(b) Next, a transparent hole injection electrode 2 is formed on the transparent substrate 8 (see FIG. 7A).

(c) Next, a hole transport layer 3 is formed on the hole injection electrode 2 (see FIG. 7B). In this way, a substrate C is prepared.

(d) At the same time, a substrate 1 is prepared.

(e) Next, an electron injection electrode 7 is formed on the substrate 1 (see FIG. 7C).

(f) Next, a light-emitting layer 6 containing a metal oxide semiconductor porous body 4, by the surface of which an organic light-emitting material 5 is supported, is formed on the electron injection electrode 7 (see FIG. 7D). It is to be noted that such a light-emitting layer 6 can be formed in the same manner as described above. In this way, a substrate D is prepared.

(g) Next, the substrate C and the substrate D are bonded together so that the hole transport layer 3 and the light-emitting layer 6 can be opposed to each other (see FIG. 7E).

In such a manner as described above, the light-emitting device 50 can be manufactured. However, a method for manufacturing a light-emitting device 50 is not limited to the method described above.

It is to be noted that the above-described steps are preferably carried out under dry atmosphere, more preferably under dry and low-oxygen atmosphere. This makes it possible to improve the characteristics of the light-emitting device. For example, a decrease in operating voltage and increases in efficiency and lifespan can be achieved.

Embodiment 5

Figure 8:
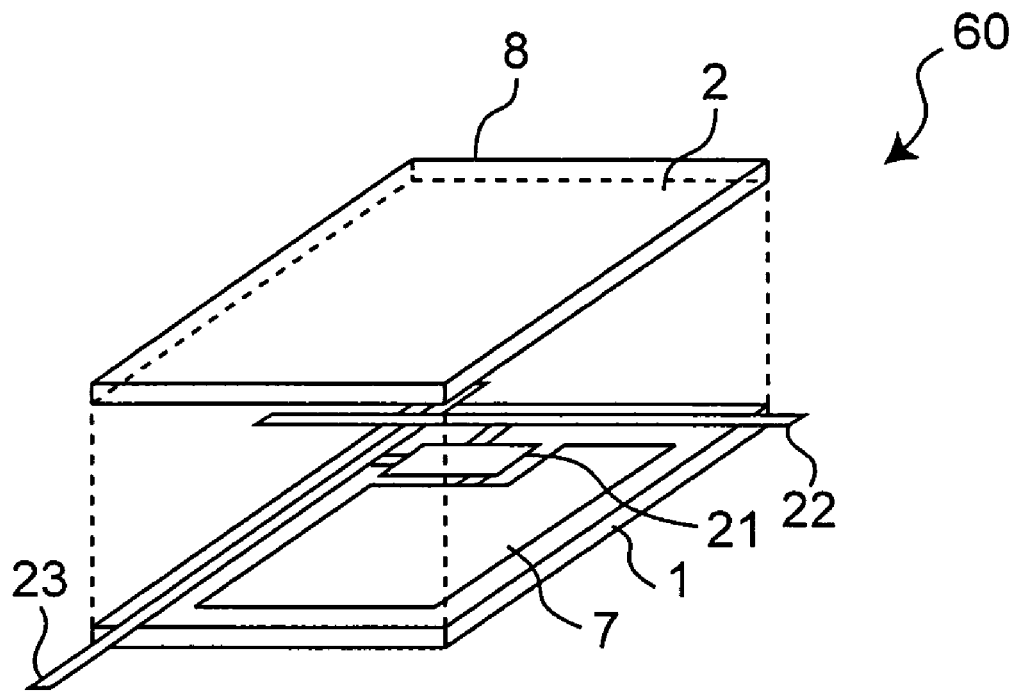
FIG. 8 is a perspective view of a light-emitting device according to an embodiment 5 of the present invention.

A light-emitting device according to an embodiment 5 of the present invention will be described with reference to FIG. 8. FIG. 8 is a perspective view which shows the structure of electrodes of a light-emitting device 60. The light-emitting device 60 is different from the light-emitting device 20 according to the embodiment 2 in that a thin film transistor 21 of the light-emitting device 60 is connected to the electron injection electrode 7 of the light-emitting device 50 according to the embodiment 4. However, the structure of the light-emitting device 60 is substantially the same as that of the light-emitting device 20, and therefore the description of the light-emitting device 60 will not be repeated here.

Embodiment 6

A display according to an embodiment 6 of the present invention will be described with reference to FIG. 4. As described above, FIG. 4 is a schematic plane view which shows an active matrix of the display 30 according to the embodiment 3 composed of the plurality of x electrodes 22 and the plurality of y electrodes 23 intersecting at right angles with the x electrodes 22. The display 30 is an active matrix display having a plurality of thin film transistors. The display according to the embodiment 6 is different from the display 30 according to the embodiment 3 in that the display according to the embodiment 6 includes a light-emitting device array in which the plurality of light-emitting devices 60 according to the embodiment 5 are two-dimensionally arrayed. However, the structure of the display according to the embodiment 6 is substantially the same as that of the display 30, and therefore the description of the display according to the embodiment 6 will not be repeated here.

Figure 9:
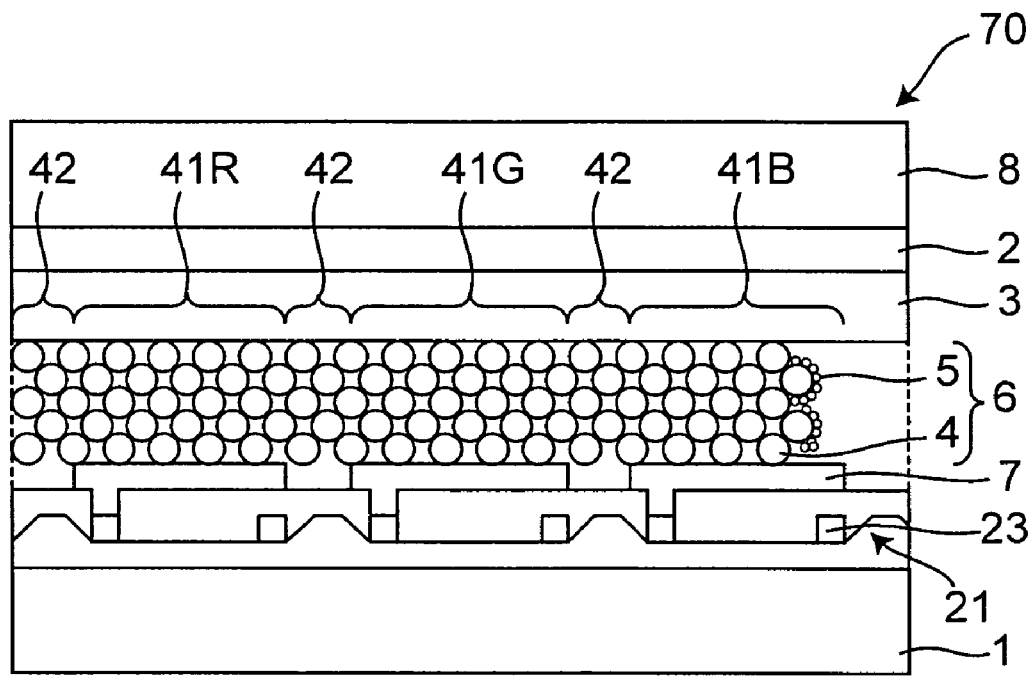
FIG. 9 is a cross-sectional view of a display according to an embodiment 6 of the present invention taken along a plane perpendicular to a light-emitting surface thereof.

Next, a method for manufacturing a display according to the embodiment 6 will be described with reference to FIG. 9. FIG. 9 is a cross-sectional view of a display 70 according to another example of the embodiment 6 having a plurality of pixels 41R, 41G, and 41B different from each other. It is to be noted that the cross-sectional view in FIG. 9 is taken along a plane perpendicular to the y electrode 23 and a light-emitting surface of the display 70. The display 70 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 50 according to the embodiment 4, the plurality of electron injection electrodes 7 and the light-emitting layer 6 are formed in order of mention. At the same time, in the same manner as described with reference to the light-emitting device 50 according to the embodiment 4, the transparent hole injection electrode 2 is formed on the transparent substrate 8, and then the hole transport layer 3 is applied on the hole injection electrode 2 by, for example, an ink-jet method. Thereafter, the light-emitting layer 6 provided on the substrate 1 and the hole transport layer 3 provided on the transparent substrate 8 are bonded together so that they can be opposed to each other. In such a manner as described above, the display 70 can be manufactured. However, a method for manufacturing a display 70 is not limited to the method described above. In the case of a color display, the pixels 41R, 41G, and 41B are formed by, for example, an ink-jet method in such a manner that a liquid containing an organic red light-emitting material, a liquid containing an organic green light-emitting material, and a liquid containing an organic blue light-emitting material are applied onto the metal oxide semiconductor porous body respectively in accordance with a pixel pitch, to thereby form the light-emitting layer 6. Prior to this step, a pixel separation region 42 by which adjacent pixels are separated from each other may be formed. Such a pixel separation region 42 can be formed in the same manner as in the embodiment 3.

As described above, since the light-emitting layer 6 of the display 70 is provided on the substrate 1, alignment in accordance with a pixel pitch is carried out only on the substrate 1 side. Therefore, each of the transparent hole injection electrode 2 and the hole transport layer 3 can be provided in the form of a solid thin film on the transparent substrate 8. This makes it possible to reduce the accuracy needed to carry out alignment when the hole transport layer 3 and the light-emitting layer 6 are bonded together, thereby simplifying the manufacturing processes.

Embodiment 7

Figure 10:
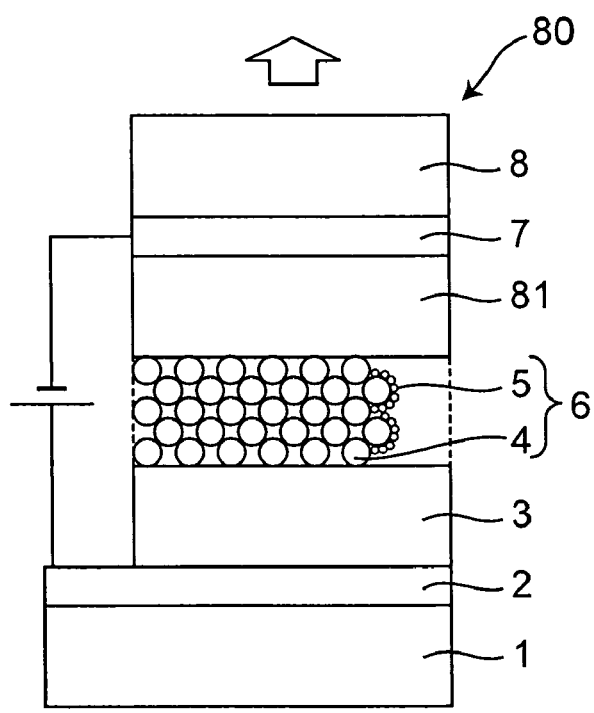
FIG. 10 is a cross-sectional view of a light-emitting device according to an embodiment 7 of the present invention taken along a plane perpendicular to a light-emitting surface thereof.

A light-emitting device according to an embodiment 7 of the present invention will be described with reference to FIG. 10. FIG. 10 is a cross-sectional view of a light-emitting device 80 taken along a plane perpendicular to a light-emitting surface thereof. The light-emitting device 80 is different from the light-emitting device 10 according to the embodiment 1 in that the light-emitting device 80 further includes an electron transport layer 81 provided between the light-emitting layer 6 and the transparent electron injection electrode 7, and that the light-emitting layer 6 provided on the substrate 1 and the electron injection electrode 7 provided on the transparent substrate 8 are bonded together through the electron transport layer 81 having adhesion properties. In this case, it is not necessary for the hole transport layer 3 to have adhesion properties. It is to be noted that other structural components of the light-emitting device 80 are substantially the same as those of the light-emitting device 10 according to the embodiment 1, and therefore the description of these structural components will not be repeated here. In addition to the structural components described above, the light-emitting device 80 may further include a hole injection layer or a conductive layer provided between the hole injection electrode 2 and the hole transport layer 3. Further, the light-emitting device 80 may include a low-refractive-index layer provided between the electron injection electrode 7 and the transparent substrate 8. By providing a low-refractive-index layer, it is possible to enhance the efficiency of taking light out of the light-emitting device. Furthermore, the hole injection electrode 2 may be a black electrode. By providing a black hole injection electrode, it is possible to improve external light contrast.

Next, each of the structural components of the light-emitting device 80 will be described in detail. It is to be noted that the description of the structural components substantially the same as those of the light-emitting device 10 according to the embodiment 1 will not be repeated here.

First, the electron transport layer 81 will be described. The electron transport layer 81 preferably contains a polymer-based material so as to function as an adhesive layer through which the light-emitting layer 6 and the electron injection electrode 7 are bonded together. The electron transport layer 81 is preferably composed of a conductive polymer, and is more preferably composed of an electron-transportable polymeric material having a high electron mobility. Particularly preferred examples of an electron-transportable polymer-based material include, but are not limited to, poly-[2-(6-cyano-6-methylheptyloxy)-1,4-phenylene] (CN-PPV) and polyquinoxaline. A polymer having a molecular chain containing a low-molecular and electron-transportable molecular structure may also be used for the electron transport layer 81. Further, a polymer obtained by molecularly dispersing a low-molecular electron-transportable material in a conductive or non-conductive polymer may also be used for the electron transport layer 81. Examples of a low-molecular electron-transportable material include oxadiazole derivatives, triazole derivatives, styrylbenzene derivatives, silole derivatives, 1,10-phenanthroline derivatives, quinolinol-based metal complexes, and dimers and trimers thereof. Particularly preferred examples of a low-molecular electron-transportable material include, but are not limited to, 2-(4-biphenyl)-5-(4-tert-butylphenyl)-1,3,4-oxadiazole (PBD), 3-(4-biphenyl)-4-phenyl-5-(4-tert-butylphenyl)-1,2,4-triazole (TAZ), 2,9-dimethyl-4,7-diphenyl-1,10-phenanthroline (BCP), and Alq3.

More preferably, the electron transport layer 81 contains, in the vicinity of the interface with adjacent layers thereof, a cross-linkable or polymerizable material which can be cross-linked or polymerized by the application of light or heat. This makes it possible to more firmly bond the light-emitting layer 6 provided on the substrate 1 and the electron injection electrode 7 provided on the transparent substrate 8 together through the electron transport layer 81 by the application of light or heat.

The electron transport layer 81 can be formed by an ink-jet method, a dipping method, a spin coating method, or other well-known application methods.

Next, a method for manufacturing a light-emitting device 80 will be described with reference to FIGS. 11A to 11F. The light-emitting device 80 is manufactured in the following steps.

(a) A transparent substrate 8 is prepared.

Figure 11:
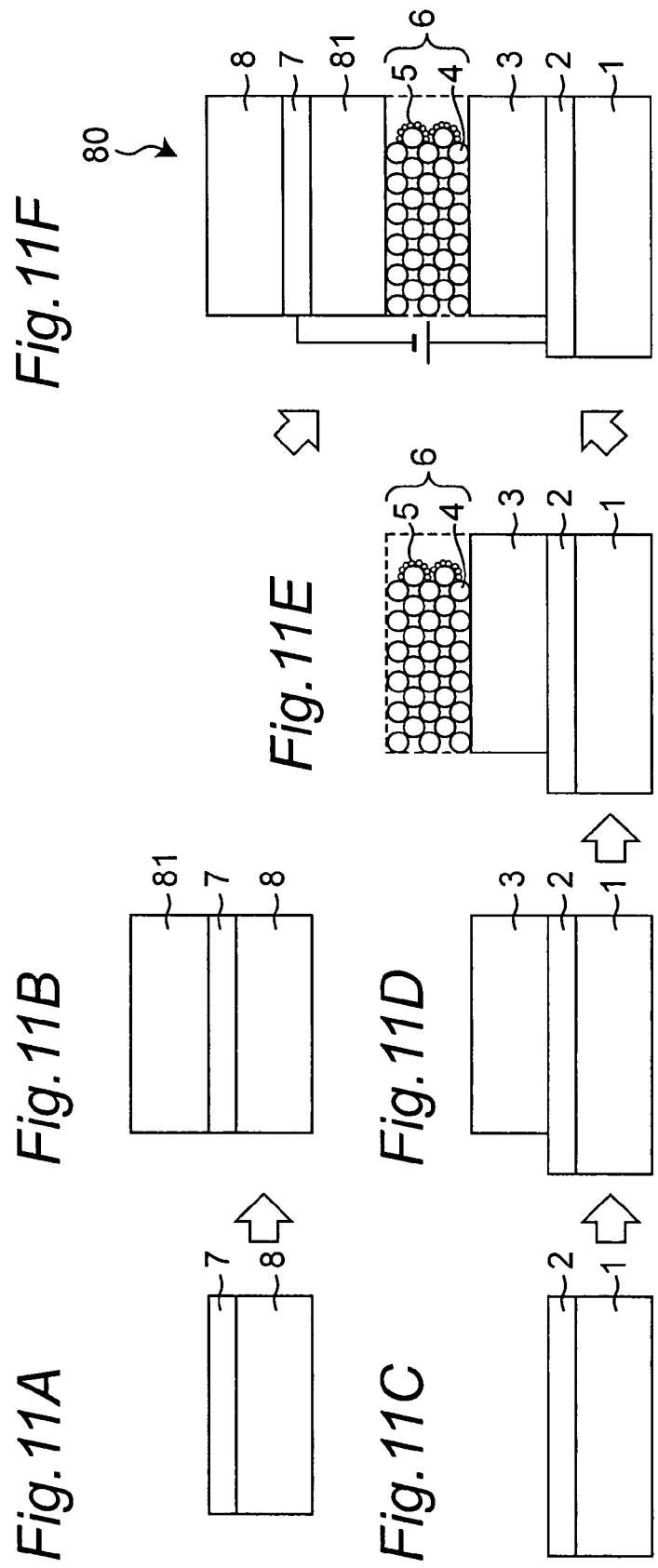
FIGS. 11A to 11F are cross-sectional views which show the steps of manufacturing the light-emitting device according to the embodiment 7 of the present invention.

(b) Next, a transparent electron injection electrode 7 is formed on the transparent substrate 8 (see FIG. 11A).

(c) Next, an electron transport layer 81 is formed on the electron injection electrode 7 (see FIG. 11B). In this way, a substrate E is prepared.

(d) At the same time, a substrate 1 is prepared.

(e) Next, a hole injection electrode 2 is formed on the substrate 1 (see FIG. 11C).

(f) Next, a hole transport layer 3 is formed on the hole injection electrode 2 (see FIG. 11D).

(g) Next, a light-emitting layer 6 containing a metal oxide semiconductor porous body 4, by the surface of which an organic light-emitting material 5 is supported, is formed on the hole transport layer 3 (see FIG. 11E). It is to be noted that such a light-emitting layer 6 can be formed in the same manner as described above. In this way, a substrate F is prepared.

(h) Next, the substrate E and the substrate F are bonded together so that the electron transport layer 81 and the light-emitting layer 6 can be opposed to each other (see FIG. 11F).

In such a manner as described above, the light-emitting device 80 can be manufactured. However, a method for manufacturing a light-emitting device 80 is not limited to the method described above.

It is to be noted that the above-described steps are preferably carried out under dry atmosphere, more preferably under dry and low-oxygen atmosphere. This makes it possible to improve the characteristics of the light-emitting device 80. For example, a decrease in operating voltage and increases in efficiency and lifespan can be achieved.

Embodiment 8

A light-emitting device according to an embodiment 8 of the present invention will be described with reference to FIG. 3. As described above, FIG. 3 is a perspective view which shows the structure of electrodes of the light-emitting device 20 according to the embodiment 2. The structure of the light-emitting device according to the embodiment 8 is substantially the same as that of the light-emitting device 20 according to the embodiment 2 except that a thin film transistor 21 of the light-emitting device according to the embodiment 8 is connected to the hole injection electrode 2 of the light-emitting device 80 according to the embodiment 7, and therefore a detailed description of the light-emitting device according to the embodiment 8 will not be repeated here.

Embodiment 9

A display according to an embodiment 9 of the present invention will be described with reference to FIG. 4. As described above, FIG. 4 is a schematic plane view which shows an active matrix of the display 30 according to the embodiment 3 composed of the plurality of x electrodes 22 and the plurality of y electrodes 23 intersecting at right angles with the x electrodes 22. The display 30 is an active matrix display having a plurality of thin film transistors. The structure of the display according to the embodiment 9 is substantially the same as that of the display 30 according to the embodiment 3 except that the display according to the embodiment 9 includes a light-emitting device array in which the plurality of light-emitting devices according to the embodiment 8 are two-dimensionally arrayed. Therefore, the description of the display according to the embodiment 9 will not be repeated here.

Figure 12:
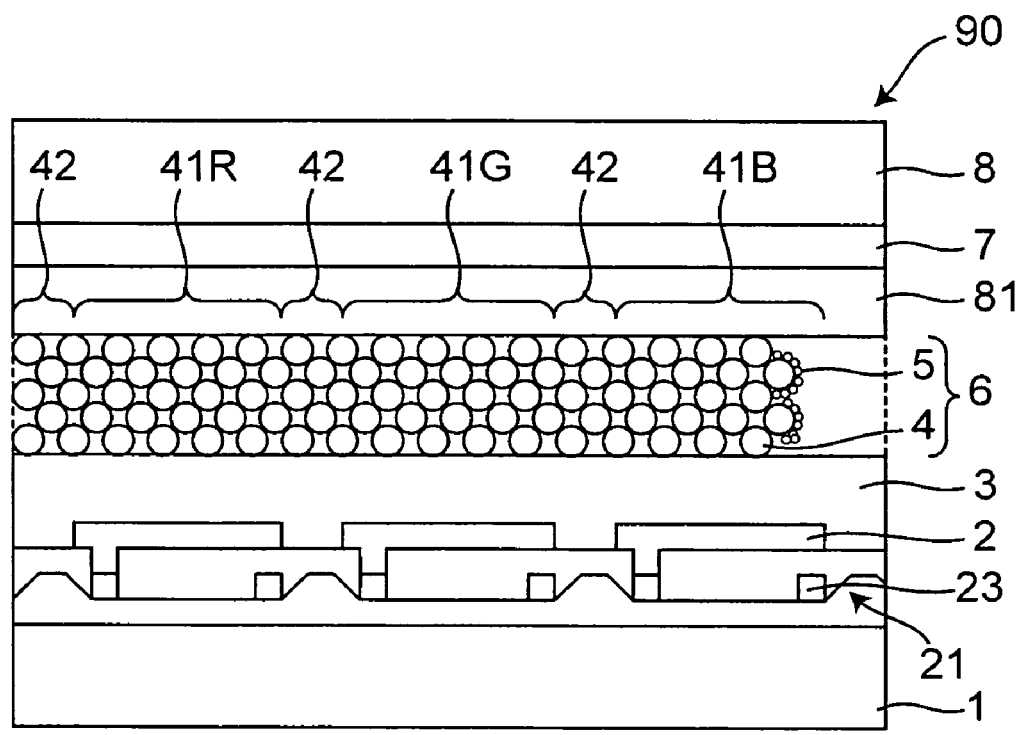
FIG. 12 is a cross-sectional view of a display according to an embodiment 9 of the present invention taken along a plane perpendicular to a light-emitting surface thereof.

Next, a method for manufacturing a display according to the embodiment 9 will be described with reference to FIG. 12. FIG. 12 is a cross-sectional view of a display 90 according to another example of the embodiment 9 having a plurality of pixels 41R, 41G, and 41B different from each other. It is to be noted that the cross-sectional view in FIG. 12 is taken along a plane perpendicular to the y electrode 23 and a light-emitting surface of the display 90. The display 90 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 80 according to the embodiment 7, the plurality of hole injection electrodes 2, the hole transport layer 3, and the light-emitting layer 6 are formed in order of mention. At the same time, in the same manner as described with reference to the light-emitting device 80 according to the embodiment 7, the transparent electron injection electrode 7 is formed on the transparent substrate 8, and the electron transport layer 81 is applied onto the electron injection electrode 7 by, for example, an ink-jet method. Thereafter, the light-emitting layer 6 provided on the substrate 1 and the electron transport layer 81 provided on the transparent substrate 8 are bonded together. In such a manner as described above, the display 90 can be manufactured. However, a method for manufacturing a display 90 is not limited to the method described above. In the case of a color display, the pixels 41R, 41G, and 41B are formed by, for example, an inkjet method in such a manner that a liquid containing an organic red light-emitting material, a liquid containing an organic green light-emitting material, and a liquid containing an organic blue light-emitting material are applied onto the metal oxide semiconductor porous body respectively in accordance with a pixel pitch, to thereby form the light-emitting layer 6. Prior to this step, a pixel separation region 42 by which adjacent pixels are separated from each other may be formed. Such a pixel separation region 42 can be formed in the same manner as in the embodiment 3.

As is the case with the display 90 according to the embodiment 6, alignment in accordance with a pixel pitch is carried out only on the substrate 1 side. Therefore, each of the transparent electron injection electrode 7 and the electron transport layer 81 can be provided in the form of a solid thin film on the transparent substrate 8. This makes it possible to reduce the accuracy needed to carry out alignment when the electron transport layer 81 and the light-emitting layer 6 are bonded together, thereby simplifying the manufacturing processes.

Embodiment 10

Figure 13:
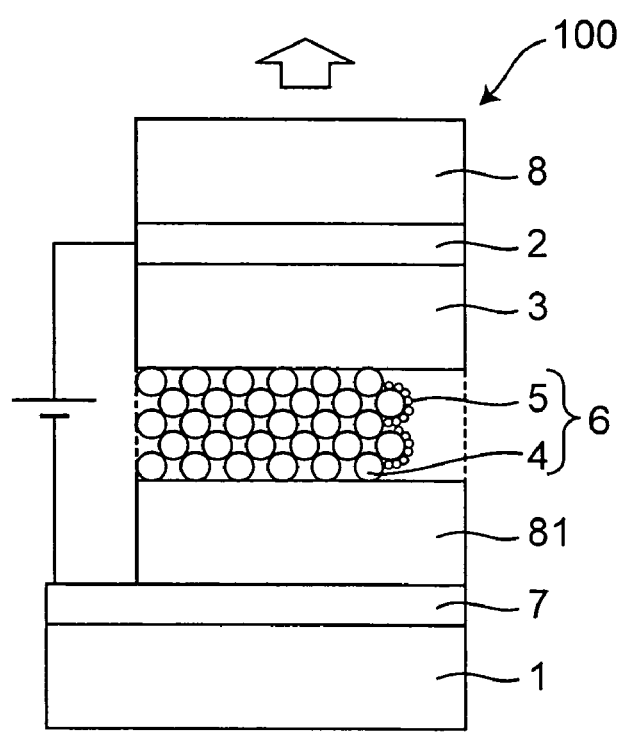
FIG. 13 is a cross-sectional view of a light-emitting device according to an embodiment 10 of the present invention taken along a plane perpendicular to a light-emitting surface thereof.

A light-emitting device according to an embodiment 10 of the present invention will be described with reference to FIG. 13. FIG. 13 is a cross-sectional view of a light-emitting device 100 taken along a plane perpendicular to a light-emitting surface thereof. The light-emitting device 100 is different from the light-emitting device 50 according to the embodiment 4 in that the light-emitting device 100 further includes an electron transport layer 81 provided between the light-emitting layer 6 and the electron injection electrode 7, and that the electron injection electrode 7 provided on the substrate 1 and the light-emitting layer 6 provided on the transparent substrate 8 are bonded together through the electron transport layer 81 having adhesion properties. In this case, it is not necessary for the hole transport layer 3 to have adhesion properties. It is to be noted that other structural components of the light-emitting device 100 are substantially the same as those of the light-emitting device 50 according to the embodiment 4, and therefore the description of these structural components will not be repeated here. In addition to the above-described structural components, the light-emitting device 100 may further include a hole injection layer or a conductive layer provided between the hole injection electrode 2 and the hole transport layer 3. Further, the light-emitting device 100 may include a low-refractive-index layer provided between the hole injection electrode 2 and the transparent substrate 8. By providing a low-refractive-index layer, it is possible to enhance the efficiency of taking light out of the light-emitting device.

Next, each of the structural components of the light-emitting device 100 will be described. It is to be noted that the description of the structural components substantially the same as those of the light-emitting device 50 according to the embodiment 4 will not be repeated here. Further, the constituent materials of the electron transport layer 81 of the light-emitting device 100 are substantially the same as those of the electron transport layer 81 of the light-emitting device 80 according to the embodiment 7, and therefore the description of the constituent materials of the electron transport layer 81 will not be repeated here.

Next, a method for manufacturing a light-emitting device 100 will be described with reference to FIGS. 14A to 14F. The light-emitting device 100 is manufactured in the following steps.

(a) A transparent substrate 8 is prepared.

(b) Next, a transparent hole injection electrode 2 is formed on the transparent substrate 8 (see FIG. 14A).

(c) Next, a hole transport layer 3 is formed on the hole injection electrode 2 (see FIG. 14B).

(d) Next, a light-emitting layer 6 containing a metal oxide semiconductor porous body 4, by the surface of which an organic light-emitting material 5 is supported, is formed on the hole transport layer 3 (see FIG. 14C). It is to be noted that such a light-emitting layer 6 can be formed in the same manner as described above. In this way, a substrate G is prepared.

(e) At the same time, a substrate 1 is prepared.

(f) Next, an electron injection electrode 7 is formed on the substrate 1 (see FIG. 14D).

(g) Next, an electron transport layer 81 is formed on the electron injection electrode 7 (see FIG. 14E). In this way, a substrate H is prepared.

(h) The substrate G and the substrate H are bonded together so that the light-emitting layer 6 and the electron transport layer 81 can be opposed to each other (see FIG. 14F).

In such a manner as described above, the light-emitting device 100 can be manufactured. However, a method for manufacturing a light-emitting device 100 is not limited to the method described above.

It is to be noted that the above-described steps are preferably carried out under dry atmosphere, more preferably under dry and low-oxygen atmosphere. This makes it possible to improve the characteristics of the light-emitting device. For example, a decrease in operating voltage and increases in efficiency and lifespan can be achieved.

Embodiment 11

A light-emitting device according to an embodiment 11 of the present invention will be described with reference to FIG. 8. As described above, FIG. 8 is a perspective view which shows the structure of electrodes of the light-emitting device 60 according to the embodiment 5. The structure of the light-emitting device according to the embodiment 11 is substantially the same as that of the light-emitting device 60 according to the embodiment 5 except that a thin film transistor 21 of the light-emitting device according to the embodiment 11 is connected to the electron injection electrode 7 of the light-emitting device 100 according to the embodiment 10, and therefore a detailed description of the light-emitting device according to the embodiment 11 will not be repeated here.

Embodiment 12

A display according to an embodiment 12 of the present invention will be described with reference to FIG. 4. As described above, FIG. 4 is a schematic plane view which shows an active matrix of the display 30 according to the embodiment 3 composed of the plurality of x electrodes 22 and the plurality of y electrodes 23 intersecting at right angles with the x electrodes 22. The display 30 is an active matrix display having a plurality of thin film transistors. The display according to the embodiment 12 is different from the display 30 according to the embodiment 3 in that the display according to the embodiment 12 includes a light-emitting device array in which the plurality of light-emitting devices according to the embodiment 11 are two-dimensionally arrayed. However, the structure of the display according to the embodiment 12 is substantially the same as that of the display 30 according to the embodiment 3, and therefore the description of the display according to the embodiment 12 will not be repeated here.

Figure 15:
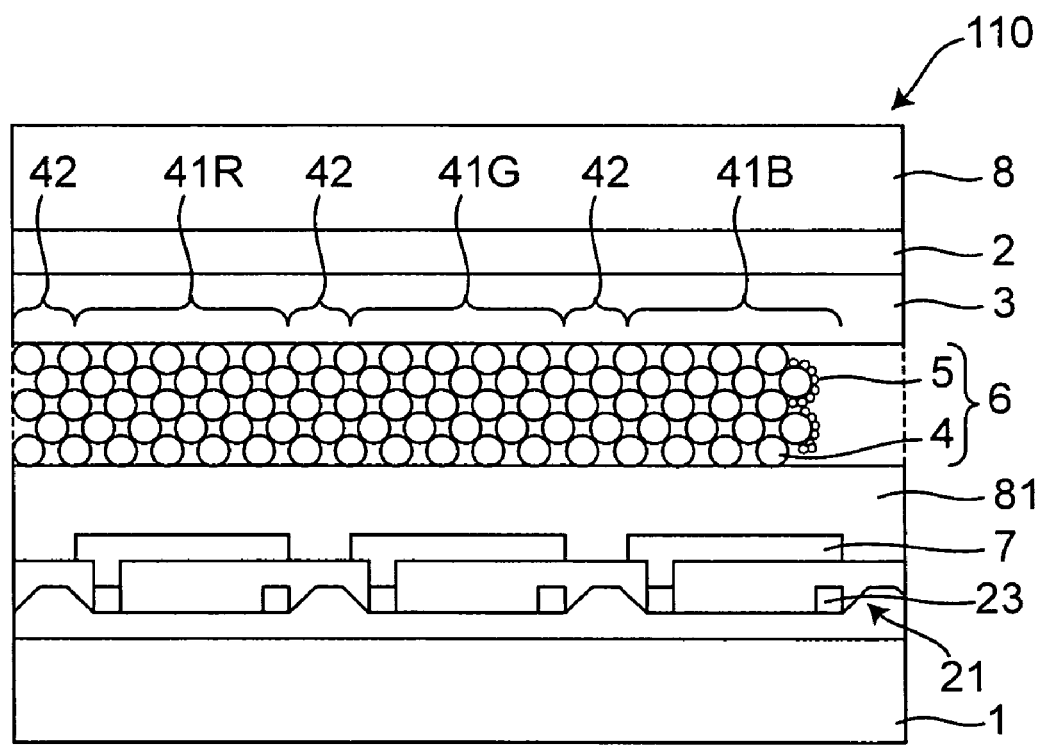
FIG. 15 is a cross-sectional view of a display according to an embodiment 12 of the present invention taken along a plane perpendicular to a light-emitting surface thereof.

Next, a method for manufacturing a display according to the embodiment 12 will be described with reference to FIG. 15. FIG. 15 is a cross-sectional view of a display 110 according to another example of the embodiment 12 having a plurality of pixels 41R, 41G, and 41B different from each other. It is to be noted that the cross-sectional view in FIG. 15 is taken along a plane perpendicular to the y electrode 23 and a light-emitting surface of the display 110. The display 110 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 100 according to the embodiment 10, the plurality of electron injection electrodes 7 are formed, and then the electron transport layer 81 is applied onto the electron injection electrodes 7 by, for example, an ink-jet method. At the same time, in the same manner as described with reference to the light-emitting device 100 according to the embodiment 10, the transparent hole injection electrode 2, the hole transport layer 3, and the light-emitting layer 6 are formed on the transparent substrate 8 in order of mention. Thereafter, the light-emitting layer 6 provided on the transparent substrate 8 and the electron transport layer 81 provided on the substrate 1 are bonded together. In such a manner as described above, the display 110 can be manufactured. However, a method for manufacturing a display 110 is not limited to the method described above. In the case of a color display, the pixels 41R, 41G, and 41B are formed by, for example, an ink-jet method in such a manner that a liquid containing an organic red light-emitting material, a liquid containing an organic green light-emitting material, and a liquid containing an organic blue light-emitting material are applied onto the metal oxide semiconductor porous body respectively in accordance with a pixel pitch, to thereby form the light-emitting layer 6. Prior to this step, a pixel separation region 42 by which adjacent pixels are separated from each other may be formed. Such a pixel separation region 42 can be formed in the same manner as in the embodiment 3.

Embodiment 13

Figure 16:
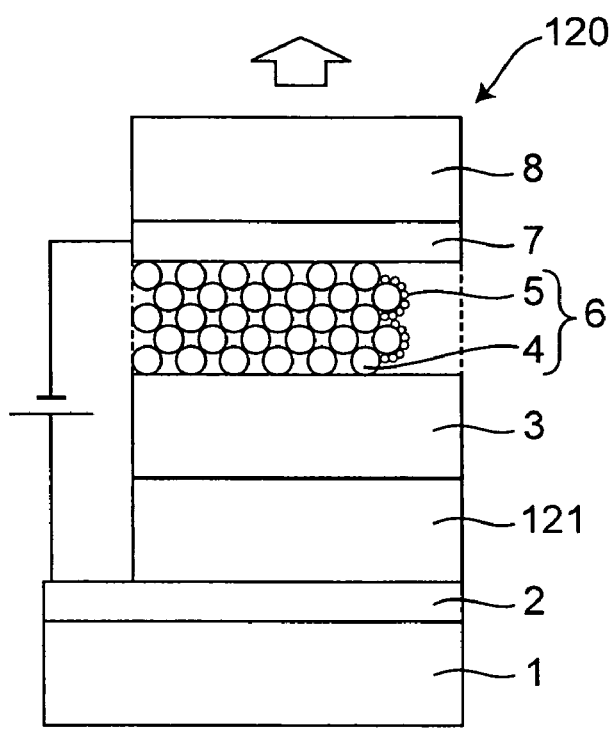
FIG. 16 is a cross-sectional view of a light-emitting device according to an embodiment 13 of the present invention taken along a plane perpendicular to a light-emitting surface thereof.

A light-emitting device according to an embodiment 13 of the present invention will be described with reference to FIG. 16. FIG. 16 is a cross-sectional view of a light-emitting device 120 taken along a plane perpendicular to a light-emitting surface thereof. The light-emitting device 120 is different from the light-emitting device 10 according to the embodiment 1 in that the light-emitting device 120 further includes a hole injection layer 121 provided between the hole injection electrode 2 and the hole transport layer 3, and that the hole injection electrode 2 provided on the substrate 1 and the hole transport layer 3 provided on the transparent substrate 8 are bonded together through the hole injection layer 121 having adhesion properties. In this case, it is not necessary for the hole transport layer 3 to have adhesion properties. It is to be noted that other structural components of the light-emitting device 120 are substantially the same as those of the light-emitting device 10 according to the embodiment 1, and therefore the description of these structural components will not be repeated here. In addition to the above-described structural components, the light-emitting device 120 may further include an electron transport layer or a conductive layer provided between the electron injection electrode 7 and the light-emitting layer 6. Further, the light-emitting device 120 may include a low-refractive-index layer provided between the electron injection electrode 7 and the transparent substrate 8. By providing a low-refractive-index layer, it is possible to enhance the efficiency of taking light out of the light-emitting device. Furthermore, the light-emitting device 120 may include an n-type semiconductor thin layer provided between the electron injection electrode 7 and the light-emitting layer 6 containing a porous body composed of the metal oxide semiconductor fine particles 4. Such a thin layer functions as a hole blocking layer which prevents holes from reaching the electron injection electrode 7 through the interstices of a porous body composed of the metal oxide semiconductor fine particles 4 without recombining with electrons, thereby enhancing the efficiency of recombination of holes with electrons. Moreover, the hole injection electrode 2 may be a black electrode. By providing a black hole injection electrode, it is possible to improve external light contrast.

Next, each of the structural components of the light-emitting device 120 will be described in detail. It is to be noted that the description of the structural components substantially the same as those of the light-emitting device 10 according to the embodiment 1 will not be repeated here.

First, the hole injection layer 121 will be described. The hole injection layer 121 preferably contains a polymer-based material so as to function as an adhesive layer through which the hole injection electrode 2 provided on the substrate 1 and the hole transport layer 3 provided on the transparent substrate 8 are bonded together. More preferably, such a polymeric material provides no potential barrier between the highest occupied molecular orbital (HOMO) of the hole injection layer 121 and the work function of the hole injection electrode 2 to facilitate hole injection. Particularly preferred examples of such a polymeric material include, but are not limited to, polyaniline derivatives. A composite layer obtained by doping a polymeric material with an electron acceptor to improve conductivity also has the same effect as described above. Such a composite layer is not particularly limited, but one obtained by doping polyethylenedioxythiophene (PEDOT) with polystyrenesulfonic acid (PSS) can be mentioned by way of example. Further, a polymer obtained by molecularly dispersing a low-molecular hole injection layer material in a conductive or non-conductive polymer can also be used for the hole injection layer 121. Examples of such a low-molecular hole injection layer material include, but are not limited to, copper phthalocyanine (CuPc) having a low ionization potential and high-molecular weight arylamine referred to as starburst amine.

The hole injection layer 121 more preferably contains, in the vicinity of the interface with adjacent layers thereof, a cross-linkable or polymerizable material which can be cross-linked or polymerized by the application of light or heat. This makes it possible to more firmly bond the hole injection electrode 2 provided on the substrate 1 and the hole transport layer 3 provided on the transparent substrate 8 together through the hole injection layer 121 by the application of light or heat.

The hole injection layer 121 can be formed by an inkjet method, a dipping method, a spin coating method, or other well-known application methods.

Next, a method for manufacturing a light-emitting device 120 will be described with reference to FIGS. 17A to 17F. The light-emitting device 120 is manufactured in the following steps.

(a) A transparent substrate 8 is prepared.

(b) Next, a transparent electron injection electrode 7 is formed on the transparent substrate 8 (see FIG. 17A).

(c) Next, a light-emitting layer 6 containing a metal oxide semiconductor porous body 4, by the surface of which an organic light-emitting material 5 is supported, is formed on the electron injection electrode 7 (see FIG. 17B). It is to be noted that such a light-emitting layer 6 can be formed in the same manner as described above.

(d) Next, a hole transport layer 3 is formed on the light-emitting layer 6 (see FIG. 17C). In this way, a substrate I is prepared.

(e) At the same time, a substrate 1 is prepared.

(f) Next, a hole injection electrode 2 is formed on the substrate 1 (see FIG. 17D).

(g) Next, a hole injection layer 121 is formed on the hole injection electrode 2 (see FIG. 17E). In this way, a substrate J is prepared.

(h) Next, the substrate I and the substrate J are bonded together so that the hole transport layer 3 and the hole injection layer 121 can be opposed to each other (see FIG. 17F).

In such a manner as described above, the light-emitting device 120 can be manufactured. However, a method for manufacturing a light-emitting device 120 is not limited to the method described above.

It is to be noted that the above-described steps are preferably carried out under dry atmosphere, more preferably under dry and low-oxygen atmosphere. This makes it possible to improve the characteristics of the light-emitting device. For example, a decrease in operating voltage and increases in efficiency and lifespan can be achieved.

Embodiment 14

A light-emitting device according to an embodiment 14 of the present invention will be described with reference to FIG. 3. As described above, FIG. 3 is a perspective view which shows the structure of electrodes of the light-emitting device 20 according to the embodiment 2. The structure of the light-emitting device according to the embodiment 14 is substantially the same as that of the light-emitting device 20 according to the embodiment 2 except that a thin film transistor 21 of the light-emitting device according to the embodiment 14 is connected to the hole injection electrode 2 of the light-emitting device 120 according to the embodiment 13, and therefore a detailed description of the light-emitting device according to the embodiment 14 will not be repeated here.

Embodiment 15

A display according to an embodiment 15 of the present invention will be described with reference to FIG. 4. As described above, FIG. 4 is a schematic plane view which shows an active matrix of the display 30 according to the embodiment 3 composed of the plurality of x electrodes 22 and the plurality of y electrodes 23 intersecting at right angles with the x electrodes 22. The display 30 is an active matrix display having a plurality of thin film transistors. The display according to the embodiment 15 is different from the display 30 according to the embodiment 3 in that the display according to the embodiment 15 includes a light-emitting device array in which the plurality of light-emitting devices according to the embodiment 14 are two-dimensionally arrayed. However, the structure of the display according to the embodiment 15 is substantially the same as that of the display 30 according to the embodiment 3, and therefore a detailed description of the display according to the embodiment 15 will not be repeated here.

Figure 18:
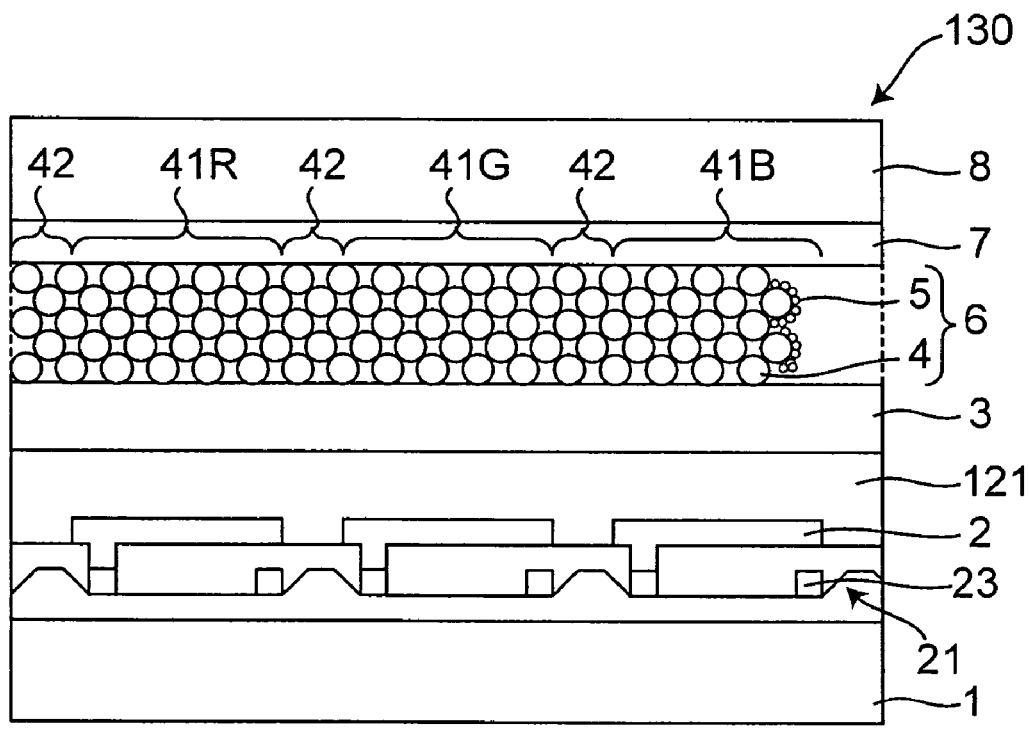
FIG. 18 is a cross-sectional view of a display according to an embodiment 15 of the present invention taken along a plane perpendicular to a light-emitting surface thereof.

Next, a method for manufacturing a display according to the embodiment 15 will be described with reference to FIG. 18. FIG. 18 is a cross-sectional view of a display 130 according to another example of the embodiment 15 having a plurality of pixels 41R, 41G, and 41B different from each other. It is to be noted that the cross-sectional view in FIG. 18 is taken along a plane perpendicular to the y electrode 23 and a light-emitting surface of the display 130. The display 130 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 120 according to the embodiment 13, the plurality of hole injection electrodes 2 are formed, and then the hole injection layer 121 is applied onto the hole injection electrodes 2 by, for example, an ink-jet method. At the same time, in the same manner as described with reference to the light-emitting device 120 according to the embodiment 13, the transparent electron injection electrode 7, the light-emitting layer 6, and the hole transport layer 3 are formed on the transparent substrate 8 in order of mention. Thereafter, the hole transport layer 3 provided on the transparent substrate 8 and the hole injection layer 121 provided on the substrate 1 are bonded together. In such a manner as described above, the display 130 can be manufactured. However, a method for manufacturing a display 130 is not limited to the method described above. In the case of a color display, the pixels 41R, 41G, and 41B are formed by, for example, an ink-jet method in such a manner that a liquid containing an organic red light-emitting material, a liquid containing an organic green light-emitting material, and a liquid containing an organic blue light-emitting material are applied onto the metal oxide semiconductor porous body respectively in accordance with a pixel pitch, to thereby form the light-emitting layer 6. Prior to this step, a pixel separation region 42 by which adjacent pixels are separated from each other may be formed. Such a pixel separation region 42 can be formed in the same manner as in the embodiment 3.

Embodiment 16

Figure 19:
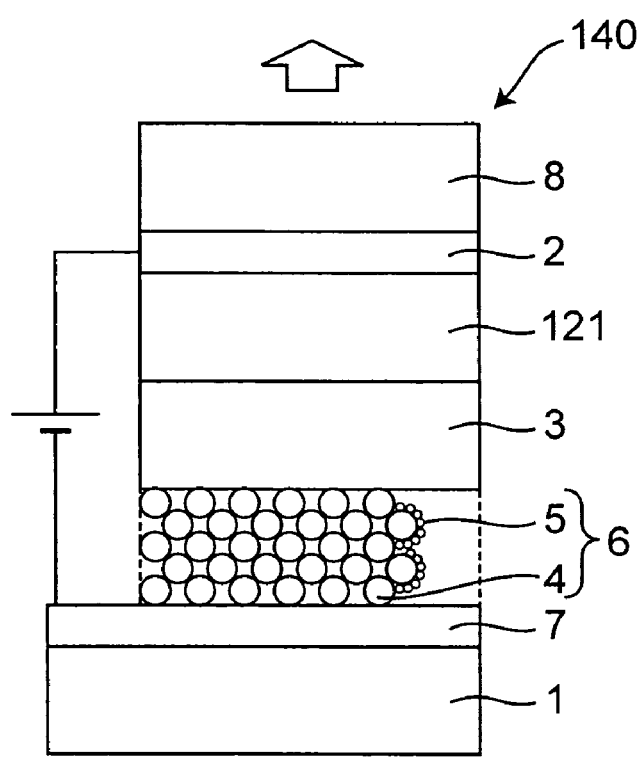
FIG. 19 is a cross-sectional view of a light-emitting device according to an embodiment 16 of the present invention taken along a plane perpendicular to a light-emitting surface thereof.

A light-emitting device according to an embodiment 16 of the present invention will be described with reference to FIG. 19. FIG. 19 is a cross-sectional view of a light-emitting device 140 taken along a plane perpendicular to a light-emitting surface thereof. The light-emitting device 140 is different from the light-emitting device 50 according to the embodiment 4 in that the light-emitting device 140 further includes a hole injection layer 121 provided between the hole injection electrode 2 and the hole transport layer 3, and that the hole transport layer 3 provided on the substrate 1 and the hole injection electrode 2 provided on the transparent substrate 8 are bonded together through the hole injection layer 121 having adhesion properties. In this case, it is not necessary for the hole transport layer 3 to have adhesion properties. It is to be noted that other structural components of the light-emitting device 140 are substantially the same as those of the light-emitting device 50 according to the embodiment 4, and therefore the description of these structural components will not be repeated here. In addition to the above-described structural components, the light-emitting device 140 may further include an electron transport layer or a conductive layer provided between the light-emitting layer 6 and the electron injection electrode 7. Further, the light-emitting device 140 may include a low-refractive-index layer provided between the hole injection electrode 2 and the transparent substrate 8. By providing a low-refractive-index layer, it is possible to enhance the efficiency of taking light out of the light-emitting device. Furthermore, the light-emitting device 140 may include an n-type semiconductor thin layer provided between the electron injection electrode 7 and the light-emitting layer 6 containing a porous body composed of the metal oxide semiconductor fine particles 4. Such a thin layer functions as a hole blocking layer which prevents holes from reaching the electron injection electrode 7 through the interstices of a porous body composed of the metal oxide semiconductor fine particles 4 without recombining with electrons, thereby enhancing the efficiency of recombination of holes with electrons.

Next, each of the structural components of the light-emitting device 140 will be described. It is to be noted that the description of the structural components substantially the same as those of the light-emitting device 50 according to the embodiment 4 will not be repeated here. Further, the constituent materials of the hole injection layer 121 of the light-emitting device 140 are substantially the same as those of the hole injection layer 121 of the light-emitting device 120 according to the embodiment 13, and therefore the description of the constituent materials of the hole injection layer 121 will not be repeated here.

Next, a method for manufacturing a light-emitting device 140 will be described with reference to FIGS. 20A to 20F. The light-emitting device 140 is manufactured in the following steps.

(a) A transparent substrate 8 is prepared.

Figure 20:
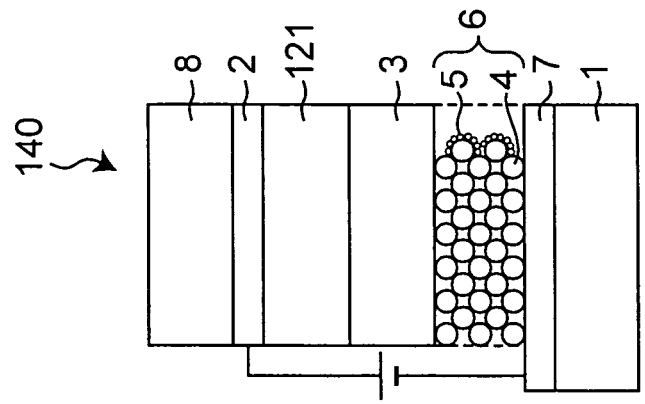
FIGS. 20A to 20F are cross-sectional views which show the steps of manufacturing the light-emitting device according to the embodiment 16 of the present invention.

(b) Next, a transparent hole injection electrode 2 is formed on the transparent substrate 8 (see FIG. 20A).

(c) Next, a hole injection layer 121 is formed on the hole injection electrode 2 (see FIG. 20B). In this way, a substrate K is prepared.

(d) At the same time, a substrate 1 is prepared.

(e) Next, an electron injection electrode 7 is formed on the substrate 1 (see FIG. 20C).

(f) Next, a light-emitting layer 6 containing a metal oxide semiconductor porous body, by the surface of which an organic light-emitting material 5 is supported, is formed on the electron injection electrode 7 (see FIG. 20D). It is to be noted that such a light-emitting layer 6 can be formed in the same manner as described above.

(g) Next, a hole transport layer 3 is formed on the light-emitting layer 6 (see FIG. 20E). In this way, a substrate L is prepared.

(h) Next, the substrate K and the substrate L are bonded together so that the hole injection layer 121 and the hole transport layer 3 can be opposed to each other (see FIG. 20F).

In such a manner as described above, the light-emitting device 140 can be manufactured. However, a method for manufacturing a light-emitting device 140 is not limited to the method described above.

It is to be noted that the above-described steps are preferably carried out under dry atmosphere, more preferably under dry and low-oxygen atmosphere. This makes it possible to improve the characteristics of the light-emitting device. For example, a decrease in operating voltage and increases in efficiency and lifespan can be achieved.

Embodiment 17

A light-emitting device according to an embodiment 17 of the present invention will be described with reference to FIG. 8. As described above, FIG. 8 is a perspective view which shows the structure of electrodes of the light-emitting device 60 according to the embodiment 5. The structure of the light-emitting device according to the embodiment 17 is substantially the same as that of the light-emitting device 60 according to the embodiment 5 except that a thin film transistor 21 of the light-emitting device according to the embodiment 17 is connected to the electron injection electrode 7 of the light-emitting device 140 according to the embodiment 16, and therefore a detailed description of the light-emitting device according to the embodiment 17 will not be repeated here.

Embodiment 18

A display according to an embodiment 18 of the present invention will be described with reference to FIG. 4. As described above, FIG. 4 is a schematic plane view which shows an active matrix of the display 30 according to the embodiment 3 composed of the plurality of x electrodes 22 and the plurality of y electrodes 23 intersecting at right angles with the x electrodes 22. The display 30 is an active matrix display having a plurality of thin film transistors. The display according to the embodiment 18 is different from the display 30 according to the embodiment 3 in that the display according to the embodiment 18 includes a light-emitting device array in which the plurality of light-emitting devices according to the embodiment 17 are two-dimensionally arrayed. However, the structure of the display according to the embodiment 18 is substantially the same as that of the display 30 according to the embodiment 3, and therefore a detailed description of the display according to the embodiment 18 will not be repeated here.

Figure 21:
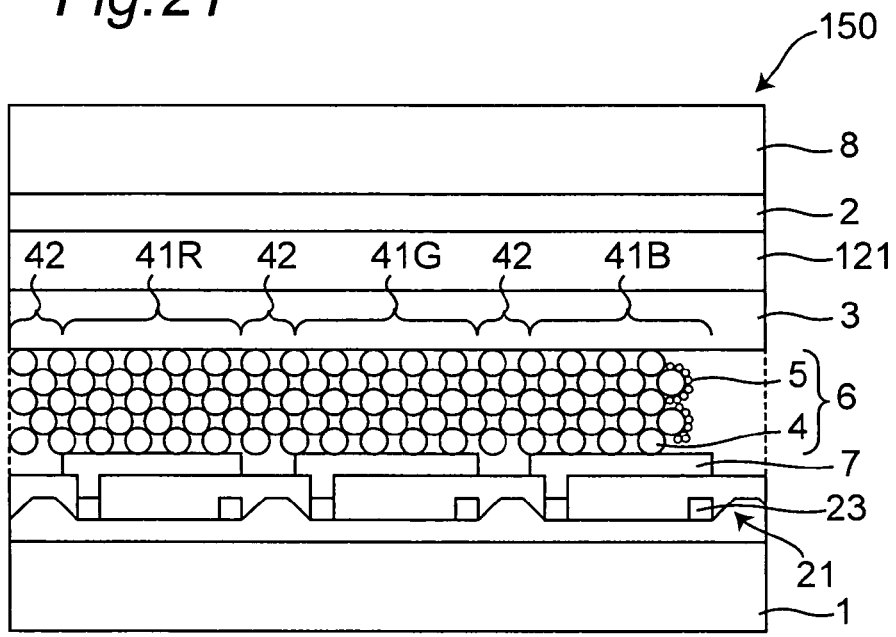
FIG. 21 is a cross-sectional view of a display according to an embodiment 18 of the present invention taken along a plane perpendicular to a light-emitting surface thereof.

Next, a method for manufacturing a display according to the embodiment 18 will be described with reference to FIG. 21. FIG. 21 is a cross-sectional view of a display 150 according to another example of the embodiment 18 having a plurality of pixels 41R, 41G, and 41B different from each other. It is to be noted that the cross-sectional view in FIG. 21 is taken along a plane perpendicular to the y electrode 23 and a light-emitting surface of the display 150. The display 150 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 140 according to the embodiment 16, the plurality of electron injection electrodes 7, the light-emitting layer 6, and the hole transport layer 3 are formed in order of mention. At the same time, in the same manner as described with reference to the light-emitting device 140 according to the embodiment 16, the transparent hole injection electrode 2 is formed on the transparent substrate 8, and then the hole injection layer 121 is applied onto the hole injection electrode 2 by, for example, an ink-jet method. Thereafter, the hole transport layer 3 provided on the substrate 1 and the hole injection layer 121 provided on the transparent substrate 8 are bonded together. In such a manner as described above, the display 150 can be manufactured. However, a method for manufacturing a display 150 is not limited to the method described above. In the case of a color display, the pixels 41R, 41G, and 41B are formed by, for example, an ink-jet method in such a manner that a liquid containing an organic red light-emitting material, a liquid containing an organic green light-emitting material, and a liquid containing an organic blue light-emitting material are applied onto the metal oxide semiconductor porous body respectively in accordance with a pixel pitch, to thereby form the light-emitting layer 6. Prior to this step, a pixel separation region 42 by which adjacent pixels are separated from each other may be formed. Such a pixel separation region 42 can be formed in the same manner as in the embodiment 3.

As is the case with the display 150 according to the embodiment 6, alignment in accordance with a pixel pitch is carried out only on the substrate 1 side. Therefore, each of the transparent hole injection electrode 2 and the hole injection layer 121 can be provided in the form of a solid thin film on the transparent substrate 8. This makes it possible to reduce the accuracy needed to carry out alignment when the hole injection layer 121 and the hole transport layer 3 are bonded together, thereby simplifying the manufacturing processes.

Embodiment 19

Figure 22:
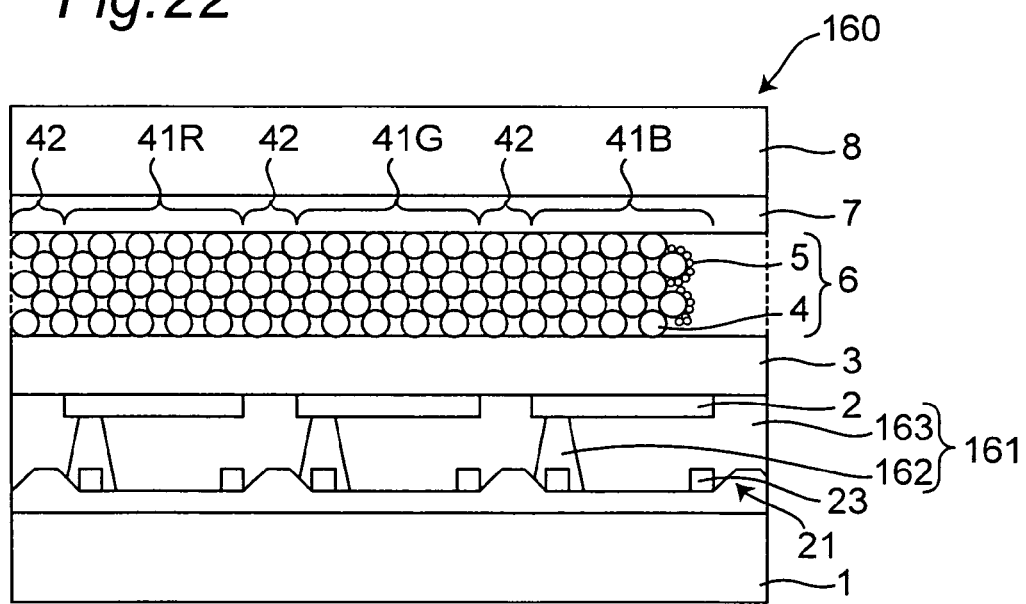
FIG. 22 is a cross-sectional view of a display according to an embodiment 19 of the present invention taken along a plane perpendicular to a light-emitting surface thereof.

A display according to an embodiment 19 of the present invention will be described with reference to FIG. 22. FIG. 22 is a cross-sectional view of a display 160 according to the embodiment 19 having a plurality of pixels 41R, 41G, and 41B different from each other. It is to be noted that the cross-sectional view in FIG. 22 is taken along a plane perpendicular to the y electrode 23 and a light-emitting surface of the display 160. The display 160 is an active matrix display having a plurality of thin film transistors. The display 160 is different from the display 30 according to the embodiment 3 in that the display 160 includes an adhesive layer 161 through which the hole injection electrode 2 provided on the transparent substrate 8 and the thin film transistors 21 provided on the substrate 1 are bonded. The adhesive layer 161 includes a conductive region 162 through which the hole injection electrode 2 is connected to the thin film transistors 21 and a non-conductive region 163. By providing such an adhesive layer 161, it is possible to easily provide a top emission display while employing a conventional method for manufacturing an organic EL device in which the electron injection electrode 7, the light-emitting layer 6, the hole transport layer 3, and the hole injection electrode 2 are stacked one after another on the transparent substrate 8. In this case, it is not necessary for the hole transport layer 3 to have adhesive properties. Other structural components of the display 160 are substantially the same as those of the light-emitting device 10 according to the embodiment 1, and therefore the description of these structural components will not be repeated here. The display described above has a two-organic layer structure having a light-emitting layer and a hole transport layer, but the display may have a single-organic layer structure (e.g., a structure composed of only a light-emitting layer), or a laminated structure having two or more organic layers (e.g., a structure composed of a hole transport layer, a light-emitting layer, and an electron transport layer, a structure composed of a hole injection layer, a hole transport layer, a light-emitting layer, and an electron transport layer). Further, the display may be made opposite in polarity by connecting the electron injection electrodes to the thin film transistors.

Next, each of the structural components of the display 160 will be described in detail. It is to be noted that the description of the structural components substantially the same as those of the light-emitting device 10 according to the embodiment 1 will not be repeated here.

The conductive region 162 of the adhesive layer 161 can be formed using a well-known conductive paste such as Ag paste or carbon paste by a well-known application method such as a screen printing method or an ink-jet method. On the other hand, the non-conductive region 163 preferably contains a polymer-based material so as to function as an adhesive layer through which the substrate 1 and the hole injection electrodes 2 or the hole transport layer 3 provided on the transparent substrate 8 are bonded together. Examples of such a polymer-based material include well-known polymer-based materials such as polyethylene, polyvinyl alcohol, and polyimide. The non-conductive area 163 can be formed by a well-known application method such as a screen printing method or an ink-jet method. More preferably, the non-conductive region 163 contains a cross-linkable or polymerizable material which can be cross-linked or polymerized by the application of light or heat. This makes it possible to more firmly bond the substrate 1 and the hole injection electrodes 2 or the hole transport layer 3 provided on the transparent substrate 8 together through the non-conductive region 163 by the application of light or heat.

Next, the present invention will be described in more detail with reference to concrete examples.

Example 1

A light-emitting device according to Example 1 of the present invention will be described with reference to FIG. 1. The structure of the light-emitting device according to Example 1 is the same as that of the light-emitting device according to the embodiment 1, and therefore the description of the structure of the light-emitting device according to Example 1 will not be repeated here. In the light-emitting device according to Example 1, a commercially-available glass substrate with an ITO film was used as a transparent substrate 8 including an electron injection electrode 7, a $TiO_2$ thin film porous body was used as a metal oxide semiconductor porous body, and 3-(2-benzothiazolyl)-7-diethylaminocoumarin-4-carboxylic acid (BDCC) was used as an organic light-emitting material 5 to be supported by the surface of the porous body. Further, a glass substrate was used as a substrate 1, Al was used for a hole injection electrode 2, and PVK was used for a hole transport layer 3.

Next, a method for manufacturing a light-emitting device according to Example 1 will be described with reference to FIGS. 2A to 2F. The light-emitting device according to Example 1 was manufactured in the following steps.

(a) A commercially-available glass substrate with an ITO film was prepared as a transparent substrate 8 including an electron injection electrode 7 (see FIG. 2A). The substrate was ultrasonically cleaned with an alkaline detergent, water, acetone, and isopropyl alcohol (IPA), and was then removed from a boiling IPA solution and dried. Finally, the substrate was cleaned with $UV/O_3$.

(b) On the glass substrate with an ITO film, a $TiO_2$ thin film porous body layer was formed as a metal oxide semiconductor porous body layer.

A method for forming a $TiO_2$ thin film porous body layer will be described below.

(1) First, titanium isopropoxide was dropped into an aqueous nitric acid solution at room temperature to hydrolyze titanium isopropoxide, and then they were heated to 80° C. and stirred for about 8 hours to obtain a sol solution.

(2) Next, the sol solution was aged for 12 hours at 250° C. in an autoclave to prepare a colloidal solution containing $TiO_2$ fine particles each having a particle diameter of about 10 to 20 nm.

(3) The colloidal solution was concentrated with a rotary evaporator, and then polyethylene glycol was added to the concentrated colloidal solution so that the concentration of the polyethylene glycol became about 30% to prepare $TiO_2$ paste.

(4) Next, the $TiO_2$ paste was applied onto the substrate 1 by a doctor blade method, and then the thus formed $TiO_2$ film was dried for 10 minutes at room temperature in the air. Thereafter, the $TiO_2$ film was sintered for 30 minutes at 450° C. to provide a $TiO_2$ thin film on the substrate 1.

(5) The $TiO_2$ thin film was immersed in an aqueous $TiCl_4$ solution, and was left standing overnight. Thereafter, the $TiO_2$ thin film was washed with water, and was again sintered for 30 minutes at 450° C.

In the above steps, the $TiO_2$ thin film porous body was formed as a metal oxide semiconductor porous body.

(c) An organic light-emitting material 5 was adsorbed to the surface of the $TiO_2$ thin film porous body formed on the glass substrate with an ITO film in the following manner. First, BDCC was dispersed in ethanol by the use of an ultrasonic agitator to prepare a dispersion liquid. In this dispersion liquid continuously stirred, the glass substrate with an ITO film on which the $TiO_2$ thin film porous body had been formed was immersed overnight to allow the BDCC as an organic light-emitting material to be supported by the surface of the $TiO_2$ thin film porous body layer, to thereby form a light-emitting layer 6 (see FIG. 2B). In this way, a substrate A was prepared.

(d) At the same time, a glass substrate was prepared as a substrate 1. The glass substrate was cleaned in the same manner as in the case of the glass substrate with an ITO film. On the substrate 1, an Al film was formed by vacuum evaporation as a hole injection electrode 2 (see FIG. 2C).

(e) PVK was dissolved in chloroform to prepare a chloroform solution of PVK. The chloroform solution of PVK was applied onto the hole injection electrode by a spin coating method to form a hole transport layer 3 (see FIG. 2D). In this way, a substrate B was prepared.

(f) Just after the application of the hole transport layer 3, the substrate B was stacked on the substrate A so that the hole transport layer 3 of the substrate B and the light-emitting layer 6 of the substrate A were opposed to each other. They were left standing at room temperature to bond the substrate A and the substrate B together, to thereby obtain a light-emitting device (see FIG. 2E).

A direct voltage was applied to the thus obtained light-emitting device to evaluate the light-emitting characteristics thereof. When a direct voltage was 8V, the luminous brightness and luminous efficiency of the light-emitting device were 500 cd/m² and 3.5 cd/A, respectively. As a result, it has been found that the light-emitting device according to Example 1 is equal in light-emitting characteristics to a light-emitting device according to Comparative Example which will be described later. Further, the surface area of the metal oxide semiconductor porous body prepared in Example 1 was measured by a BET specific surface area measuring method. As a result, it has been found that the metal oxide semiconductor porous body prepared in Example 1 has a surface area about 800 times that of a flat electrode. Furthermore, the light-emitting device was subjected to a life test in which an initial luminous brightness was 300 cd/m². As a result, the brightness half-life of the light-emitting device was 13,000 hours, which was longer than that of the light-emitting device of Comparative Example 1.

Example 2

A display according to Example 2 of the present invention will be described with reference to FIG. 5. Like the display according to the embodiment 3, a display 40 has a plurality of thin film transistors 21. However, the display 40 is different from the display according to the embodiment 3 in that the display 40 has pixels of three colors (RGB), 41R, 41G, and 41B. The organic light-emitting materials of the pixels 41R, 41G, and 41B are different from each other depending on their respective luminescent colors. The display 40 further includes a pixel separation region 42 by which adjacent pixels are separated from each other. In the pixel separation region 42, a black dye is supported by the surface of the metal oxide semiconductor fine particles 4 to separate adjacent pixels from each other.

A method for manufacturing a display 40 will be described. The display 40 is obtained by two-dimensionally arraying the plurality of light-emitting devices according to the embodiment 1, and therefore the display 40 can be formed in substantially the same manner as described with reference to the light-emitting device according to the embodiment 1. The pixels 41R, 41G, and 41B are formed using organic light-emitting materials 5 different from each other. Further, in an area corresponding to the pixel separation region 42 provided between adjacent pixels, a black dye is supported by the surface of the metal oxide semiconductor fine particles 4. The light-emitting layer 6 is provided on the transparent substrate 8, and therefore the hole injection electrodes 2 provided on the substrate 1 and the light-emitting layer 6 provided on the transparent substrate 8 are bonded together through the hole transport layer 3 which functions as an adhesive layer. Therefore, it is necessary to align the hole injection electrodes 2 with the light-emitting layer 6 by which the organic light-emitting materials 5 different from pixel to pixel are supported. In this case, in the alignment between the pixel separation region 42 and each of the pixels 41, a slightly wide pixel separation region 42 provided between adjacent pixels makes it possible to eliminate interaction between adjacent pixels even when the pixels 41 become slightly misaligned.

Example 3

A light-emitting device according to Example 3 of the present invention will be described with reference to FIG. 1. The light-emitting device according to Example 3 is different from the light-emitting device according to Example 1 in that the hole injection electrode is formed using a mixture of CuO and $Cu_2O$ instead of Al. Such a hole injection electrode formed using a mixture of CuO and $Cu_2O$ has a black color. Like the hole injection electrode of Example 1, the hole injection electrode of Example 3 was formed by a sputtering method.

The contrast of the light-emitting device according to Example 3 was evaluated in the following manner. The light-emitting surface of the light-emitting device was irradiated with white light of 100 lx at a 45-degree angle, and then a contrast ratio between brightness in ON-state and brightness in OFF-state was determined when a luminous brightness was 300 cd/$m^2$. As a result, the contrast ratio of Example 3 was found to be 300:1 or higher, which was better than that of Comparative Example 1 described later.

Example 4

A light-emitting device according to Example 4 of the present invention will be described with reference to FIG. 6. The structure of the light-emitting device according to Example 4 is the same as that of the light-emitting device according to the embodiment 4, and therefore the description of the structure of the light-emitting device according to Example 4 will not be repeated here. The light-emitting device according to Example 4 is different from the light-emitting device according to Example 1 in that a commercially-available glass substrate with an ITO film is used as the transparent substrate 8 including the transparent hole injection electrode 2, and that MgAg is used for the electron injection electrode 7. The electron injection electrode 7 was formed by vacuum evaporation. It is to be noted that the description of the structural components and manufacturing method substantially the same as those of the light-emitting device according to Example 1 will not be repeated here. The light-emitting device according to Example 4 was evaluated in the same manner as in Example 1, and as a result the brightness and brightness half-life thereof were 550 cd/$m^2$ and 13,000 hours, respectively.

Example 5

A light-emitting device according to Example 5 of the present invention will be described with reference to FIG. 10. The structure of the light-emitting device according to Example 5 is the same as that of the light-emitting device according to the embodiment 7, and therefore the description of the structure of the light-emitting device according to Example 5 will not be repeated here. The light-emitting device according to Example 5 is different from the light-emitting device according to Example 1 in that an electron transport layer 81 formed using CN-PPV is provided between the light-emitting layer 6 and the electron injection electrode 7, and that the electron injection electrode 7 is formed using InZnO. The electron transport layer 81 was formed by a spin coating method, and the electron injection electrode 7 was formed by a sputtering method. It is to be noted that the description of the structural components and manufacturing method substantially the same as those of the light-emitting device according to Example 1 will not be repeated here. The light-emitting device according to Example 5 was evaluated in the same manner as in Example 1, and as a result the brightness and brightness half-life thereof were 520 cd/$m^2$ and 12,000 hours, respectively.

Example 6

A light-emitting device according to Example 6 of the present invention will be described with reference to FIG. 13. The structure of the light-emitting device according to Example 6 is the same as that of the light-emitting device according to the embodiment 10, and therefore the description of the structure of the light-emitting device according to Example 6 will not be repeated here. The light-emitting device according to Example 6 is different from the light-emitting device according to Example 4 in that an electron transport layer 81 formed using CN-PPV is provided between the light-emitting layer 6 and the electron injection electrode 7. The electron transport layer 81 was formed by a spin coating method. It is to be noted that the description of the structural components and manufacturing method substantially the same as those of the light-emitting device according to Example 4 will not be repeated here. The light-emitting device according to Example 6 was evaluated in the same manner as in Example 1, and as a result the brightness and brightness half-life thereof were 510 cd/$m^2$ and 12,000 hours, respectively.

Example 7

A light-emitting device according to Example 7 of the present invention will be described with reference to FIG. 16.

The structure of the light-emitting device according to Example 7 is the same as that of the light-emitting device according to the embodiment 13, and therefore the description of the structure of the light-emitting device according to Example 7 will not be repeated here. The light-emitting device according to Example 7 is different from the light-emitting device according to Example 1 in that a hole injection layer 121 formed using PEDOT/PSS is provided between the hole injection electrode 2 and the hole transport layer 3. The hole injection layer 121 was formed by a spin coating method. It is to be noted that the description of the structural components and manufacturing method substantially the same as those of the light-emitting device according to Example 1 will not be repeated here. The light-emitting device according to Example 7 was evaluated in the same manner as in Example 1, and as a result the brightness and brightness half-life thereof were 560 cd/m$^2$ and 11,000 hours, respectively.

Example 8

A light-emitting device according to Example 8 of the present invention will be described with reference to FIG. 19. The structure of the light-emitting device according to Example 8 is the same as that of the light-emitting device according to the embodiment 16, and therefore the description of the structure of the light-emitting device according to Example 8 will not be repeated here. The light-emitting device according to Example 8 is different from the light-emitting device according to Example 4 in that a hole injection layer 121 formed using PEDOT/PSS is provided between the hole injection electrode 2 and the hole transport layer 3. The hole injection layer 121 was formed by a spin coating method. It is to be noted that the description of the structural components and manufacturing method substantially the same as those of the light-emitting device according to Example 1 will not be repeated here. The light-emitting device according to Example 8 was evaluated in the same manner as in Example 1, and as a result the brightness and brightness half-life thereof were 540 cd/m$^2$ and 12,000 hours, respectively.

It is to be noted that each of the light-emitting devices described above has one or two organic layers, in addition to the light-emitting layer 6 containing a metal oxide semiconductor porous body, but the light-emitting device according to the present invention may have three or more organic layers.

Comparative Example 1

A commercially-available glass substrate with an ITO film was cleaned in the same manner as in the case of the transparent substrate 8 of Example 1, and then TPD and 3-(2-benzothiazolyl)-7-diethylaminocoumarin (coumarin 6) were vacuum-evaporated onto the glass substrate with an ITO film in order of mention to form a hole transport layer and a light-emitting layer, respectively. Further, MgAg was evaporated onto the light-emitting layer to form an electron injection electrode. After the electron injection electrode was formed, the thus obtained laminated body was packaged using a glass plate and an epoxy adhesive under low-moisture and low-oxygen conditions to obtain a light-emitting device.

A direct voltage was applied to the thus obtained light-emitting device to evaluate the light-emitting characteristics thereof. When a direct voltage was 7V, the luminous brightness and luminous efficiency of the light-emitting device were 350 cd/m$^2$ and 2.0 cd/A, respectively. Further, the light-emitting device was subjected to a life-test at the same initial brightness as in Example 1, and as a result the brightness half-life of the light-emitting device was 8,000 hours. Furthermore, contrast of the light-emitting device was evaluated in the same manner as in Example 3, and as a result the contrast ratio was found to be 170:1.

Embodiment 20

Figure 25:
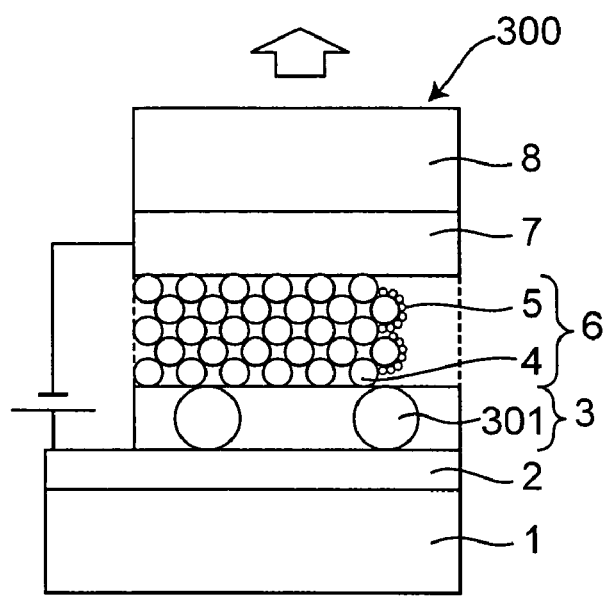
FIG. 25 is a cross-sectional view of a light-emitting device according to an embodiment 20 of the present invention taken along a plane perpendicular to a light-emitting surface thereof.

A light-emitting device according to an embodiment 20 of the present invention will be described with reference to FIG. 25. FIG. 25 is a cross-sectional view of a light-emitting device 300 taken along a plane perpendicular to a light-emitting surface thereof. The light-emitting device 300 is different from the light-emitting device 10 according to the embodiment 1 in that the light-emitting device 300 further includes a spacer 301 dispersed in the hole transport layer 3. By providing a spacer 301, it is possible to suppress variations in the thickness of the hole transport layer 3, thereby allowing the hole transport layer 3 to have a substantially uniform thickness. As a result, the in-plane uniformity of brightness of the light-emitting device is improved. It is to be noted that the structure of the light-emitting device 300 is substantially the same as that of the light-emitting device 10 according to the embodiment 1 except that the light-emitting device 300 includes the spacer 301 dispersed in the hole transport layer 3, and therefore the description of the structure of the light-emitting device 300 will not be repeated here. In addition to the structural components described above, the light-emitting device 300 may further include an electron transport layer and/or a conductive layer provided between the light-emitting layer 6 and the electron injection electrode 7. Further, the light-emitting device 300 may include a hole injection layer and/or a conductive layer provided between the hole injection electrode 2 and the hole transport layer 3. Furthermore, the light-emitting device 300 may include a protection layer provided between the hole transport layer 3 and another organic layer adjacent to the hole transport layer 3 or between the hole transport layer 3 and an electrode adjacent to the hole transport layer 3, for the purpose of preventing abrasion of the organic layer or electrode due to the spacer 301.

Next, each of the structural components of the light-emitting device 10 will be described. It is to be noted that the description of the structural components substantially the same as those of the light-emitting device 10 according to the embodiment 1 will not be repeated here.

First, the spacer 301 will be described. As the spacer 301, a conventional bead spacer for liquid crystal display panels or the like can be used. Further, it is preferred that the spacer 301 is made of a material excellent in transparency and electric insulation, and has a uniform particle diameter. Although a bead spacer is generally made of silica or resin, a resin spacer is more preferably used. This is because low-temperature foaming is not likely to occur and the thermal expansion coefficient of a resin spacer is not so different from that of a hole transport layer material so that the occurrence of defects is prevented during film formation. Preferred examples of a resin material of the spacer 301 include, but are not limited to, cross-linked copolymers containing divinylbenzene, styrene, or acryl monomer, or the like as a main ingredient. The cross section of the spacer 301 taken along a plane perpendicular to the surface of the electrode may have any shape such as a circular shape, an elliptical shape, a trapezoidal shape, or a triangular shape, but preferably has a circular shape. By using a spacer having a circular cross section, it is possible to make a film thickness more uniform. Further, the spacer 301 may be subjected to surface treatment so that the spacer 301 can come into contact with the surface of the electrode more firmly. For example, the surface of the spacer 301 may be coated with a thermoplastic resin such as polyolefin or polyacryl.

The film thickness of the hole transport layer 3 is defined by the particle diameter of the spacer 301. The particle diameter of the spacer 301 is preferably in the range of 0.01 to 10 μm, more preferably in the range of 0.1 to 5 μm. If the film thickness of the hole transport layer 3 is less than 0.01 μm, surface roughness of the hole injection electrode 2 becomes a problem. In order to reduce the surface roughness of the hole injection electrode 2, it is necessary to provide an additional process, thus resulting in an increase in manufacturing cost. On the other hand, if the film thickness of the hole transport layer 3 exceeds 10 μm, the driving voltage of the light-emitting device is increased. The number of holes which move in the hole transport layer is proportional to hole mobility, to the square of applied voltage, and to the inverse cube of the film thickness of the hole transport layer. In a case where the hole transport layer is made of such a hole transport material as described above and has a film thickness larger than 10 μm, it is not possible to allow a current which ensures sufficient brightness of the light-emitting device to flow even when a voltage of about 10 V capable of driving the thin film transistor is applied to the light-emitting device.

The hole transport layer 3 containing the spacer 301 can be formed in the same manner as described with reference to the hole transport layer 3. When the hole transport layer 3 containing the spacer 301 is formed, first, a hole transport layer material is dissolved in an organic solvent to obtain a solution, and then a spacer is dispersed in the solution by a well-known method such as ultrasonic dispersion to prepare a dispersion liquid in which the spacer is dispersed. In a case where a resin spacer is used, it is necessary to select a resin spacer which is not dissolved in an organic solvent to be used or to select an organic solvent in which a resin spacer to be used is not dissolved. On the other hand, a silica spacer is more preferably used. This is because it is possible to select an organic solvent from among a variety of choices. It is to be noted that a surfactant or the like may be added to the dispersion liquid, or co-dispersed with the spacer in the dispersion liquid for the purpose of facilitating the dispersion of the spacer.

As described above, the hole transport layer 3 functions as an adhesive layer through which the light-emitting layer 6 and the hole injection electrode 2 are bonded together, and therefore it is not possible to strictly control the film thickness when the hole transport layer 3 is formed. In addition, the hole transport layer 3 is preferably thick in consideration of mechanical strength after bonding of the light-emitting layer 6 and the hole injection electrode 2. However, in order to provide a light-emitting device capable of stably maintaining high-quality light emission with good reproducibility, it is necessary to make the film thickness of the organic layer uniform. In particular, it is important to make the film thickness of the hole transport layer 3 uniform because the hole transport layer 3 needs to be thicker than other organic layers. For this reason, by allowing the hole transport layer 3 to contain the spacer 301, it is possible to easily control the film thickness of the hole transport layer 3.

Next, a method for manufacturing a light-emitting device 300 will be described with reference to FIGS. 26A to 26E. The light-emitting device 300 is manufactured in the following steps.

(a) A transparent substrate 8 is prepared.

Figure 26A:
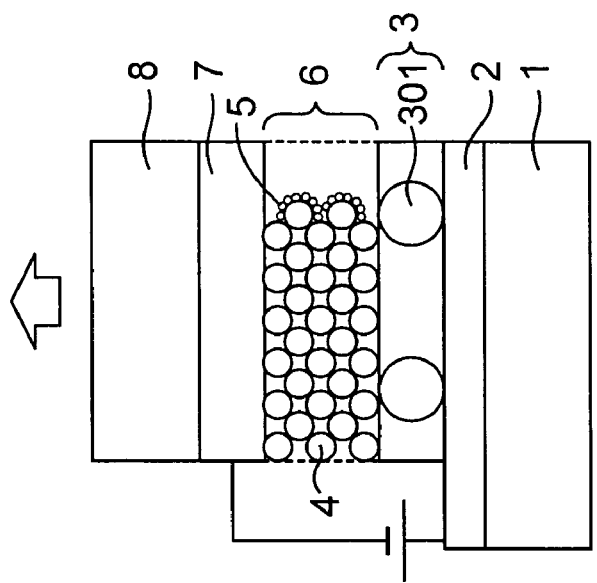
FIGS. 26A to 26E are cross-sectional views which show the steps of manufacturing the light-emitting device according to the embodiment 20 of the present invention.

(b) Next, a transparent electron injection electrode 7 is formed on the transparent substrate 8 (see FIG. 26A).

Figure 26B:
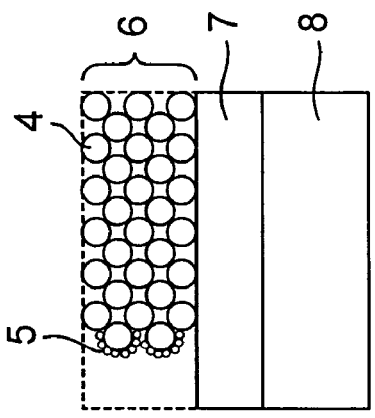

(c) Next, a light-emitting layer 6 containing a metal oxide semiconductor porous body 4, by the surface of which an organic light-emitting material 5 is supported, is formed on the electron injection electrode 7 (see FIG. 26B). It is to be noted that such a light-emitting layer 6 can be formed in the same manner as described above. In this way, a substrate M is prepared.

(d) At the same time, a substrate 1 is prepared.

Figure 26C:
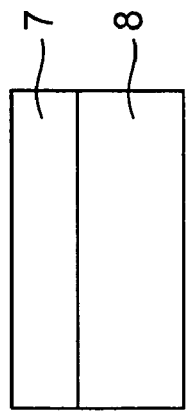

(e) Next, a hole injection electrode 2 is formed on the substrate 1 (see FIG. 26C).

(f) Next, a hole transport layer material is dissolved in an organic solvent to prepare a solution of the hole transport layer material, and then a spacer 301 is ultrasonically dispersed in the solution.

Figure 26D:
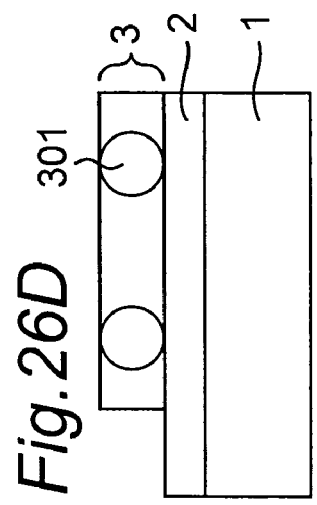

(g) Next, the solution of the hole transport layer material in which the spacer 301 is dispersed is applied onto the hole injection electrode 2 to form a hole transport layer 3 (see FIG. 26D). In this way, a substrate N is prepared.

Figure 26E:
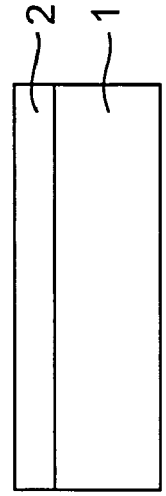

(h) Next, the substrate M and the substrate N are bonded together so that the light-emitting layer 6 and the hole transport layer 3 can be opposed to each other (see FIG. 26E).

In such a manner as described above, the light-emitting device 300 can be manufactured. However, a method for manufacturing a light-emitting device 300 is not limited to the method described above.

Embodiment 21

A light-emitting device according to an embodiment 21 of the present invention will be described with reference to FIG. 3. The light-emitting device according to the embodiment 21 is different from the light-emitting device 20 according to the embodiment 2 shown in FIG. 3 in that the light-emitting device according to the embodiment 21 uses the light-emitting device 300 according to the embodiment 20 instead of the light-emitting device 10 according to the embodiment 1. However, other structure of the light-emitting device according to the embodiment 21 is substantially the same as that of the light-emitting device 20 according to the embodiment 2, and therefore the description of the structure of the light-emitting device according to the embodiment 21 will not be repeated here.

Embodiment 22

A display according to an embodiment 22 of the present invention will be described with reference to FIG. 4. The display according to the embodiment 22 is different from the display 30 according to the embodiment 3 shown in FIG. 4 in that the display according to the embodiment 22 uses the plurality of light-emitting devices according to the embodiment 21 instead of the plurality of light-emitting devices 20 according to the embodiment 2. In the display according to the embodiment 22, the light-emitting layer 6 and the hole injection electrode 2 are bonded together through the hole transport layer 3 containing the spacer 301 therein. Since the hole transport layer 3 contains the spacer 301, the film thickness of the hole transport layer 3 is made uniform, thereby enabling a top emission display having uniform luminous brightness to be obtained. It is to be noted that the structure of the display according to the embodiment 22 is substantially the same as that of the display 30 according to the embodiment 3 except that the display according to the embodiment 22 uses the light-emitting devices according to the embodiment 21, and therefore the description of the structure of the display according to the embodiment 22 will not be repeated here.

Figure 27:
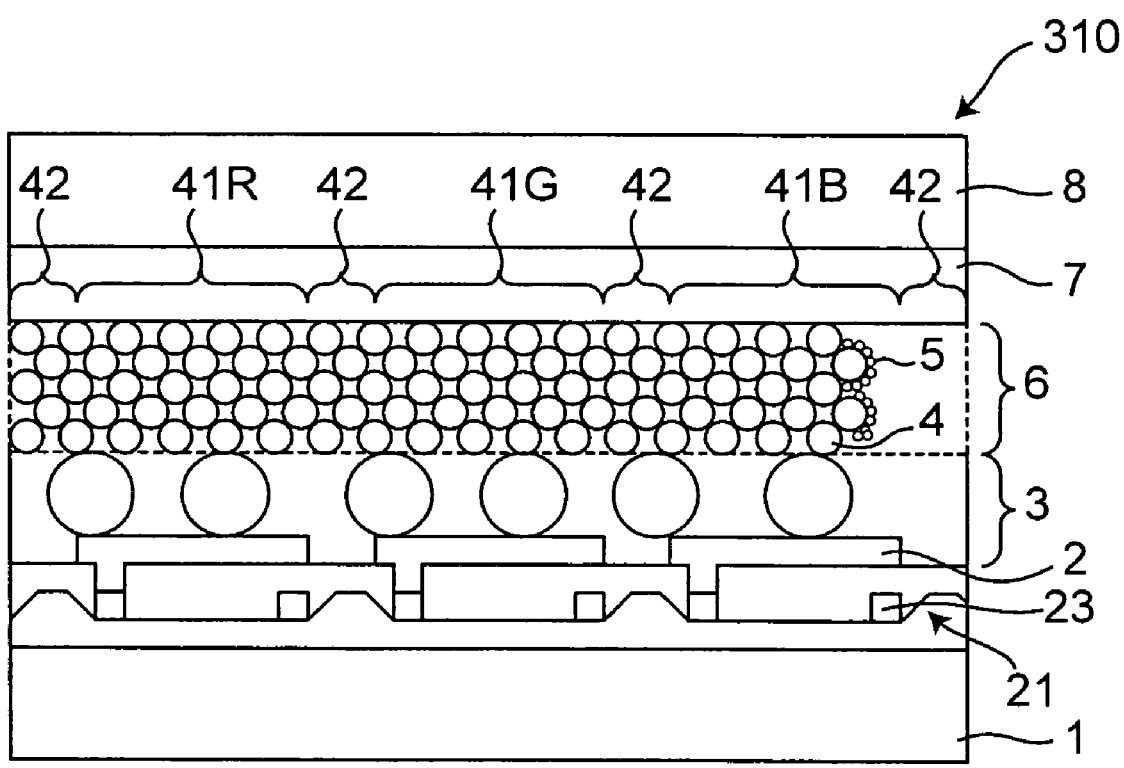
FIG. 27 is a cross-sectional view of a display according to an embodiment 22 of the present invention taken along a plane perpendicular to a light-emitting surface thereof.

Next, a method for manufacturing a display according to the embodiment 22 will be described with reference to FIG. 27. FIG. 27 is a cross-sectional view of a display 310 according to another example of the embodiment 22 having a plurality of pixels of three colors (RGB), 41R, 41G, and 41B. It is to be noted that the cross-sectional view in FIG. 27 is taken along a plane perpendicular to the y electrode 23 and a light-emitting surface of the display 310. The pixels 41R, 41G and 41B use organic light-emitting materials 5 different from each other depending on their respective luminescent colors to form the light-emitting layer 6, thereby enabling a full color display based on three primary colors to be obtained. The display 310 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 300 according to the embodiment 21, the plurality of hole injection electrodes 2 and the hole transport layer 3 containing the spacer 301 therein are formed. At the same time, in the same manner as described with reference to the light-emitting device 300 according to the embodiment 21, the transparent electron injection electrode 7 and the light-emitting layer 6 are formed on the transparent substrate 8 in order of mention. In this case, the thin film transistors 21, the x electrodes 22, the y electrodes 23, and the hole injection electrodes 2 are formed on the substrate 1 so that the thin film transistors 21 and the hole injection electrodes 2 can be aligned with the pixels 41. On the other hand, the light-emitting layer 6 is formed on the transparent substrate 8 so that the organic light-emitting material 5 can be arranged in accordance with a pixel pitch. The hole transport layer 3 containing the spacer 301 therein may be provided in the form of a solid thin film, and therefore it can be integrally formed by a screen printing method, an ink-jet method, or other well-known application methods. Then, the hole transport layer 3 provided on the substrate 1 and the light-emitting layer 6 provided on the transparent substrate 8 are bonded together so that they can be opposed to each other while alignment is carried out. In such a manner as described above, the display 310 can be manufactured. However, a method for manufacturing a display 310 is not limited to the method described above.

Embodiment 23

Figure 28:
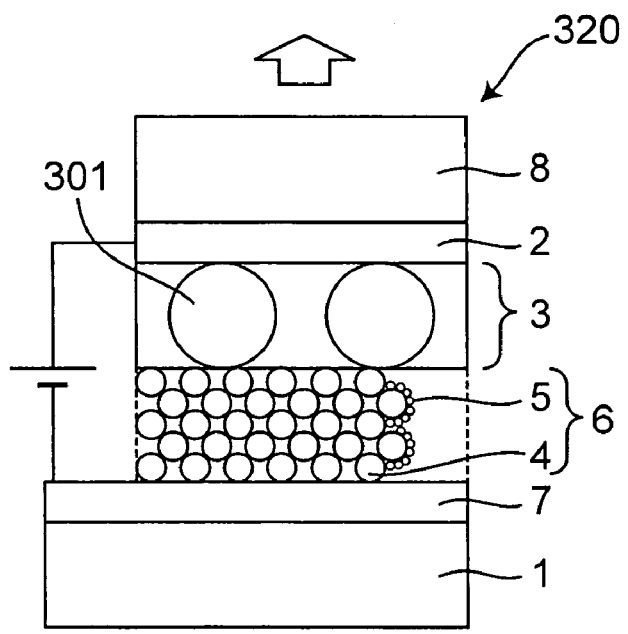
FIG. 28 is a cross-sectional view of a light-emitting device according to an embodiment 23 of the present invention taken along a plane perpendicular to a light-emitting surface thereof.

A light-emitting device according to an embodiment 23 of the present invention will be described with reference to FIG. 28. FIG. 28 is a cross-sectional view of a light-emitting device 320 taken along a plane perpendicular to a light-emitting surface thereof. The light-emitting device 320 is different from the light-emitting device 50 according to the embodiment 4 in that the light-emitting device 320 further includes a spacer 301 dispersed in the hole transport layer 3. By providing a spacer 301, it is possible to suppress variations in the thickness of the hole transport layer 3, thereby allowing the hole transport layer 3 to have a substantially uniform thickness. As a result, the in-plane uniformity of the brightness of the light-emitting device 320 is improved. It is to be noted that the structure of the light-emitting device 320 is substantially the same as that of the light-emitting device 50 according to the embodiment 4 except that the light-emitting device 320 includes the spacer 301 dispersed in the hole transport layer 3, and therefore the description of the structure of the light-emitting device 320 will not be repeated here. In addition to the structural components described above, the light-emitting device 320 may further include an electron transport layer and/or a conductive layer provided between the light-emitting layer 6 and the electron injection electrode 7. Further, the light-emitting device 320 may include a hole injection layer and/or a conductive layer provided between the hole injection electrode 2 and the hole transport layer 3. Furthermore, the light-emitting device 320 may include a protection layer provided between the hole transport layer 3 and another organic layer adjacent to the hole transport layer 3 or between the hole transport layer 3 and an electrode adjacent to the hole transport layer 3, for the purpose of preventing abrasion of the organic layer or electrode due to the spacer 301.

It is to be noted that the structural components of the light-emitting device 320 are substantially the same as those of the light-emitting device 50 according to the embodiment 4 and the light-emitting device 300 according to the embodiment 20, and therefore the description of the structural components of the light-emitting device 320 will not be repeated here.

Next, a method for manufacturing a light-emitting device 320 will be described with reference to FIGS. 29A to 29E. The light-emitting device 320 is manufactured in the following steps.

(a) A transparent substrate 8 is prepared.

Figure 29E:
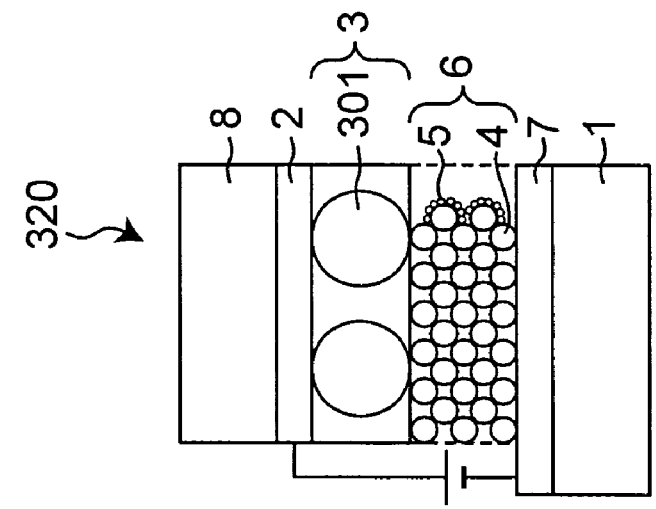
FIGS. 29A to 29E are cross-sectional views which show the steps of manufacturing the light-emitting device according to the embodiment 23 of the present invention.
Figure 29B:
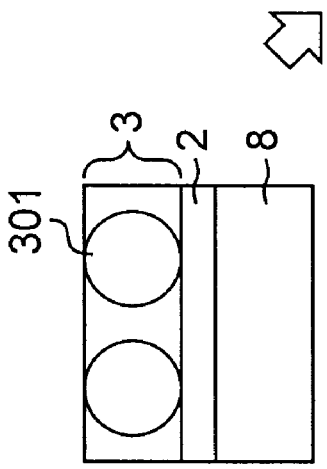
Figure 29D:
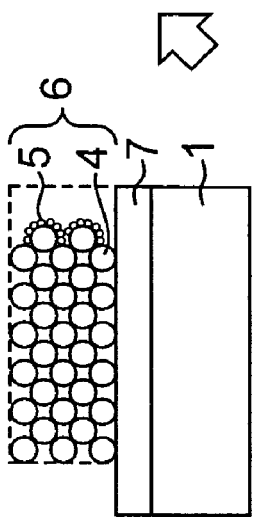
Figure 29A:
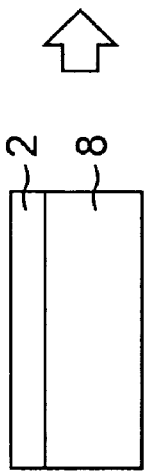

(b) Next, a transparent hole injection electrode 2 is formed on the transparent substrate 8 (see FIG. 29A).

(c) Next, a hole transport layer material is dissolved in an organic solvent to prepare a solution of the hole transport layer material, and then a spacer 301 is ultrasonically dispersed in the solution.

(d) Next, the solution of the hole transport layer material in which the spacer 301 is dispersed is applied onto the hole injection electrode 2 to form a hole transport layer 3 (see FIG. 29B). In this way, a substrate O is prepared.

(e) At the same time, a substrate 1 is prepared.

Figure 29C:
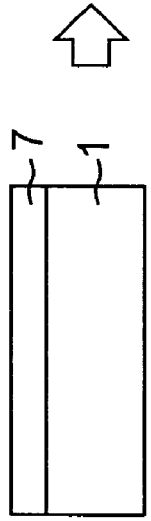

(f) Next, an electron injection electrode 7 is formed on the substrate 1 (see FIG. 29C).

(g) Next, a light-emitting layer 6 containing a metal oxide semiconductor porous body 4, by the surface of which an organic light-emitting material 5 is supported, is formed on the electron injection electrode 7 (see FIG. 29D). It is to be noted that such a light-emitting layer 6 can be formed in the same manner as described above. In this way, a substrate P is prepared.

(h) Next, the substrate O and the substrate P are bonded together so that the hole transport layer 3 and the light-emitting layer 6 can be opposed to each other (see FIG. 29E).

In such a manner as described above, the light-emitting device 320 can be manufactured. However, a method for manufacturing a light-emitting device 320 is not limited to the method described above.

Embodiment 24

A light-emitting device according to an embodiment 24 of the present invention will be described with reference to FIG. 8. The light-emitting device according to the embodiment 24 is different from the light-emitting device 60 according to the embodiment 5 shown in FIG. 8 in that the light-emitting device according to the embodiment 24 uses the light-emitting device 320 according to the embodiment 23 instead of the light-emitting device 50 according to the embodiment 4. However, other structure of the light-emitting device according to the embodiment 24 is substantially the same as that of the light-emitting device 50 according to the embodiment 4, and therefore the description of the structure of the light-emitting device according to the embodiment 24 will not be repeated here.

Embodiment 25

A display according to an embodiment 25 of the present invention will be described with reference to FIG. 4. The display according to the embodiment 25 is different from the display 30 according to the embodiment 3 shown in FIG. 4 in that the display according to the embodiment 25 uses the plurality of light-emitting devices according to the embodiment 24 instead of the plurality of light-emitting devices 60 according to the embodiment 5. In the display according to the embodiment 25, the light-emitting layer 6 and the hole injection electrode 2 are bonded together through the hole transport layer 3 containing the spacer 301 therein. Since the hole transport layer 3 contains the spacer 301, the film thickness of the hole transport layer 3 is made uniform, thereby enabling a top emission display having uniform luminous brightness to be obtained. It is to be noted that the structure of the display according to the embodiment 25 is substantially the same as that of the display 30 according to the embodiment 3 except that the display according to the embodiment 25 uses the light-emitting devices according to the embodiment 24, and therefore the description of the structure of the display according to the embodiment 25 will not be repeated here.

Figure 30:
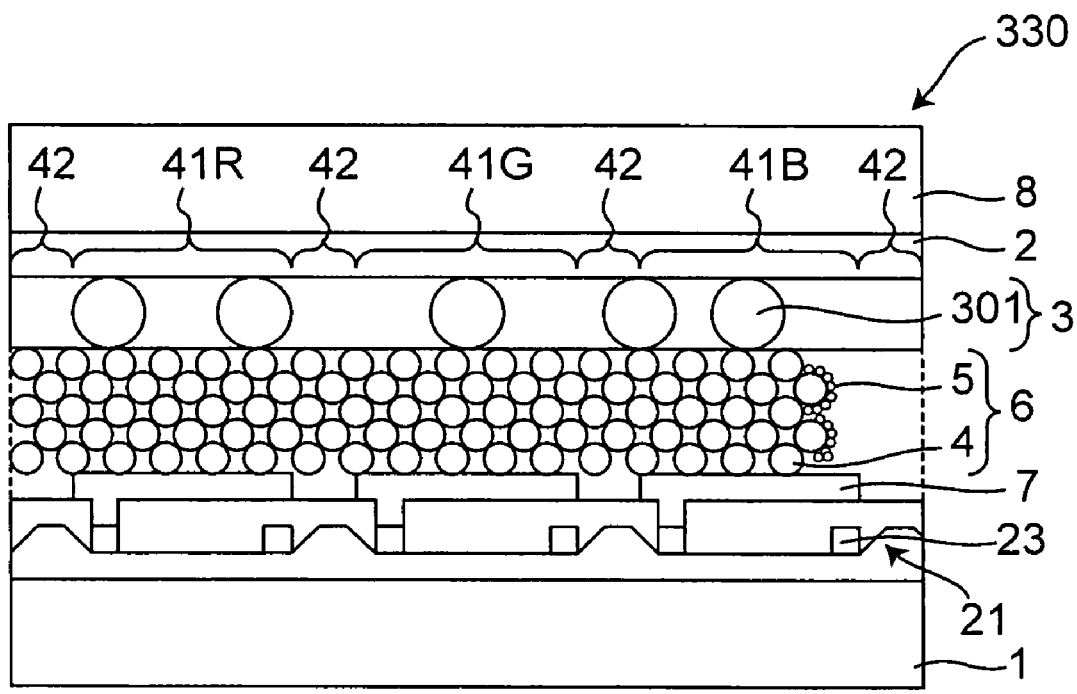
FIG. 30 is a cross-sectional view of a display according to an embodiment 25 of the present invention taken along a plane perpendicular to a light-emitting surface thereof.

Next, a method for manufacturing a display according to the embodiment 25 will be described with reference to FIG. 30. FIG. 30 is a cross-sectional view of a display 330 according to another example of the embodiment 25 having a plurality of pixels of three colors (RGB), 41R, 41G, and 41B. It is to be noted that the cross-sectional view in FIG. 30 is taken along a plane perpendicular to the y electrode 23 and a light-emitting surface of the display 330. The pixels 41R, 41G and 41B use organic light-emitting materials 5 different from each other depending on their respective luminescent colors to form the light-emitting layer 6, thereby enabling a full color display based on three primary colors to be obtained. The display 330 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 320 according to the embodiment 24, the plurality of electron injection electrodes 7 and the light-emitting layer 6 are formed in order of mention. At the same time, in the same manner as described with reference to the light-emitting device 320 according to the embodiment 24, the transparent hole injection electrode 2 and the hole transport layer 3 containing the spacer 301 therein are formed on the transparent substrate 8 in order of mention. In this case, the thin film transistors 21, the x electrodes 22, the y electrodes 23, the electron injection electrodes 7, and the light-emitting layer 6 are formed on the substrate 1 so that the thin film transistors 21 and the electron injection electrodes 7 can be aligned with the pixels 41 and that the organic light-emitting material 5 can be arranged in the light-emitting layer 6 in accordance with a pixel pitch. Therefore, the thin film transistors 21, the x electrodes 22, the y electrodes 23, the electron injection electrodes 7, and the light-emitting layer 6 are stacked in a series of manufacturing processes. On the other hand, the hole injection electrode 2 and the hole transport layer 3 may be provided in the form of a solid thin film on the transparent substrate 8, and therefore each of them can be integrally formed by a screen printing method, an ink-jet method, or other well-known application methods. This makes it possible to reduce the accuracy needed to carry out alignment when the light-emitting layer 6 provided on the substrate 1 and the hole transport layer 3 provided on the transparent substrate 8 are bonded together so that they can be opposed to each other, thereby simplifying the manufacturing processes. In such a manner as described above, the light-emitting device 330 can be manufactured. However, a method for manufacturing a light-emitting device 330 is not limited to the method described above.

Embodiment 26

Figure 31:
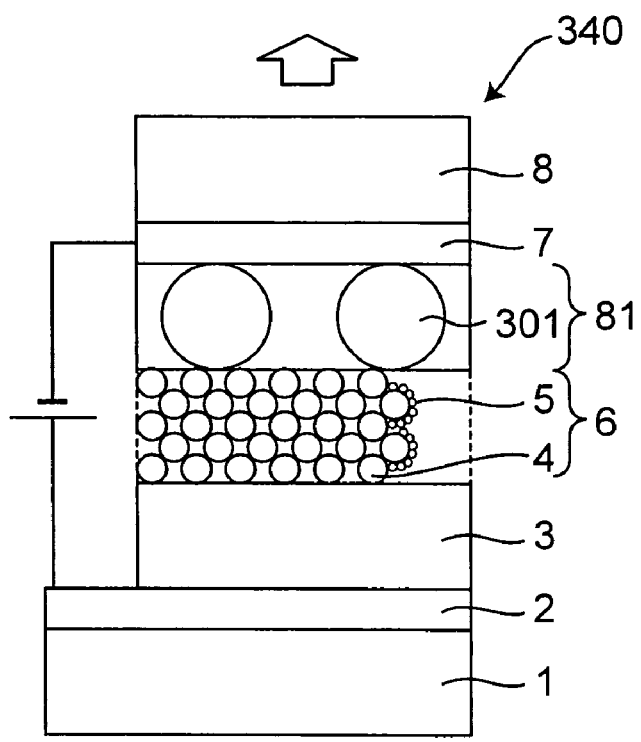
FIG. 31 is a cross-sectional view of a light-emitting device according to an embodiment 26 of the present invention taken along a plane perpendicular to a light-emitting surface thereof.

A light-emitting device according to an embodiment 26 of the present invention will be described with reference to FIG. 31. FIG. 31 is a cross-sectional view of a light-emitting device 340 taken along a plane perpendicular to a light-emitting surface thereof. The light-emitting device 340 is different from the light-emitting device 80 according to the embodiment 7 in that the light-emitting device 340 further includes a spacer 301 dispersed in the electron transport layer 81. By providing a spacer 301, it is possible to suppress variations in the thickness of the electron transport layer 81, thereby allowing the electron transport layer 81 to have a substantially uniform thickness. As a result, the in-plane uniformity of the brightness of the light-emitting device is improved. It is to be noted that the structure of the light-emitting device 340 is substantially the same as that of the light-emitting device 80 according to the embodiment 7 except that the light-emitting device 340 includes the spacer 301 dispersed in the electron transport layer 81, and therefore the description of the structure of the light-emitting device 340 will not be repeated here. In addition to the structural components described above, the light-emitting device 340 may further include a hole injection layer and/or a conductive layer provided between the hole injection electrode 2 and the hole transport layer 3. Further, the light-emitting device 340 may include a protection layer provided between the electron transport layer 81 and another organic layer adjacent to the electron transport layer 81 or between the electron transport layer 81 and an electrode adjacent to the electron transport layer 81, for the purpose of preventing abrasion of the organic layer or electrode due to the spacer 301.

The structural components of the light-emitting device 340 are substantially the same as those of the light-emitting device 80 according to the embodiment 7 and the light-emitting device 300 according to the embodiment 20, and therefore the description of the structural components of the light-emitting device 340 will not be repeated here.

Next, a method for manufacturing a light-emitting device 340 will be described with reference to FIGS. 32A to 32F. The light-emitting device 340 is manufactured in the following steps.

(a) A transparent substrate 8 is prepared.

(b) Next, a transparent electron injection electrode 7 is formed on the transparent substrate 8 (see FIG. 32A).

(c) Next, an electron transport layer material is dissolved in an organic solvent to prepare a solution of the electron transport layer material, and then a spacer 301 is ultrasonically dispersed in the solution.

(d) Next, the solution of the electron transport layer material in which the spacer 301 is dispersed is applied onto the electron injection electrode 7 to form an electron transport layer 81 (see FIG. 32B). In this way, a substrate Q is prepared.

(e) At the same time, a substrate 1 is prepared.

(f) Next, a hole injection electrode 2 is formed on the substrate 1 (see FIG. 32C).

(g) Next, a hole transport layer 3 is formed on the hole injection electrode 2 (see FIG. 32D).

(h) Next, a light-emitting layer 6 containing a metal oxide semiconductor porous body 4, by the surface of which an organic light-emitting material 5 is supported, is formed on the hole transport layer 3 (see FIG. 32E). It is to be noted that such a light-emitting layer 6 can be formed in the same manner as described above. In this way, a substrate R is prepared.

(i) Next, the substrate Q and the substrate R are bonded together so that the electron transport layer 81 and the light-emitting layer 6 can be opposed to each other (see FIG. 32F).

In such a manner as described above, the light-emitting device 340 can be manufactured. However, a method for manufacturing a light-emitting device 340 is not limited to the method described above.

Embodiment 27

A light-emitting device according to an embodiment 27 of the present invention will be described with reference to FIG. 3. The light-emitting device according to the embodiment 27 is different from the light-emitting device 20 according to the embodiment 2 shown in FIG. 3 in that the light-emitting device according to the embodiment 27 uses the light-emitting device 340 according to the embodiment 26 instead of the light-emitting device 10 according to the embodiment 1. However, other structure of the light-emitting device according to the embodiment 27 is substantially the same as that of the light-emitting device 20 according to the embodiment 2, and therefore the description of the structure of the light-emitting device according to the embodiment 27 will not be repeated here.

Embodiment 28

A display according to an embodiment 28 of the present invention will be described with reference to FIG. 4. The display according to the embodiment 28 is different from the display 30 according to the embodiment 3 shown in FIG. 4 in that the display according to the embodiment 28 uses the plurality of light-emitting devices according to the embodiment 27 instead of the plurality of light-emitting devices 20 according to the embodiment 2. In the display according to the embodiment 28, the light-emitting layer 6 and the electron injection electrode 7 are bonded together through the electron transport layer 81 containing the spacer 301 therein. Since the electron transport layer 81 contains the spacer 301 therein, the film thickness of the electron transport layer 81 is made uniform, thereby enabling a top emission display having uniform luminous brightness to be obtained. It is to be noted that the structure of the display according to the embodiment 28 is substantially the same as that of the display 30 according to the embodiment 3 except that the display according to the embodiment 28 uses the light-emitting devices according to the embodiment 27, and therefore the description of the structure of the display according to the embodiment 28 will not be repeated here.

Figure 33:
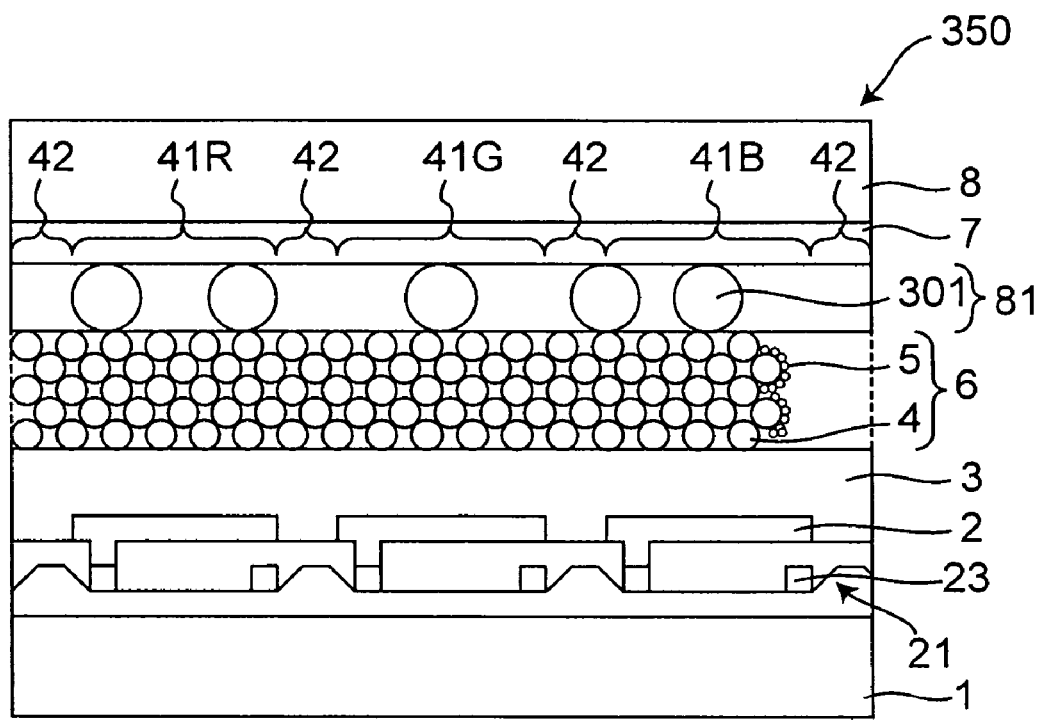
FIG. 33 is a cross-sectional view of a display according to an embodiment 28 of the present invention taken along a plane perpendicular to a light-emitting surface thereof.

Next, a method for manufacturing a display according to the embodiment 28 will be described with reference to FIG. 33. FIG. 33 is a cross-sectional view of a display 350 according to another example of the embodiment 28 having a plurality of pixels of three colors (RGB), 41R, 41G, and 41B. It is to be noted that the cross-sectional view in FIG. 33 is taken along a plane perpendicular to the y electrode 23 and a light-emitting surface of the display 350. The pixels 41R, 41G and 41B use organic light-emitting materials 5 different from each other depending on their respective luminescent colors to form the light-emitting layer 6, thereby enabling a full color display based on three primary colors to be obtained. The display 350 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 340 according to the embodiment 26, the plurality of hole injection electrodes 2, the hole transport layer 3, and the light-emitting layer 6 are formed in order of mention. At the same time, in the same manner as described with reference to the light-emitting device 340 according to the embodiment 26, the electron transport layer 81 containing the spacer 301 therein is formed on the transparent substrate 8. In this case, the thin film transistors 21, the x electrodes 22, the y electrodes 23, the hole injection electrodes 2, and the light-emitting layer 6 are formed on the substrate 1 so that the thin film transistors 21 and the hole injection electrodes 2 can be aligned with the pixels 41 and that the organic light-emitting material 5 can be arranged in the light-emitting layer 6 in accordance with a pixel pitch. Therefore, the thin film transistors 21, the x electrodes 22, the y electrodes 23, the hole injection electrodes 2, and the light-emitting layer 6 can be stacked in a series of manufacturing processes. On the other hand, the electron injection electrode 7 and the electron transport layer 81 may be provided in the form of a solid thin film on the transparent substrate 8, and therefore each of them can be integrally formed by a screen printing method, an ink-jet method, or other well-known application methods. This makes it possible to reduce the accuracy needed to carry out alignment when the light-emitting layer 6 provided on the substrate 1 and the electron transport layer 81 provided on the transparent substrate 8 are bonded together so that they can be opposed to each other, thereby simplifying the manufacturing processes. In such a manner as described above, the light-emitting device 350 can be manufactured. However, a method for manufacturing a light-emitting device 350 is not limited to the method described above.

Embodiment 29

Figure 34:
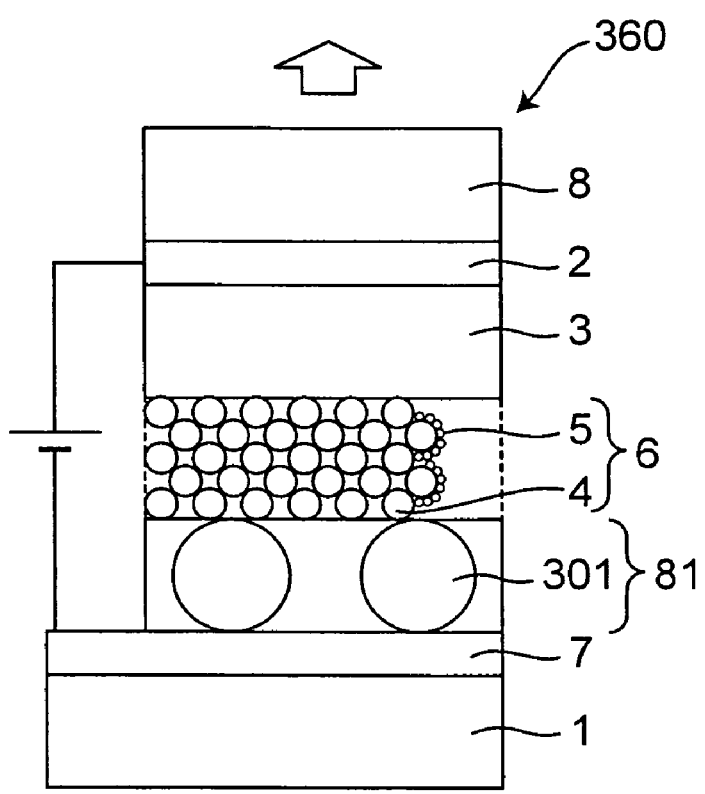
FIG. 34 is a cross-sectional view of a light-emitting device according to an embodiment 29 of the present invention taken along a plane perpendicular to a light-emitting surface thereof.

A light-emitting device according to an embodiment 29 of the present invention will be described with reference to FIG. 34. FIG. 34 is a cross-sectional view of a light-emitting device 360 taken along a plane perpendicular to a light-emitting surface thereof. The light-emitting device 360 is different from the light-emitting device 100 according to the embodiment 10 in that the light-emitting device 360 further includes a spacer 301 dispersed in the electron transport layer 81. By providing a spacer 301, it is possible to suppress variations in the thickness of the electron transport layer 81, thereby allowing the electron transport layer 81 to have a substantially uniform thickness. As a result, the in-plane uniformity of the brightness of the light-emitting device 360 is improved. It is to be noted that the structure of the light-emitting device 360 is substantially the same as that of the light-emitting device 100 according to the embodiment 10 except that the light-emitting device 360 includes the spacer 301 dispersed in the electron transport layer 81, and therefore the description of the structure of the light-emitting device 360 will not be repeated here. In addition to the structural components described above, the light-emitting device 360 may further include a hole injection layer and/or a conductive layer provided between the hole injection electrode 2 and the hole transport layer 3. Further, the light-emitting device 360 may include a protection layer provided between the electron transport layer 81 and another organic layer adjacent to the electron transport layer 81 or between the electron transport layer 81 and an electrode adjacent to the electron transport layer 81, for the purpose of preventing abrasion of the organic layer or electrode due to the spacer 301.

It is to be noted that the structural components of the light-emitting device 360 are substantially the same as those of the light-emitting device 100 according to the embodiment 10 and the light-emitting device 300 according to the embodiment 20, and therefore the description of the structural components of the light-emitting device 360 will not be repeated here.

Next, a method for manufacturing a light-emitting device 360 will be described with reference to FIGS. 35A to 35F. The light-emitting device 360 is manufactured in the following steps.

(a) A transparent substrate 8 is prepared.

Figure 35A:
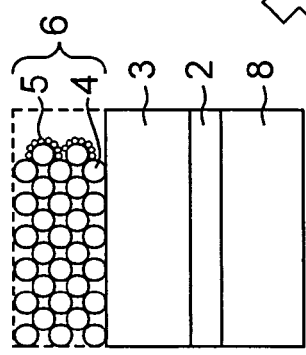
FIGS. 35A to 35F are cross-sectional views which show the steps of manufacturing the light-emitting device according to the embodiment 29 of the present invention.

(b) Next, a transparent hole injection electrode 2 is formed on the transparent substrate 8 (see FIG. 35A).

Figure 35B:
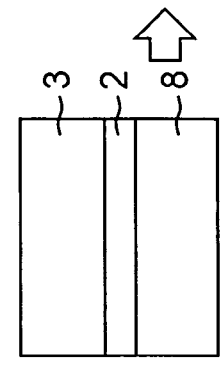

(c) Next, a hole transport layer 3 is formed on the hole injection electrode 2 (see FIG. 35B).

Figure 35C:
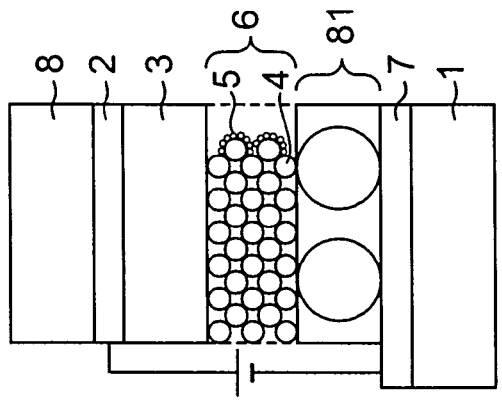

(d) Next, a light-emitting layer 6 containing a metal oxide semiconductor porous body 4, by the surface of which an organic light-emitting material 5 is supported, is formed on the hole transport layer 3 (see FIG. 35C). It is to be noted that such a light-emitting layer 6 can be formed in the same manner as described above. In this way, a substrate S is prepared.

(e) At the same time, a substrate 1 is prepared.

Figure 35D:
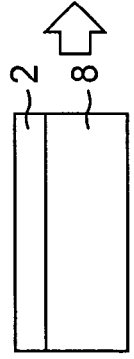

(f) Next, an electron injection electrode 7 is formed on the substrate 1 (see FIG. 35D).

(g) Next, an electron transport layer material is dissolved in an organic solvent to prepare a solution of the electron transport layer material, and then a spacer 301 is ultrasonically dispersed in the solution.

Figure 35E:
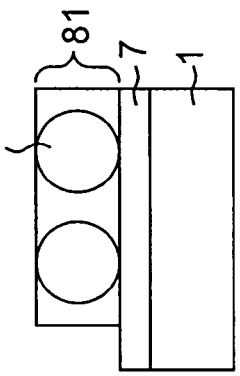

(h) Next, the solution of the electron transport layer material in which the spacer 301 is dispersed is applied onto the electron injection electrode 7 to form an electron transport layer 81 (see FIG. 35E). In this way, a substrate T is prepared.

Figure 35F:
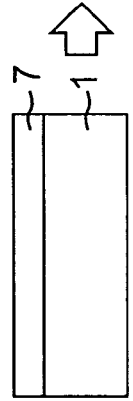

(i) Next, the substrate S and the substrate T are bonded together so that the light-emitting layer 6 and the electron transport layer 81 can be opposed to each other (see FIG. 35F).

In such a manner as described above, the light-emitting device 360 can be manufactured. However, a method for manufacturing a light-emitting device 360 is not limited to the method described above.

Embodiment 30

A light-emitting device according to an embodiment 30 of the present invention will be described with reference to FIG. 8. The light-emitting device according to the embodiment 30 is different from the light-emitting device 60 according to the embodiment 5 shown in FIG. 8 in that the light-emitting device according to the embodiment 30 uses the light-emitting device 360 according to the embodiment 29 instead of the light-emitting device 50 according to the embodiment 4. However, other structure of the light-emitting device according to the embodiment 30 is substantially the same as that of the light-emitting device 60 according to the embodiment 5, and therefore the description of the structure of the light-emitting device according to the embodiment 30 will not be repeated here.

Embodiment 31

A display according to an embodiment 31 of the present invention will be described with reference to FIG. 4. The display according to the embodiment 31 is different from the display 30 according to the embodiment 3 shown in FIG. 4 in that the display according to the embodiment 31 uses the plurality of light-emitting devices according to the embodiment 30 instead of the plurality of light-emitting devices 20 according to the embodiment 2. In the display according to the embodiment 31, the light-emitting layer 6 and the electron injection electrode 7 are bonded together through the electron transport layer 81 containing the spacer 301 therein. Since the electron transport layer 81 contains the spacer 301, the film thickness of the electron transport layer 81 is made uniform, thereby enabling a top emission display having uniform luminous brightness to be obtained. It is to be noted that the structure of the display according to the embodiment 31 is substantially the same as that of the display 30 according to the embodiment 3 except that the display according to the embodiment 31 uses the light-emitting devices according to the embodiment 30, and therefore the description of the structure of the display according to the embodiment 31 will not be repeated here.

Figure 36:
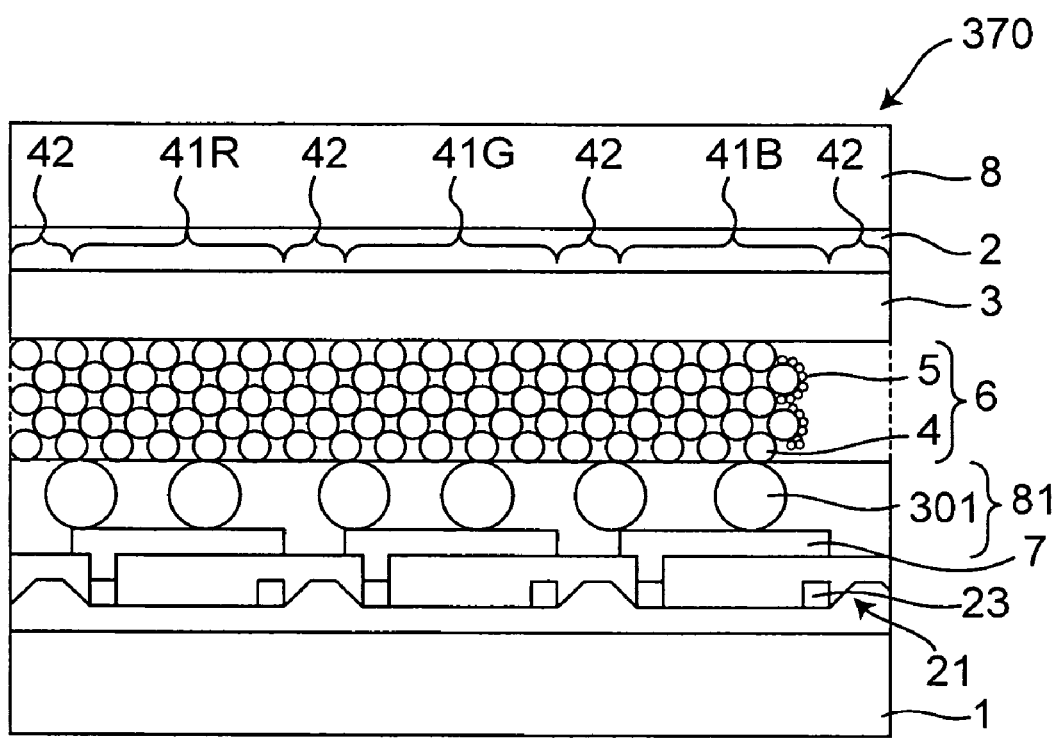
FIG. 36 is a cross-sectional view of a display according to an embodiment 31 of the present invention taken along a plane perpendicular to a light-emitting surface thereof.

Next, a method for manufacturing a display according to the embodiment 31 will be described with reference to FIG. 36. FIG. 36 is a cross-sectional view of a display 370 according to another example of the embodiment 31 having a plurality of pixels of three colors (RGB), 41R, 41G, and 41B. It is to be noted that the cross-sectional view in FIG. 36 is taken along a plane perpendicular to the y electrode 23 and a light-emitting surface of the display 370. The pixels 41R, 41G and 41B use organic light-emitting materials 5 different from each other depending on their respective luminescent colors to form the light-emitting layer 6, thereby enabling a full color display based on three primary colors to be obtained. The display 370 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 360 according to the embodiment 29, the plurality of electron injection electrodes 7 and the electron transport layer 81 containing the spacer 301 therein are formed in order of mention. At the same time, in the same manner as described with reference to the light-emitting device 360 according to the embodiment 29, the hole injection electrode 2, the hole transport layer 3, and the light-emitting layer 6 are formed on the transparent substrate 8 in order of mention. In this case, the thin film transistors 21, the x electrodes 22, the y electrodes 23, and the electron injection electrodes 7 are formed on the substrate 1 so that the thin film transistors 21 and the electron injection electrodes 7 can be aligned with the pixels 41. On the other hand, the light-emitting layer 6 is formed on the transparent substrate 8 so that the organic light-emitting material 5 can be arranged in accordance with a pixel pitch. The electron transport layer 81 containing the spacer 301 therein may be provided in the form of a solid thin film, and therefore it can be integrally formed by a screen printing method, an ink-jet method, or other well-known application methods. Then, the electron transport layer 81 provided on the substrate 1 and the light-emitting layer 6 provided on the transparent substrate 8 are bonded together so that they can be opposed to each other while alignment is carried out. In such a manner as described above, the display 370 can be manufactured. However, a method for manufacturing a display 370 is not limited to the method described above.

Embodiment 32

Figure 37:
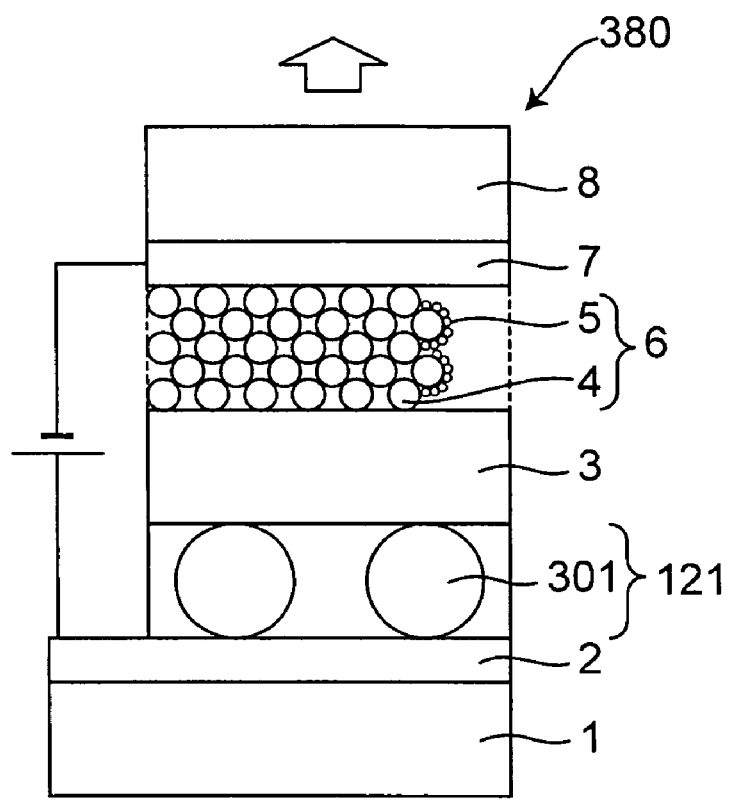
FIG. 37 is a cross-sectional view of a light-emitting device according to an embodiment 32 of the present invention taken along a plane perpendicular to a light-emitting surface thereof.

A light-emitting device according to an embodiment 32 of the present invention will be described with reference to FIG. 37. FIG. 37 is a cross-sectional view of a light-emitting device 380 taken along a plane perpendicular to a light-emitting surface thereof. The light-emitting device 380 is different from the light-emitting device 120 according to the embodiment 13 in that the light-emitting device 380 further includes a spacer 301 dispersed in the hole injection layer 121. By providing a spacer 301, it is possible to suppress variations in the thickness of the hole injection layer 121, thereby allowing the hole injection layer 121 to have a substantially uniform thickness. As a result, the in-plane uniformity of the brightness of the light-emitting device 380 is improved. It is to be noted that the structure of the light-emitting device 380 is substantially the same as that of the light-emitting device 120 according to the embodiment 13 except that the light-emitting device 380 includes the spacer 301 dispersed in the hole injection layer 121, and therefore the description of the structure of the light-emitting device 380 will not be repeated here. In addition to the structural components described above, the light-emitting device 380 may further include an electron transport layer and/or a conductive layer provided between the light-emitting layer 6 and the electron injection electrode 7. Further, the light-emitting device 380 may include a protection layer provided between the hole injection layer 121 and another organic layer adjacent to the hole injection layer 121 or between the hole injection layer 121 and an electrode adjacent to the hole injection layer 121, for the purpose of preventing abrasion of the organic layer or electrode due to the spacer 301.

It is to be noted that the structural components of the light-emitting device 380 are substantially the same as those of the light-emitting device 120 according to the embodiment 13 and the light-emitting device 300 according to the embodiment 20, and therefore the description of the structural components of the light-emitting device 380 will not be repeated here.

Next, a method for manufacturing a light-emitting device 380 will be described with reference to FIGS. 38A to 38F. The light-emitting device 380 is manufactured in the following steps.

(a) A transparent substrate 8 is prepared.

(b) Next, a transparent electron injection electrode 7 is formed on the transparent substrate 8 (see FIG. 38A).

(c) Next, a light-emitting layer 6 containing a metal oxide semiconductor porous body 4, by the surface of which an organic light-emitting material 5 is supported, is formed on the electron injection electrode 7 (see FIG. 38B). It is to be noted that such a light-emitting layer 6 can be formed in the same manner as described above.

(d) Next, a hole transport layer 3 is formed on the light-emitting layer 6 (see FIG. 38C). In this way, a substrate U is prepared.

(e) At the same time, a substrate 1 is prepared.

(f) Next, a hole injection electrode 2 is formed on the substrate 1 (see FIG. 38D).

(g) Next, a hole injection layer material is dissolved in an organic solvent to prepare a solution of the hole injection layer material, and then a spacer 301 is ultrasonically dispersed in the solution.

(h) Next, the solution of the hole injection layer material in which the spacer 301 is dispersed is applied onto the hole injection electrode 2 to form a hole injection layer 121 (see FIG. 38E). In this way, a substrate V is prepared.

(i) Next, the substrate U and the substrate V are bonded together so that the hole transport layer 3 and the hole injection layer 121 can be opposed to each other (see FIG. 38F).

In such a manner as described above, the light-emitting device 380 can be manufactured. However, a method for manufacturing a light-emitting device 380 is not limited to the method described above.

Embodiment 33

A light-emitting device according to an embodiment 33 of the present invention will be described with reference to FIG. 3. The light-emitting device according to the embodiment 33 is different from the light-emitting device 20 according to the embodiment 2 shown in FIG. 3 in that the light-emitting device according to the embodiment 33 uses the light-emitting device 380 according to the embodiment 32 instead of the light-emitting device 10 according to the embodiment 1. However, other structure of the light-emitting device according to the embodiment 33 is substantially the same as that of the light-emitting device 20 according to the embodiment 2, and therefore the description of the structure of the light-emitting device according to the embodiment 33 will not be repeated here.

Embodiment 34

A display according to an embodiment 34 of the present invention will be described with reference to FIG. 4. The display according to the embodiment 34 is different from the display 30 according to the embodiment 3 shown in FIG. 4 in that the display according to the embodiment 34 uses the plurality of light-emitting devices according to the embodiment 33 instead of the plurality of light-emitting devices 20 according to the embodiment 2. In the display according to the embodiment 34, the hole transport layer 3 and the hole injection electrode 2 are bonded together through the hole injection layer 121 containing the spacer 301 therein. Since the hole injection layer 121 contains the spacer 301 therein, the film thickness of the hole injection layer 121 is made uniform, thereby enabling a top emission display having uniform luminous brightness to be obtained. It is to be noted that the structure of the display according to the embodiment 34 is substantially the same as that of the display 30 according to the embodiment 3 except that the display according to the embodiment 34 uses the light-emitting devices according to the embodiment 33, and therefore the description of the structure of the display according to the embodiment 34 will not be repeated here.

Figure 39:
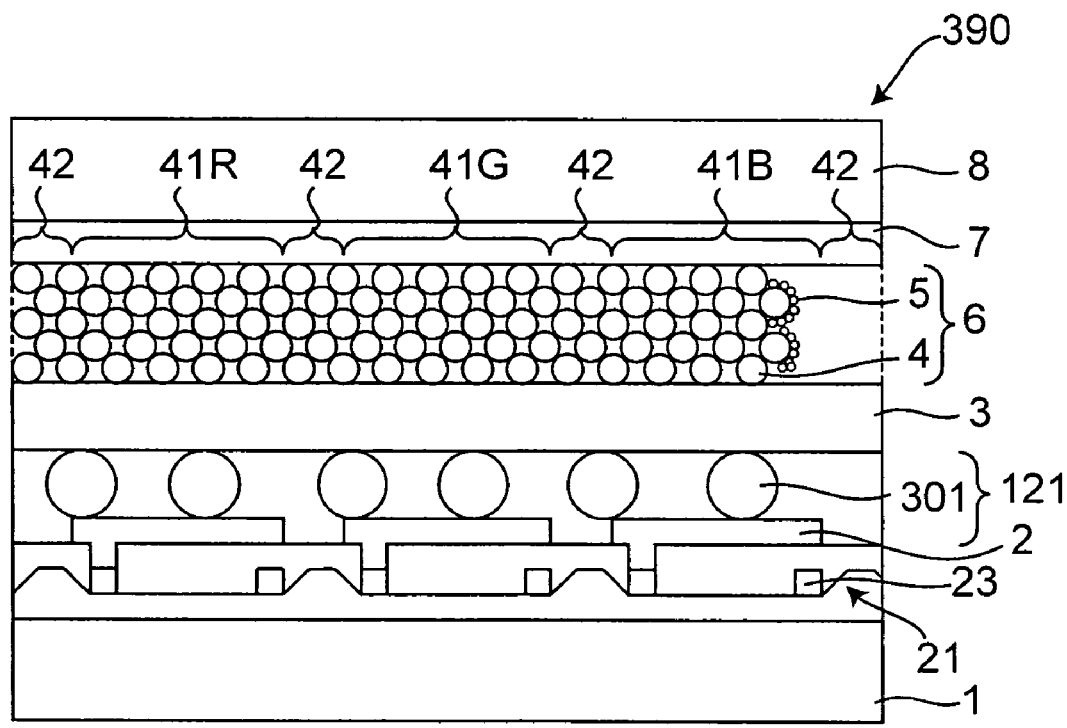
FIG. 39 is a cross-sectional view of a display according to an embodiment 34 of the present invention taken along a plane perpendicular to a light-emitting surface thereof.

Next, a method for manufacturing a display according to the embodiment 34 will be described with reference to FIG. 39. FIG. 39 is a cross-sectional view of a display 390 according to another example of the embodiment 34 having a plurality of pixels of three colors (RGB), 41R, 41G, and 41B. It is to be noted that the cross-sectional view in FIG. 39 is taken along a plane perpendicular to the y electrode 23 and a light-emitting surface of the display 390. The pixels 41R, 41G and 41B use organic light-emitting materials 5 different from each other depending on their respective luminescent colors to form the light-emitting layer 6, thereby enabling a full color display based on three primary colors to be obtained. The display 390 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 380 according to the embodiment 32, the plurality of hole injection electrodes 2 and the hole injection layer 121 containing the spacer 301 therein are formed. At the same time, in the same manner as that described with reference to the light-emitting device 380 according to the embodiment 32, the electron injection electrode 7, the light-emitting layer 6, and the hole transport layer 3 are formed on the transparent substrate 8 in order of mention. In this case, the thin film transistors 21, the x electrodes 22, the y electrodes 23, and the hole injection electrodes 2 are formed on the substrate 1 so that the thin film transistors 21 and the hole injection electrodes 2 can be aligned with the pixels 41. On the other hand, the light-emitting layer 6 is provided on the transparent substrate 8 so that the organic light-emitting material 5 can be arranged in accordance with a pixel pitch. The hole injection layer 121 containing the spacer 301 therein may be in the form of a solid thin film, and therefore it can be integrally formed by a screen printing method, an ink-jet method, or other well-known application methods. Then, the hole injection layer 121 provided on the substrate 1 and the hole transport layer 3 provided on the transparent substrate 8 are bonded together so that they can be opposed to each other while alignment is carried out. In such a manner as described above, the display 390 can be manufactured. However, a method for manufacturing a display 390 is not limited to the method described above.

Embodiment 35

Figure 40:
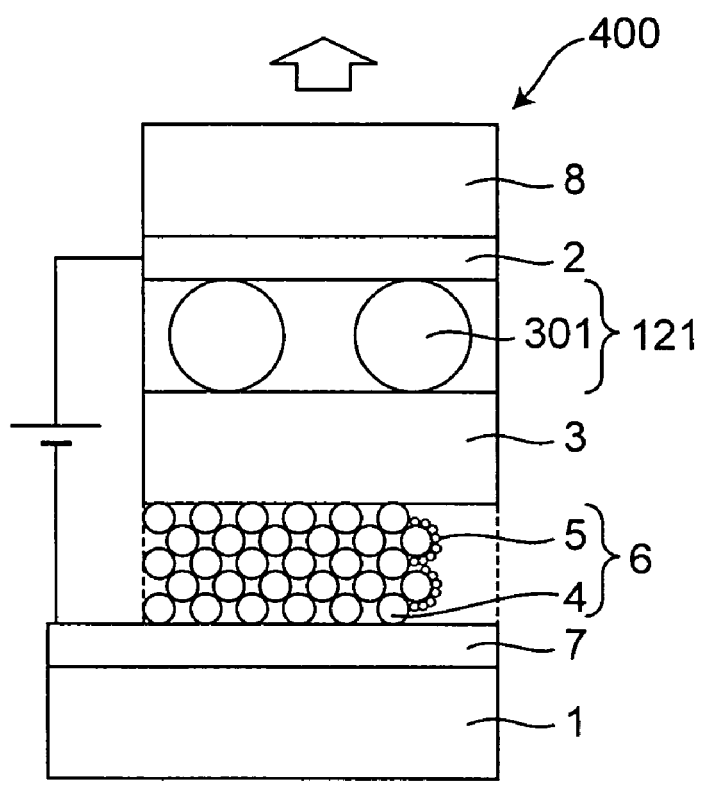
FIG. 40 is a cross-sectional view of a light-emitting device according to an embodiment 35 of the present invention taken along a plane perpendicular to a light-emitting surface thereof.
Figure 41:
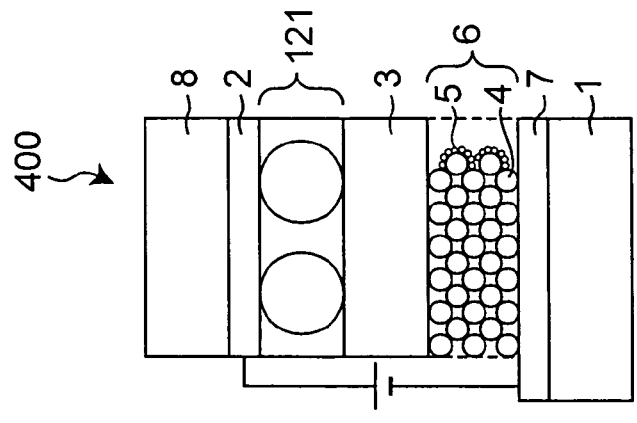
FIGS. 41A to 41F are cross-sectional views which show the steps of manufacturing the light-emitting device according to the embodiment 35 of the present invention.

A light-emitting device according to an embodiment 35 of the present invention will be described with reference to FIG. 40. FIG. 40 is a cross-sectional view of a light-emitting device 400 taken along a plane perpendicular to a light-emitting surface thereof. The light-emitting device 400 is different from the light-emitting device 140 according to the embodiment 16 in that the light-emitting device 400 further includes a spacer 301 dispersed in the hole injection layer 121. By providing a spacer 301, it is possible to suppress variations in the thickness of the hole injection layer 121, thereby allowing the hole injection layer 121 to have a substantially uniform thickness. As a result, the in-plane uniformity of the brightness of the light-emitting device 400 is improved. It is to be noted that the structure of the light-emitting device 400 is substantially the same as that of the light-emitting device 140 according to the embodiment 16 except that the light-emitting device 400 includes the spacer 301 dispersed in the hole injection layer 121, and therefore the description of the structure of the light-emitting device 400 will not be repeated here. In addition to the structural components described above, the light-emitting device 400 may further include an electron transport layer and/or a conductive layer provided between the light-emitting layer 6 and the electron injection electrode 7. Further, the light-emitting device 400 may include a protection layer provided between the hole injection layer 121 and another organic layer adjacent to the hole injection layer 121 or between the hole injection layer 121 and an electrode adjacent to the hole injection layer 121, for the purpose of preventing abrasion of the organic layer or electrode due to the spacer 301.

It is to be noted that the structural components of the light-emitting device 400 are substantially the same as those of the light-emitting device 140 according to the embodiment 16 and the light-emitting device 300 according to the embodiment 20, and therefore the description of the structural components of the light-emitting device 400 will not be repeated here.

Next, a method for manufacturing a light-emitting device 400 will be described with reference to FIGS. 41A to 41F. The light-emitting device 400 is manufactured in the following steps.

(a) A transparent substrate 8 is prepared.
(b) Next, a transparent hole injection electrode 2 is formed on the transparent substrate 8 (see FIG. 41A).
(c) Next, a hole injection layer material is dissolved in an organic solvent to prepare a solution of the hole injection layer material, and then a spacer 301 is ultrasonically dispersed in the solution.
(d) Next, the solution of the hole injection layer material in which the spacer 301 is dispersed is applied onto the hole injection electrode 2 to form a hole injection layer 121 (see FIG. 41B). In this way, a substrate W is prepared.
(e) At the same time, a substrate 1 is prepared.
(f) Next, an electron injection electrode 7 is formed on the substrate 1 (see FIG. 41C).
(g) Next, a light-emitting layer 6 containing a metal oxide semiconductor porous body 4, by the surface of which an organic light-emitting material 5 is supported, is formed on the electron injection electrode 7 (see FIG. 41D). It is to be noted that such a light-emitting layer 6 can be formed in the same manner as described above.
(h) Next, a hole transport layer 3 is formed on the light-emitting layer 6 (see FIG. 41E). In this way, a substrate X is prepared.
(i) Next, the substrate W and the substrate X are bonded together so that the hole injection layer 121 and the hole transport layer 3 can be opposed to each other (see FIG. 41F).

In such a manner as described above, the light-emitting device 400 can be manufactured. However, a method for manufacturing a light-emitting device 400 is not limited to the method described above.

Embodiment 36

A light-emitting device according to an embodiment 36 of the present invention will be described with reference to FIG. 3. The light-emitting device according to the embodiment 36 is different from the light-emitting device 20 according to the embodiment 2 shown in FIG. 3 in that the light-emitting device according to the embodiment 36 uses the light-emitting device 400 according to the embodiment 35 instead of the light-emitting device 10 according to the embodiment 1. However, other structure of the light-emitting device according to the embodiment 36 is substantially the same as that of the light-emitting device 20 according to the embodiment 2, and therefore the description of the structure of the light-emitting device according to the embodiment 36 will not be repeated here.

Embodiment 37

A display according to an embodiment 37 of the present invention will be described with reference to FIG. 4. The display according to the embodiment 37 is different from the display 30 according to the embodiment 3 shown in FIG. 4 in that the display according to the embodiment 37 uses the plurality of light-emitting devices according to the embodiment 36 instead of the plurality of light-emitting devices 20 according to the embodiment 2. In the display according to the embodiment 37, the hole transport layer 3 and the hole injection electrode 2 are bonded together through the hole injection layer 121 containing the spacer 301 therein. Since the hole injection layer 121 contains the spacer 301 therein, the film thickness of the hole injection layer 121 is made uniform, thereby enabling a top emission display having uniform luminous brightness to be obtained. It is to be noted that the structure of the display according to the embodiment 37 is substantially the same as that of the display 30 according to the embodiment 3 except that the display according to the embodiment 37 uses the light-emitting devices according to the embodiment 36, and therefore the description of the structure of the display according to the embodiment 37 will not be repeated here.

Figure 42:
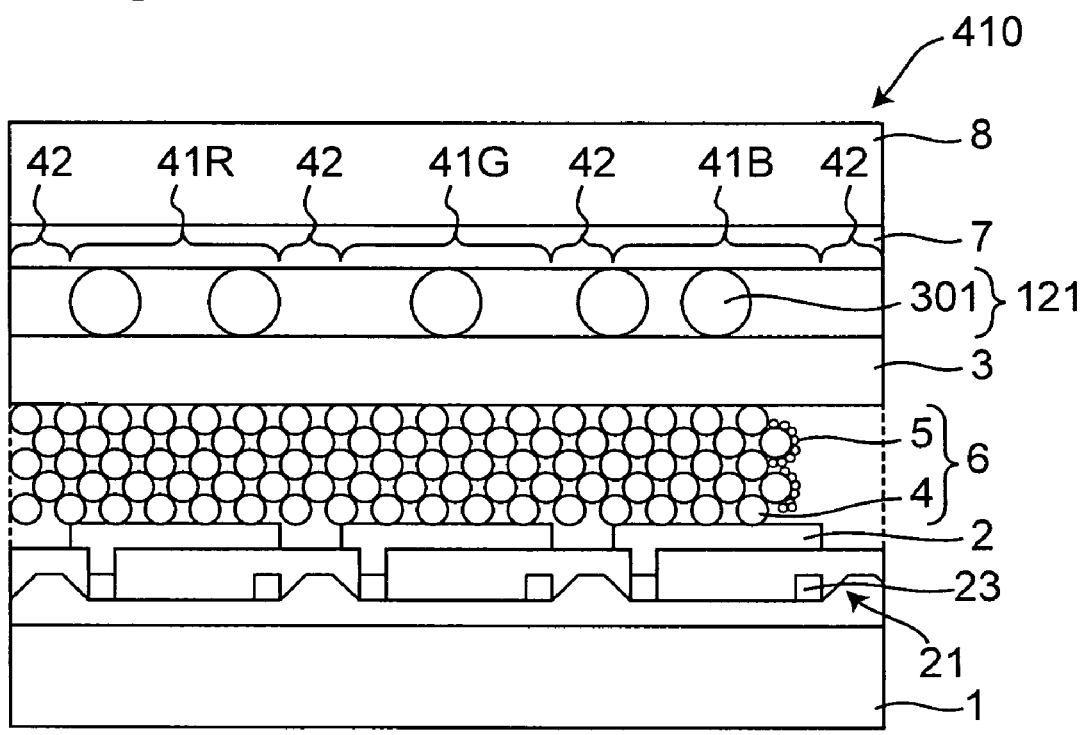
FIG. 42 is a cross-sectional view of a display according to an embodiment 37 of the present invention taken along a plane perpendicular to a light-emitting surface thereof.

Next, a method for manufacturing a display according to the embodiment 37 will be described with reference to FIG. 42. FIG. 42 is a cross-sectional view of a display 410 according to another example of the embodiment 37 having a plurality of pixels of three colors (RGB), 41R, 41G, and 41B. It is to be noted that the cross-sectional view in FIG. 42 is taken along a plane perpendicular to the y electrode 23 and a light-emitting surface of the display 410. The pixels 41R, 41G and 41B use organic light-emitting materials 5 different from each other depending on their respective luminescent colors to form the light-emitting layer 6, thereby enabling a full color display based on three primary colors to be obtained. The display 410 is manufactured in the following manner. The plurality of thin film transistors 21, the plurality of x electrodes 22, and the plurality of y electrodes 23 are formed on the substrate 1 in order of mention. Then, in the same manner as described with reference to the light-emitting device 400 according to the embodiment 35, the plurality of electron injection electrodes 7, the light-emitting layer 6, and the hole transport layer 3 are formed. At the same time, in the same manner as that described with reference to the light-emitting device 400 according to the embodiment 35, the hole injection layer 121 containing the spacer 301 therein is formed on the transparent substrate 8. In this case, the thin film transistors 21, the x electrodes 22, the y electrodes 23, the electron injection electrodes 7, and the light emitting layer 6 are formed on the substrate 1 so that the thin film transistors 21 and the electron injection electrodes 7 can be aligned with the pixels 41 and that the organic light-emitting material 5 can be arranged in the light-emitting layer 6 in accordance with a pixel pitch. Therefore, the thin film transistors 21, the x electrodes 22, the y electrodes 23, the electron injection electrodes 7, and the light-emitting layer 6 are stacked in a series of manufacturing processes. On the other hand, the hole injection electrode 2 and hole injection layer 121 may be provided in the form of a solid thin film on the transparent substrate 8. The hole injection layer 121 containing the spacer 301 therein may be in the form of a solid thin film, and therefore it can be integrally formed by a screen printing method, an ink-jet method, or other well-known application methods. This makes it possible to reduce the accuracy needed to carry out alignment when the light-emitting layer 6 provided on the substrate 1 and the hole injection layer 121 provided on the transparent substrate 8 are bonded together so that they can be opposed to each other, thereby simplifying the manufacturing processes. In such a manner as described above, the display 410 can be manufactured. However, a method for manufacturing a display 410 is not limited to the method described above.

Embodiment 38

Figure 43:
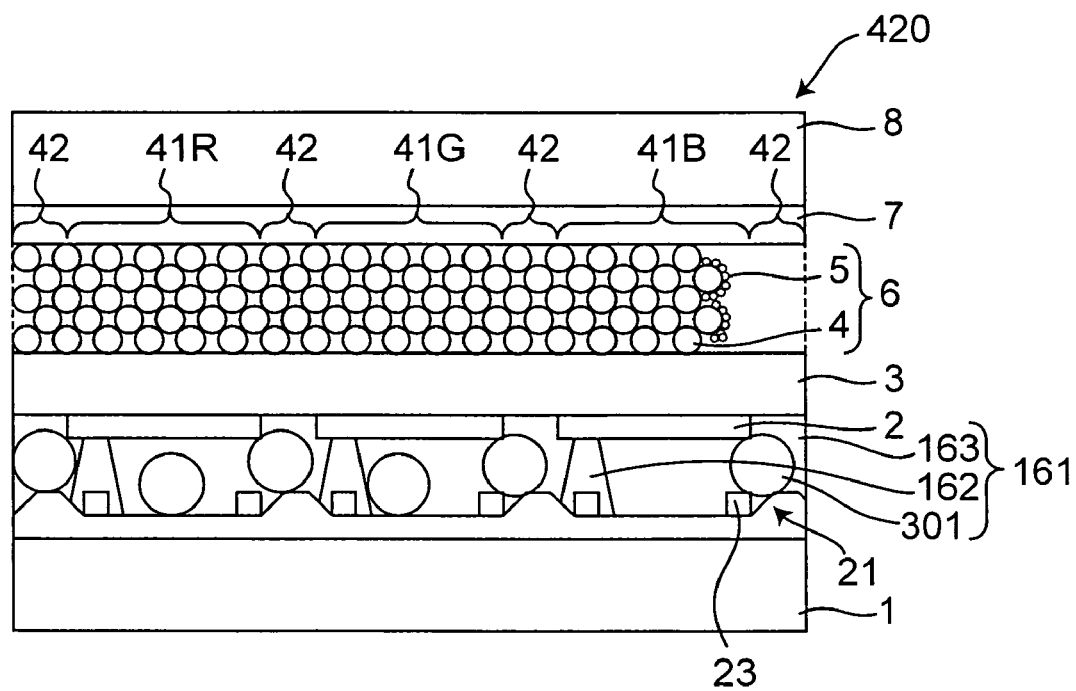
FIG. 43 is a cross-sectional view of a display according to an embodiment 38 of the present invention taken along a plane perpendicular to a light-emitting surface thereof.

A display according to an embodiment 38 of the present invention will be described with reference to FIG. 43. FIG. 43 is a cross-sectional view of a display 420 according to the embodiment 38 taken along a plane parallel to the x electrode 22 and perpendicular to a light-emitting surface thereof. The display 420 is an active matrix display having a plurality of thin film transistors. The display 420 is different from the display 160 according to the embodiment 19 in that the display according to the embodiment 38 further includes a spacer 301 dispersed in the adhesive layer 161. By providing a spacer 301, it is possible to suppress variations in the thickness of the adhesive layer 161, thereby allowing the adhesive layer 161 to have a substantially uniform thickness. As a result, the in-plane uniformity of the brightness of the display 420 is improved. It is to be noted that the structure of the display 420 is substantially the same as that of the display 160 according to the embodiment 19 except that the display 420 includes the spacer 301 dispersed in the adhesive layer 161, and therefore the description of the structure of the display 420 will not be repeated here. The display 420 shown in FIG. 43 has a two-organic layer structure composed of a light-emitting layer and a hole transport layer, but may have a one-organic layer structure (e.g., a structure composed of only a light-emitting layer) or a laminated structure of two or more organic layers (e.g., a structure composed of a light-emitting layer and an electron transport layer, a structure composed of a hole transport layer, a light-emitting layer, and an electron transport layer, a structure composed of a hole injection layer, a hole transport layer, a light-emitting layer, and an electron transport layer, a structure composed of a hole injection layer, a hole transport layer, a light-emitting layer, a hole blocking layer, and an electron transport layer). Further, the display 420 may be made opposite in polarity by connecting the electron injection electrodes to the thin film transistors.

The structural components of the display 420 are substantially the same as those of the light-emitting device 160 according to the embodiment 19 and the light-emitting device 300 according to the embodiment 20, and therefore the description of the structural components of the display 420 will not be repeated here.

It is to be noted that the manufacturing steps of each of the light-emitting devices and displays according to the embodiment 20 to 38 are preferably carried out under dry atmosphere, more preferably under dry and low-oxygen atmosphere. This makes it possible to improve the characteristics of the light-emitting device or the display. For example, a decrease in operating voltage and increases in efficiency and lifespan can be achieved.

Further, each of the displays according to the embodiments 22, 25, 28, 31, 34, 37, and 38 of the present invention may include a pixel separation region 42 by which adjacent pixels are separated from each other. In each of the pixels 41, the light-emitting layer 6 may be formed using an organic light-emitting material 5 which emits single-color light. In this case, color filters or color change layers may be provided in front of light extraction surfaces of all the pixels 41, thereby enabling a full color display based on three primary colors to be obtained by way of another example of the display of the present invention.

Each of the embodiments described above is just one example of the present invention, and the structure of light-emitting device or display of the present invention is not limited to the structures of the embodiments described above.

Next, the present invention will be described in more detail with reference to concrete examples.

Example 9

A light-emitting device according to Example 9 of the present invention will be described with reference to FIG. 25. The structure and manufacturing method of the light-emitting device according to Example 9 are substantially the same as those of the light-emitting device 300 according to the embodiment 20. The structural components of the light-emitting device according to Example 9 are substantially the same as those of the light-emitting device according to Example 1 except for a spacer 301. As a spacer 301, a commercially-available spacer for liquid crystal displays ("Micro Pearl SI" manufactured by Sekisui Chemical Co., Ltd.; number average diameter: 4 μm) was used.

Next, a method for manufacturing a light-emitting device according to Example 9 will be described with reference to FIGS. 26A to 26E. The light-emitting device according to Example 9 was manufactured in the following steps.

(a) A commercially-available non-alkali glass substrate ("OA-10" manufactured by Nippon Electric Glass Co., Ltd) was prepared as a transparent substrate 8. The substrate was ultrasonically cleaned with an alkaline detergent, water, acetone, and isopropyl alcohol (IPA), and was then removed from a boiling IPA solution and dried. Finally, the substrate was cleaned with $UV/O_3$.

(b) On the glass substrate, an ITO film was formed as an electron injection electrode 7 (thickness: 150 nm, sheet resistance: 10 Ω/□) by a sputtering method (see FIG. 26A).

(c) On the glass substrate with an ITO film, a $TiO_2$ thin film porous body layer was formed as a metal oxide semiconductor porous body layer (see FIG. 26B). In this way, a substrate M was prepared. It is to be noted that the $TiO_2$ thin film porous body layer was formed in the same manner as in Example 1, and therefore a detailed description of the manufacturing method of a $TiO_2$ thin film porous body layer will not be repeated here.

(d) At the same time, the same glass substrate as used for the transparent substrate 8 was prepared as a substrate 1. The glass substrate was cleaned in the same manner as the transparent substrate 8 was cleaned.

(e) Next, an MgAg alloy was vacuum-evaporated onto the glass substrate to form a hole injection electrode 2 having a thickness of 100 nm (see FIG. 26C).

(f) Next, PVK was dissolved in chloroform so that the concentration of PVK became 1 wt % to prepare a solution, and then spacer particles were added to the solution so that the concentration of the spacer particles became 10 wt % with respect to PVK, and were ultrasonically dispersed in the solution. The thus obtained dispersion liquid of the spacer particles was applied onto the MgAg alloy film by a screen printing method to form a hole transport layer 3 (see FIG. 26D). In this way, a substrate N was prepared.

(g) Next, the substrate M and the substrate N were bonded together by the application of heat and pressure at 150° C. in an atmosphere of nitrogen so that the light-emitting layer 6 of the substrate M and the hole transport layer 3 of the substrate N could be opposed to each other (see FIG. 26E).

(h) The periphery of the substrates bonded together was coated with an epoxy adhesive.

In this way, the light-emitting device 300 was manufactured.

The thus obtained light-emitting device was evaluated in the same manner as in Example 1, and as a result the luminous brightness and brightness half-life of the light-emitting device was 500 $cd/m^2$ and 11,000 hours, respectively. The color of emitted light was green. This result shows that the light-emitting device according to Example 9 has a higher luminous brightness and a longer lifespan as compared to the light-emitting device according to Comparative Example 1. Further, the light-emitting device according to Example 9 emitted light more uniformly across the light-emitting surface as compared to the light-emitting device according to Example 1 manufactured in the same manner as in Example 9 except that the spacer was not used.

Example 10

A light-emitting device according to Example 10 of the present invention will be described with reference to FIG. 28. The structure and manufacturing method of the light-emitting device according to Example 10 are substantially the same as those of the light-emitting device 320 according to the embodiment 23. The structural components of the light-emitting device according to Example 10 are substantially the same as those of the light-emitting device according to Example 4 except for a spacer 301, and therefore the description of the structural components of the light-emitting device according to Example 10 will not be repeated here. The spacer 301 used in Example 10 was the same as that used in Example 9. Further, the hole transport layer 3 containing the spacer 301 therein was formed in substantially the same manner as in Example 9. Therefore, a detailed description of the spacer 301 and the hole transport layer forming method will not be repeated here. The thus obtained light-emitting device according to Example 10 was evaluated in the same manner as in Example 1, and as a result the luminous brightness and brightness half-life of the light-emitting device was 600 $cd/m^2$ and 13,000 hours, respectively. The color of emitted light was green. This result shows that the light-emitting device according to Example 10 has a higher luminous brightness and a longer lifespan as compared to the light-emitting device according to Comparative Example 1. Further, the light-emitting device according to Example 10 emitted light more uniformly across the light-emitting surface as compared to the light-emitting device according to Example 4 manufactured in the same manner as in Example 10 except that the spacer was not used.

Example 11

A light-emitting device according to Example 11 of the present invention will be described with reference to FIG. 31. The structure and the manufacturing method of the light-emitting device according to Example 11 are substantially the same as those of the light-emitting device 340 according to the embodiment 26. The structural components of the light-emitting device according to Example 11 are substantially the same as those of the light-emitting device according to Example 5 except for a spacer 301, and therefore the description of the structural components of the light-emitting device according to Example 11 will not be repeated here. The spacer 301 used in Example 11 was the same as that used in Example 9. Further, the electron transport layer 81 containing the spacer 301 therein was formed in substantially the same manner as described with reference to the hole transport layer 3 of Example 9. Therefore, a detailed description of the spacer 301 and electron transport layer forming method will not be repeated here. The thus obtained light-emitting device according to Example 11 was evaluated in the same manner as in Example 1, and as a result the luminous brightness and brightness half-life of the light-emitting device was 530 cd/m² and 12,000 hours, respectively. The color of emitted light was green. This result shows that the light-emitting device according to Example 11 has a higher luminous brightness and a longer lifespan as compared to the light-emitting device according to Comparative Example 1. Further, the light-emitting device according to Example 11 emitted light more uniformly across the light-emitting surface as compared to the light-emitting device according to Example 5 manufactured in the same manner as in Example 11 except that the spacer was not used.

Example 12

A light-emitting device according to Example 12 of the present invention will be described with reference to FIG. 34. The structure and manufacturing method of the light-emitting device according to Example 12 are substantially the same as those of the light-emitting device 360 according to the embodiment 29. The structural components of the light-emitting device according to Example 12 are substantially the same as those of the light-emitting device according to Example 6 except for a spacer 301, and therefore the description of the structural components of the light-emitting device according to Example 12 will not be repeated here. The spacer 301 used in Example 12 was the same as that used in Example 9. Further, the electron transport layer 81 containing the spacer 301 therein was formed in substantially the same manner as described with reference to the hole transport layer 3 of Example 9. Therefore, a detailed description of the spacer 301 and electron transport layer forming method will not be repeated here. The thus obtained light-emitting device according to Example 12 was evaluated in the same manner as in Example 1, and as a result the luminous brightness and brightness half-life of the light-emitting device was 550 cd/m² and 13,000 hours, respectively. The color of emitted light was green. This result shows that the light-emitting device according to Example 12 has a higher luminous brightness and a longer lifespan as compared to the light-emitting device according to Comparative Example 1. Further, the light-emitting device according to Example 12 emitted light more uniformly across the light-emitting surface as compared to the light-emitting device according to Example 6 manufactured in the same manner as in Example 12 except that the spacer was not used.

Example 13

A light-emitting device according to Example 13 of the present invention will be described with reference to FIG. 37. The structure and the manufacturing method of the light-emitting device according to Example 13 are substantially the same as those of the light-emitting device 380 according to the embodiment 32. The structural components of the light-emitting device according to Example 13 are substantially the same as those of the light-emitting device according to Example 7 except for a spacer 301, and therefore the description of the structural components of the light-emitting device according to Example 13 will not be repeated here. The spacer 301 used in Example 13 was the same as that used in Example 9. Further, the hole injection layer 121 containing the spacer 301 therein was formed in substantially the same manner as described with reference to the hole transport layer 3 of Example 9. Therefore, a detailed description of the spacer 301 and hole injection layer forming method will not be repeated here. The thus obtained light-emitting device according to Example 13 was evaluated in the same manner as in Example 1, and as a result the luminous brightness and brightness half-life of the light-emitting device was 540 cd/m² and 11,000 hours, respectively. The color of emitted light was green. This result shows that the light-emitting device according to Example 13 has a higher luminous brightness and a longer lifespan as compared to the light-emitting device according to Comparative Example 1. Further, the light-emitting device according to Example 13 emitted light more uniformly across the light-emitting surface as compared to the light-emitting device according to Example 7 manufactured in the same manner as in Example 13 except that the spacer was not used.

Example 14

A light-emitting device according to Example 14 of the present invention will be described with reference to FIG. 40. The structure and the manufacturing method of the light-emitting device according to Example 14 are substantially the same as those of the light-emitting device 400 according to the embodiment 35. The structural components of the light-emitting device according to Example 14 are substantially the same as those of the light-emitting device according to Example 8 except for a spacer 301, and therefore the description of the structural components of the light-emitting device according to Example 14 will not be repeated here. The spacer 301 used in Example 14 was the same as that used in Example 9. Further, the hole injection layer 121 containing the spacer 301 therein was formed in substantially the same manner as described with reference to the hole transport layer 3 of Example 9. Therefore, a detailed description of the spacer 301 and hole injection layer forming method will not be repeated here. The thus obtained light-emitting device according to Example 14 was evaluated in the same manner as in Example 1, and as a result the luminous brightness and the brightness half-life of the light-emitting device was 580 cd/m² and 12,000 hours, respectively. The color of emitted light was green. This result shows that the light-emitting device according to Example 14 has a higher luminous brightness and a longer lifespan as compared to the light-emitting device according to Comparative Example 1. Further, the light-emitting device according to Example 14 emitted light more uniformly across the light-emitting surface as compared to the light-emitting device according to Example 8 manufactured in the same manner as in Example 14 except that the spacer was not used.

The present invention has been described in detail with reference to the preferred embodiments, but is not limited to these embodiments. It will be apparent to those skilled in the art that various modifications and changes can be made without departing from the technical scope of the present invention as defined in the claims.

As described above, in the light-emitting device according to the present invention, the light-emitting layer containing the metal oxide semiconductor porous body by the surface of which the organic light-emitting material is supported is provided on the electron injection electrode. Therefore, it is possible to increase the contact area between the metal oxide semiconductor porous body and the organic light-emitting material. An increase in the contact area between the metal oxide semiconductor porous body and the organic light-emitting material increases an area which contributes to light emission, thereby improving the brightness of the light-emitting device. In addition, it is also possible to decrease the current density flowing through the organic light-emitting material to achieve brightness comparable to that of a conventional light-emitting device, thereby suppressing the deterioration of the organic light-emitting material. Further, the light-emitting device according to the present invention has the adhesive organic layer containing an adhesive organic material, through which adjacent upper and lower layers thereof are bonded together. Therefore, a transparent substrate composed of glass and an ITO electrode or the like can be used for a top light extraction surface, thereby enabling a high-reliability light-emitting device excellent in moisture and oxygen barrier properties to be obtained. Furthermore, the adhesive organic layer is provided as a solid thin film in which a spacer is dispersed. Therefore, such an adhesive organic layer can be integrally formed by a simple application process at low cost. In addition, in a case where a color display is manufactured, it is possible to reduce the accuracy needed to carry out alignment for individual pixels when the substrates are bonded together, thereby simplifying the manufacturing processes. Moreover, since the thickness of the adhesive organic layer is defined by the spacer, the light-emitting device emits light uniformly across the light-emitting surface thereof. Moreover, the light-emitting device can use a black hole injection electrode, and therefore it is not necessary to use a circular polarizing plate, thereby increasing light extraction efficiency. As has been described above, according to the present invention, it is possible to easily provide a top emission light-emitting device satisfying both of high brightness and high reliability, and to provide a display using such a light-emitting device.

The invention claimed is:

1. A light-emitting device comprising:
a first electrode;
a second electrode provided to be opposite to the first electrode; and
a light-emitting layer which contains a metal oxide semiconductor porous body, by the surface of which an organic light-emitting material is supported, and is provided between the first electrode and the second electrode,
wherein a functional group in the organic light-emitting material is esterified with a hydroxyl group (—OH) existing on the surface of the metal oxide semiconductor porous body to immobilize the organic light-emitting material, such that the organic light-emitting material is chemisorbed to the surface of the metal oxide semiconductor porous body, and
wherein the functional group is selected from the group consisting of a carboxyl group (—COOH), a thiocarboxyl group (—CSOH), a dithiocarboxyl group (—CSSH), a sulfo group (—SO$_3$H), a sulfino group (—SO$_2$H), a sulfeno group (—SOH), a phosphono group (—PO(OH)$_2$), a phosphine group (—PH$_2$O$_2$), a mercapto group (—SH) a trimethoxysilyl group (—Si(OCH$_3$)), a trichlorosilyl group (—SiCl$_3$), an amide group (—CONH$_2$), and amino group (—NH$_2$).

2. The light-emitting device according to claim 1, wherein the metal oxide semiconductor porous body is composed of a metal oxide semiconductor particulate powder.

3. The light-emitting device according to claim 2, wherein the metal oxide semiconductor particulate powder is made of an n-type semiconductor material.

4. The light-emitting device according to claim 1, further comprising at least one organic layer provided between the first electrode and the second electrode in addition to the light-emitting layer, the organic layer containing an adhesive organic material so as to function as an adhesive layer through which adjacent upper and lower layers thereof are bonded together.

5. The light-emitting device according to claim 4, further comprising a spacer dispersed in the organic layer, by which the thickness of the organic layer is defined.

6. The light-emitting device according to claim 5, wherein the spacer is composed of transparent or semi-transparent particles.

7. The light-emitting device according to claim 5, wherein the spacer is made of an insulating material.

8. The light-emitting device according to claim 5, wherein the particle diameter of the spacer is in the range of 0.01 to 10 μm.

9. The light-emitting device according to claim 4, wherein the adhesive organic material contained in the organic layer contains at least a polymer-based material.

10. The light-emitting device according to claim 4, wherein the first electrode is an electron injection electrode, the second electrode is a hole injection electrode, and the organic layer is a hole transport layer, and wherein the hole transport layer functions as an adhesive layer through which adjacent upper and lower layers thereof are bonded together.

11. The light-emitting device according to claim 4, wherein the first electrode is a hole injection electrode, the second electrode is an electron injection electrode, and the organic layer is a hole transport layer, and wherein the hole transport layer functions as an adhesive layer through which adjacent upper and lower layers thereof are bonded together.

12. The light-emitting device according to claim 10, further comprising a hole injection layer provided between the hole injection electrode and the hole transport layer.

13. The light-emitting device according to claim 10, further comprising an electron transport layer provided between the electron injection electrode and the light-emitting layer.

14. The light-emitting device according to claim 1, further comprising a thin film transistor connected to the second electrode.

15. The light-emitting device according to claim 14, wherein the thin film transistor is an organic thin film transistor composed of a thin film containing an organic material.

* * * * *